(12) United States Patent
Joly et al.

(10) Patent No.: US 8,048,766 B2
(45) Date of Patent: Nov. 1, 2011

(54) INTEGRATED CIRCUIT ON HIGH PERFORMANCE CHIP

(75) Inventors: Jean-Pierre Joly, Saint-Egreve (FR); Laurent Ulmer, Grenoble (FR); Guy Parat, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 392 days.

(21) Appl. No.: 10/561,299

(22) PCT Filed: Jun. 23, 2004

(86) PCT No.: PCT/FR2004/001565
§ 371 (c)(1),
(2), (4) Date: Dec. 15, 2005

(87) PCT Pub. No.: WO2005/000733
PCT Pub. Date: Jan. 6, 2005

(65) Prior Publication Data
US 2006/0252229 A1 Nov. 9, 2006

(30) Foreign Application Priority Data
Jun. 24, 2003 (FR) .................... 03 07617

(51) Int. Cl.
*H01L 21/30* (2006.01)
*H01L 21/46* (2006.01)
*H01L 29/06* (2006.01)
*H01L 27/08* (2006.01)
*H01L 21/02* (2006.01)

(52) U.S. Cl. ........ 438/455; 438/456; 257/618; 257/531; 257/532; 257/E25.01; 257/E25.014; 257/E25.018; 257/E23.027

(58) Field of Classification Search .................. 438/455, 438/456; 257/618, 528, 531, 532
See application file for complete search history.

(56) References Cited

U.S. PATENT DOCUMENTS

| 3,901,423 A | 8/1975 | Hillberry et al. |
| 3,915,757 A | 10/1975 | Engel |
| 3,957,107 A | 5/1976 | Altoz et al. |
| 3,993,909 A | 11/1976 | Drews et al. |
| 4,006,340 A | 2/1977 | Gorinas |
| 4,028,149 A | 6/1977 | Deines et al. |

(Continued)

FOREIGN PATENT DOCUMENTS
DE 101 53 319 A1 5/2003
(Continued)

OTHER PUBLICATIONS

Ayguavives et al., "Physical Properties of (Ba,Sr)TiO$_3$ Thin Films used for Integrated Capacitors in Microwave Applications", IEEE 2001.

(Continued)

*Primary Examiner* — David Zarneke
(74) *Attorney, Agent, or Firm* — Brinks Hofer Gilson & Lione

(57) ABSTRACT

A method of fabricating a die containing an integrated circuit, including active components and passive components, includes producing a first substrate containing at least one active component of active components and a second substrate containing critical components of the passive components, such as perovskites or MEMS, and bonding the two substrates by a layer transfer. The method provides an improved monolithic integration of devices such as MEMS with transistors.

28 Claims, 5 Drawing Sheets

U.S. PATENT DOCUMENTS

| | | | |
|---|---|---|---|
| 4,039,416 A | 8/1977 | White | |
| 4,074,139 A | 2/1978 | Pankove | |
| 4,107,350 A | 8/1978 | Berg et al. | |
| 4,108,751 A | 8/1978 | King | |
| 4,121,334 A | 10/1978 | Wallis | |
| 4,170,662 A | 10/1979 | Weiss et al. | |
| 4,179,324 A | 12/1979 | Kirkpatrick | |
| 4,244,348 A | 1/1981 | Wilkes | |
| 4,252,837 A | 2/1981 | Auton | |
| 4,254,590 A | 3/1981 | Eisele et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,500,563 A | 2/1985 | Ellenberger et al. | |
| 4,508,056 A | 4/1985 | Bruel et al. | |
| 4,536,657 A | 8/1985 | Bruel | |
| 4,539,050 A | 9/1985 | Kramler et al. | |
| 4,542,863 A | 9/1985 | Larson | |
| 4,566,403 A | 1/1986 | Fournier | |
| 4,567,505 A | 1/1986 | Pease | |
| 4,568,563 A | 2/1986 | Jackson et al. | |
| 4,585,945 A | 4/1986 | Bruel et al. | |
| 4,630,093 A | 12/1986 | Yamaguchi et al. | |
| 4,684,535 A | 8/1987 | Heinecke et al. | |
| 4,704,302 A | 11/1987 | Bruel et al. | |
| 4,717,683 A | 1/1988 | Parrillo et al. | |
| 4,764,394 A | 8/1988 | Conrad | |
| 4,832,253 A | 5/1989 | Kloucek et al. | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,887,005 A | 12/1989 | Rough et al. | |
| 4,891,329 A | 1/1990 | Reisman et al. | |
| 4,894,709 A | 1/1990 | Phillips et al. | |
| 4,904,610 A | 2/1990 | Shyr | |
| 4,920,396 A | 4/1990 | Shinohara et al. | |
| 4,929,566 A | 5/1990 | Beitman | |
| 4,931,405 A | 6/1990 | Kamijo et al. | |
| 4,948,458 A | 8/1990 | Ogle | |
| 4,952,273 A | 8/1990 | Popov | |
| 4,956,698 A | 9/1990 | Wang | |
| 4,960,073 A | 10/1990 | Suzuki et al. | |
| 4,975,126 A | 12/1990 | Margail et al. | |
| 4,982,090 A | 1/1991 | Wittmaack | |
| 4,996,077 A | 2/1991 | Moslehi et al. | |
| 5,013,681 A | 5/1991 | Godbey et al. | |
| 5,015,353 A | 5/1991 | Hubler et al. | |
| 5,034,343 A | 7/1991 | Rouse et al. | |
| 5,036,023 A | 7/1991 | Dautremont-Smith et al. | |
| 5,110,748 A | 5/1992 | Sarma | |
| 5,120,666 A | 6/1992 | Gotou | |
| 5,131,968 A | 7/1992 | Wells et al. | |
| 5,138,422 A | 8/1992 | Fujii et al. | |
| 5,198,371 A | 3/1993 | Li | |
| 5,200,805 A | 4/1993 | Parsons et al. | |
| 5,232,870 A | 8/1993 | Ito et al. | |
| 5,234,535 A | 8/1993 | Beyer et al. | |
| 5,242,863 A | 9/1993 | Xiang-Zheng et al. | |
| 5,250,446 A | 10/1993 | Osawa et al. | |
| 5,256,581 A | 10/1993 | Foerstner et al. | |
| 5,259,247 A | 11/1993 | Bantien | |
| 5,280,819 A | 1/1994 | Newkirk et al. | |
| 5,300,788 A | 4/1994 | Fan et al. | |
| 5,310,446 A | 5/1994 | Konishi et al. | |
| 5,374,564 A | 12/1994 | Bruel | |
| 5,400,458 A | 3/1995 | Rambosek | |
| 5,405,802 A | 4/1995 | Yamagata et al. | |
| 5,413,951 A | 5/1995 | Ohori et al. | |
| 5,442,205 A | 8/1995 | Brasen et al. | |
| 5,494,835 A | 2/1996 | Bruel | |
| 5,524,339 A | 6/1996 | Gorowitz et al. | |
| 5,539,241 A | 7/1996 | Abidi et al. | |
| 5,559,043 A | 9/1996 | Bruel | |
| 5,567,654 A | 10/1996 | Beilstein, Jr. et al. | |
| 5,604,235 A * | 2/1997 | Shaw et al. | 514/292 |
| 5,611,316 A | 3/1997 | Oshima et al. | |
| 5,618,739 A | 4/1997 | Takahashi et al. | |
| 5,622,896 A | 4/1997 | Knotter et al. | |
| 5,633,174 A | 5/1997 | Li | |
| 5,661,333 A | 8/1997 | Bruel et al. | |
| 5,714,395 A | 2/1998 | Bruel | |
| 5,741,733 A * | 4/1998 | Bertagnolli et al. | 438/152 |
| 5,753,038 A | 5/1998 | Vichr et al. | |
| 5,804,086 A | 9/1998 | Bruel | |
| 5,811,348 A | 9/1998 | Matushita et al. | |
| 5,817,368 A | 10/1998 | Hashimoto | |
| 5,854,123 A | 12/1998 | Sato et al. | |
| 5,863,830 A | 1/1999 | Bruel et al. | |
| 5,863,832 A | 1/1999 | Doyle et al. | |
| 5,877,070 A | 3/1999 | Goesele et al. | |
| 5,880,010 A * | 3/1999 | Davidson | 438/455 |
| 5,882,987 A | 3/1999 | Srikrishnan | |
| 5,897,331 A | 4/1999 | Sopori | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,981,400 A | 11/1999 | Lo | |
| 5,985,412 A | 11/1999 | Gösele | |
| 5,993,677 A | 11/1999 | Biasse et al. | |
| 5,994,207 A | 11/1999 | Henley et al. | |
| 6,010,591 A | 1/2000 | Gösele | |
| 6,013,563 A | 1/2000 | Henley et al. | |
| 6,013,954 A | 1/2000 | Hamajima | |
| 6,020,252 A | 2/2000 | Aspar et al. | |
| 6,033,974 A | 3/2000 | Henley et al. | |
| 6,048,411 A | 4/2000 | Henley et al. | |
| 6,054,363 A | 4/2000 | Sakaguchi et al. | |
| 6,054,370 A | 4/2000 | Doyle | |
| 6,057,212 A | 5/2000 | Chan et al. | |
| 6,071,795 A | 6/2000 | Cheung et al. | |
| 6,080,640 A * | 6/2000 | Gardner et al. | 438/455 |
| 6,096,433 A | 8/2000 | Kikuchi et al. | |
| 6,103,597 A | 8/2000 | Aspar et al. | |
| 6,103,599 A | 8/2000 | Henley et al. | |
| 6,118,181 A | 9/2000 | Merchant et al. | |
| 6,127,199 A | 10/2000 | Inoue | |
| 6,146,979 A | 11/2000 | Henley et al. | |
| 6,150,239 A | 11/2000 | Goesele et al. | |
| 6,156,215 A | 12/2000 | Shimada et al. | |
| 6,159,323 A | 12/2000 | Joly et al. | |
| 6,190,998 B1 | 2/2001 | Bruel et al. | |
| 6,197,695 B1 * | 3/2001 | Joly et al. | 438/694 |
| 6,198,159 B1 | 3/2001 | Hosoma et al. | |
| 6,200,878 B1 | 3/2001 | Yamagata et al. | |
| 6,204,079 B1 | 3/2001 | Aspar et al. | |
| 6,225,190 B1 | 5/2001 | Bruel et al. | |
| 6,225,192 B1 | 5/2001 | Aspar et al. | |
| 6,251,754 B1 | 6/2001 | Ohshima et al. | |
| 6,256,864 B1 | 7/2001 | Gaud et al. | |
| 6,271,101 B1 | 8/2001 | Fukunaga | |
| 6,276,345 B1 * | 8/2001 | Nelson et al. | 123/525 |
| 6,287,940 B1 * | 9/2001 | Cole et al. | 438/455 |
| 6,294,478 B1 | 9/2001 | Sakaguchi et al. | |
| 6,303,468 B1 | 10/2001 | Aspar et al. | |
| 6,306,720 B1 | 10/2001 | Ding | |
| 6,310,387 B1 | 10/2001 | Seefeldt et al. | |
| 6,316,333 B1 | 11/2001 | Bruel et al. | |
| 6,323,108 B1 | 11/2001 | Kub et al. | |
| 6,323,109 B1 | 11/2001 | Okonogi | |
| 6,346,458 B1 | 2/2002 | Bower | |
| 6,362,077 B1 | 3/2002 | Aspar et al. | |
| 6,362,082 B1 | 3/2002 | Doyle et al. | |
| 6,407,929 B1 | 6/2002 | Hale et al. | |
| 6,417,075 B1 | 7/2002 | Haberger et al. | |
| 6,429,094 B1 | 8/2002 | Maleville et al. | |
| 6,429,104 B1 | 8/2002 | Auberton-Herve | |
| 6,465,892 B1 * | 10/2002 | Suga | 257/777 |

| | | | | | | |
|---|---|---|---|---|---|---|
| 6,485,533 | B1 | 11/2002 | Ishizaki et al. | EP | 0 889 509 A2 | 1/1999 |
| 6,504,235 | B2 * | 1/2003 | Schmitz et al. ............... 257/649 | EP | 0 895 282 A2 | 2/1999 |
| 6,513,564 | B2 | 2/2003 | Bryan et al. | EP | 0 898 307 A1 | 2/1999 |
| 6,529,646 | B1 | 3/2003 | Wight et al. | EP | 0 917 193 A1 | 5/1999 |
| 6,534,380 | B1 | 3/2003 | Yamauchi et al. | EP | 0 938 129 A1 | 8/1999 |
| 6,548,375 | B1 | 4/2003 | De Los Santos et al. | EP | 0 902 843 B1 | 3/2000 |
| 6,645,831 | B1 | 11/2003 | Shaheen et al. | EP | 0 989 593 A2 | 3/2000 |
| 6,645,833 | B2 | 11/2003 | Brendel | EP | 0 994 503 A1 | 4/2000 |
| 6,727,549 | B1 | 4/2004 | Doyle | EP | 1 050 901 A2 | 11/2000 |
| 6,756,285 | B1 | 6/2004 | Moriceau et al. | EP | 1 059 663 A2 | 12/2000 |
| 6,756,286 | B1 | 6/2004 | Moriceau et al. | EP | 1 096 259 A1 | 5/2001 |
| 6,762,076 | B2 * | 7/2004 | Kim et al. ..................... 438/107 | EP | 1 014 452 B1 | 5/2006 |
| 6,774,010 | B2 | 8/2004 | Chu et al. | FR | 2 671 472 A3 | 7/1992 |
| 6,809,009 | B2 | 10/2004 | Aspar et al. | FR | 2 681 472 | 3/1993 |
| 6,846,690 | B2 * | 1/2005 | Farcy et al. .................... 438/48 | FR | 2 558 263 | 7/1995 |
| 6,887,769 | B2 * | 5/2005 | Kellar et al. ................. 438/455 | FR | 2 725 074 | 3/1996 |
| 6,946,365 | B2 | 9/2005 | Aspar et al. | FR | 95 08882 | 6/1996 |
| 7,029,548 | B2 | 4/2006 | Aspar et al. | FR | 2 736 934 | 1/1997 |
| 7,067,396 | B2 | 6/2006 | Aspar et al. | FR | 2 748 850 A1 | 11/1997 |
| 7,078,811 | B2 * | 7/2006 | Suga ............................ 257/758 | FR | 2 748 851 | 11/1997 |
| RE39,484 | E | 2/2007 | Bruel | FR | 2 758 907 A1 | 7/1998 |
| 7,494,897 | B2 | 2/2009 | Fournel et al. | FR | 2 767 416 A1 | 2/1999 |
| 7,498,234 | B2 | 3/2009 | Aspar et al. | FR | 2 767 604 | 2/1999 |
| 7,615,463 | B2 | 11/2009 | Aspar et al. | FR | 2 771 852 A1 | 6/1999 |
| 7,670,930 | B2 | 3/2010 | Tauzin et al. | FR | 2 773 261 | 7/1999 |
| 7,713,369 | B2 | 5/2010 | Aspar et al. | FR | 2 774 510 A1 | 8/1999 |
| 7,772,087 | B2 | 8/2010 | Nguyen et al. | FR | 2 781 925 A1 | 2/2000 |
| 7,883,994 | B2 | 2/2011 | Moriceau et al. | FR | 2 789 518 A1 | 8/2000 |
| 7,902,038 | B2 | 3/2011 | Aspar et al. | FR | 2 796 491 | 1/2001 |
| 2001/0007367 | A1 | 7/2001 | Ohkubo | FR | 2 797 347 | 2/2001 |
| 2001/0007789 | A1 | 7/2001 | Aspar et al. | FR | 2 809 867 | 12/2001 |
| 2002/0000646 | A1 | 1/2002 | Gooch et al. | FR | 2 819 099 A1 | 7/2002 |
| 2002/0025604 | A1 | 2/2002 | Tiwari | GB | 2 211 991 A | 7/1989 |
| 2002/0048948 | A1 | 4/2002 | Gang | JP | 53-104155 | 9/1978 |
| 2002/0081861 | A1 | 6/2002 | Robinson et al. | JP | 58 31519 | 2/1983 |
| 2002/0083387 | A1 | 6/2002 | Miner et al. | JP | 59-54217 | 3/1984 |
| 2002/0145489 | A1 | 10/2002 | Cornett et al. | JP | 61-129872 A | 6/1986 |
| 2002/0153563 | A1 | 10/2002 | Ogura | JP | 62265717 | 11/1987 |
| 2002/0185469 | A1 | 12/2002 | Podlesnik et al. | JP | 101004013 | 1/1989 |
| 2002/0185684 | A1 | 12/2002 | Campbell et al. | JP | 01-128570 A | 5/1989 |
| 2003/0001221 | A1 | 1/2003 | Fischer et al. | JP | 01-169917 A | 7/1989 |
| 2003/0077885 | A1 | 4/2003 | Aspar et al. | JP | 08017777 | 1/1990 |
| 2004/0009649 | A1 | 1/2004 | Kub et al. | JP | 4199504 | 7/1992 |
| 2004/0209441 | A1 | 10/2004 | Maleville et al. | JP | 07-254690 | 10/1995 |
| 2005/0029224 | A1 | 2/2005 | Aspar et al. | JP | 7-302889 | 11/1995 |
| 2006/0281212 | A1 | 12/2006 | Moriceau et al. | JP | 8133878 | 5/1996 |
| 2007/0020895 | A1 | 1/2007 | Moriceau et al. | JP | 09-213594 | 8/1997 |
| 2007/0037363 | A1 | 2/2007 | Aspar et al. | JP | 09-307719 | 11/1997 |
| 2007/0087528 | A1 * | 4/2007 | Kim et al. ..................... 438/455 | JP | 10163166 | 6/1998 |
| 2007/0202660 | A1 | 8/2007 | Moriceau et al. | JP | 10233352 | 9/1998 |
| 2007/0259528 | A1 | 11/2007 | Moriceau et al. | JP | 11045862 | 2/1999 |
| 2007/0281445 | A1 | 12/2007 | Nguyen et al. | JP | 11074208 | 3/1999 |
| 2008/0254591 | A1 | 10/2008 | Deguet et al. | JP | 11087668 | 3/1999 |
| 2009/0120568 | A1 | 5/2009 | Deguet et al. | JP | 11-145436 | 5/1999 |
| 2009/0130392 | A1 | 5/2009 | Aspar et al. | JP | 11-233449 A | 8/1999 |
| 2009/0156016 | A1 | 6/2009 | Di Cioccio | JP | 11317577 | 11/1999 |
| 2010/0025228 | A1 | 2/2010 | Tauzin et al. | RU | 128757 | 6/2000 |
| 2010/0167499 | A1 | 7/2010 | Fournel et al. | WO | WO 95/20824 A1 | 8/1995 |
| 2010/0216294 | A1 | 8/2010 | Rabarot et al. | WO | WO 99/08316 A1 | 2/1999 |
| 2010/0323497 | A1 | 12/2010 | Fournel | WO | WO 99/35674 A1 | 7/1999 |
| | | | | WO | WO 99/39378 A1 | 8/1999 |
| | | FOREIGN PATENT DOCUMENTS | | WO | WO 00/48238 A1 | 8/2000 |
| EP | | 0 355 913 A1 | 2/1990 | WO | WO 00/63965 A1 | 10/2000 |
| EP | | 0 383 391 A1 | 8/1990 | WO | WO 01/11930 A2 | 2/2001 |
| EP | | 0 410 679 A1 | 1/1991 | WO | WO 01/43168 A2 | 6/2001 |
| EP | | 0 504 714 | 9/1992 | WO | WO 02/05344 A1 | 1/2002 |
| EP | | 0 533 551 A1 | 3/1993 | WO | WO 02/47156 A1 | 6/2002 |
| EP | | 0 293 049 B1 | 9/1993 | WO | WO 02/083387 A1 | 10/2002 |
| EP | | 0 660 140 A1 | 6/1995 | WO | WO 02/084721 A1 | 10/2002 |
| EP | | 0 665 588 A1 | 8/1995 | WO | WO 02/084722 A1 | 10/2002 |
| EP | | 0 703 609 A1 | 3/1996 | WO | WO 03/013815 A1 | 2/2003 |
| EP | | 0 717 437 B1 | 6/1996 | WO | WO 03/021667 A2 | 3/2003 |
| EP | | 0 754 953 B1 | 1/1997 | WO | WO 03/032384 A1 | 4/2003 |
| EP | | 0807970 A1 | 5/1997 | WO | WO 2004/044976 A1 | 5/2004 |
| EP | | 0 786 801 A1 | 7/1997 | WO | WO 2004/059711 A1 | 7/2004 |
| EP | | 0 767 486 B1 | 9/1997 | WO | WO 2004/064146 A1 | 7/2004 |
| EP | | 0 793 263 A2 | 9/1997 | WO | WO 2005/019094 A1 | 3/2005 |
| EP | | 0 801 419 A1 | 10/1997 | WO | WO 2005/043615 A1 | 5/2005 |
| EP | | 0849 788 A2 | 6/1998 | WO | WO 2007/020351 A1 | 2/2007 |

| | | |
|---|---|---|
| WO | WO 2007/036631 A1 | 4/2007 |
| WO | WO 2007/110515 A2 | 10/2007 |
| WO | WO 2008/093008 A2 | 8/2008 |
| WO | WO 2009/087290 A1 | 7/2009 |

OTHER PUBLICATIONS

Donohue et al., "Pulse-Extended Excimer Laser Annealing of Lead Zirconate Titanate Thin Films", proceedings of the 12th International Symposium on Integrated Ferroelectrics, Aachen, Germany, Mar. 2000, *Integrated Ferroelectrics*, vol. 31, pp. 285 to 296, 2000.

Heistand et al., "Advances in Passive Integration for C/RC Arrays & Networks with Novel Thin & Thick Film Materials", 36th Nordic IMAPS conference, Helsinki, 1999.

Hendrix et al., "Low-Temperature Process for High-Density Thin-Film Integrated Capacitors", International Conference on High-Density Interconnect and Systems Packaging, 2000.

Jenei et al., "High-Q Inductors and Capacitors on Si Substrate", IEEE 2001.

Kim et al., "A Porous-Si-based Novel Isolation Technology for Mixed-Signal Integrated Circuits", Symposium on VLSI Technology, 2000.

Liu et al., "Integrated Thin Film Capacitor Arrays", International Conference on High Density Packaging and MCMs, 1999.

Roozeboom et al., "High-Value MOS Capacitor Arrays in Ultradeep Trenches in Silicon", *Microelectronic Engineering*, vol. 53, pp. 581 to 584, Elsevier Science 2000.

Tomisaka et al., "Electroplating Cu Fillings for Through-Vias for Three-Dimensional Chip Stacking" (Electronic Components and Technology Conference, 2002).

Tillman et al., "Zero-Level Packaging for MEMS or MST Devices: The IRS Method", MEMS/Sensors, Advancing Microelectronics, pp. 37-39, Nov./Dec. 2000.

Almedia et al. "Bond formation in ion beam synthesized amorphous gallium nitride", *Elsevier, This Solid Films*, 343-344 1999, pp. 632-636.

Aspar et al., Smart-Cut®: The basic fabrication process for UNIBOND® SOI wafers, *SEMI* 1996, pp. 37-46.

Haisma et al., Silicon-on-Insulator Wafer Bonding-Wafer Thinning Technological Evaluations, *JAPANese Journal of Applied Physics*, Aug. 28, 1989, No. 8, Part 1, Tokyo, Japan, pp. 1426-1443.

Maleville, C. et al, "Wafer Bonding and Hi-Implantation Mechanisms Involved In The Smart-Cut Technology", 1997, pp. 14-19.

Office Action (Non-Final) for U.S. Appl. No. 10/474,984—Dated Sep. 24, 2004.

Office Action (Non-Final) for U.S. Appl. No. 10/474,984—Dated Jun. 6, 2005.

Office Action (Non-Final) for U.S. Appl. No. 10/474,984—Dated Nov. 16, 2005.

Office Action (Non-Final) for U.S. Appl. No. 10/474,984—Dated May 17, 2006.

Office Action (Non-Final) for U.S. Appl. No. 10/474,984—Dated May 7, 2007.

Office Action (Non-Final) for U.S. Appl. No. 10/474,984—Dated Feb. 6, 2008.

Office Action (Final) for U.S. Appl. No. 10/474,984—Dated Oct. 17, 2008.

Office Action (Non-Final) for U.S. Appl. No. 10/474,984—Dated Jul. 7, 2009.

Office Action (Non-Final) for U.S. Appl. No. 10/565,621—Dated May 15, 2007.

Office Action (Final) for U.S. Appl. No. 10/565,621—Dated Feb. 11, 2008.

Office Action (Non-Final) for U.S. Appl. No. 10/565,621—Dated Sep. 12, 2008.

Office Action (Final) for U.S. Appl. No. 10/565,621—Dated Mar. 12, 2009.

Office Action (Non-Final) for U.S. Appl. No. 10/468,223—Dated Oct. 5, 2005.

Office Action (Final) for U.S. Appl. No. 10/468,223—Dated May 3, 2006.

Office Action (Non-Final) for U.S. Appl. No. 10/468,223—Dated Jan. 10, 2007.

Office Action (Final) for U.S. Appl. No. 10/468,223—Dated Jul. 20, 2007.

Office Action (Non-Final) for U.S. Appl. No. 10/468,223—Dated Feb. 11, 2008.

Office Action (Final) for U.S. Appl. No. 10/468,223—Dated Oct. 29, 2008.

Office Action (Non-Final) for U.S. Appl. No. 10/468,223—Dated Jun. 25, 2009.

Wiegand, M. et al., "Wafer Bonding of Silicon Wafers Covered With Various Surface Layers", *Sensors and Actuators*, Elsevier Science B.V., vol. 86, 2000, pp. 91-95.

U.S. District Court District of Delaware (Wilmington) Civil Docket For Case #: 1:08-cv-00292-SLR—(19 pgs).

Complaint filed with Jury Demand against MEMC Electronic Materials Inc.—Magistrate Consent Notice to Pltf. ( Filing fee $ 350, receipt No. 152004.)—filed by SOITEC Silicon On Insulator Technologies SA, Commissariat a LEnergie Atomique. (Attachments: # 1 Exhibit 1, # 2 Exhibit 2, # 3 Exhibit 3, # 4 Civil Cover Sheet, # 5 Acknowledgement of Consent Form) (sns, ) (Entered: May 20, 2008) (47 pgs).

Notice of Availability of a U.S. Magistrate Judge to Exercise Jurisdiction (sns, ) (Entered: May 20, 2008) (1 pg).

Report to the Commissioner of Patents and Trademarks for Patent/Trademark Nos. RE39,484 E; 6,809,009; 7,067,396 B2; (sns, ) (Entered: May 20, 2008) (1 pg).

Summons Returned Executed by SOITEC Silicon On Insulator Technologies SA, Commissariat a LEnergie Atomique. MEMC Electronic Materials Inc. served on May 19, 2008, answer due Jun. 9, 2008. (Kraft, Denise) (Entered: May 20, 2008) (2 pgs).

Motion for Pro Hac Vice Appearance of Attorney George W. Neuner, Alan M. Spiro, Brian M. Gaff and Carolyn D'Agincourt—filed by SOITEC Silicon On Insulator Technologies SA, Commissariat a LEnergie Atomique. (Attachments: # 1 Certificate of Compliance Certification by Counsel To Be Admitted Pro Hac Vice, # 2 Certificate of Compliance Certification by Counsel To Be Admitted Pro Hac Vice, # 3 Certificate of Compliance Certification by Counsel To Be Admitted Pro Hac Vice, # 4 Certificate of Compliance Certification by Counsel To Be Admitted Pro Hac Vice, # 5 Certificate of Service)(Kraft, Denise) (Entered: May 23, 2008) (6 pgs).

Stipulation to Extend Time Answer to Complaint to Jul. 9, 2008—filed by MEMC Electronic Materials Inc.. (Rogowski, Patricia) (Entered: Jun. 5, 2008) (1 pg).

Motion for Pro Hac Vice Appearance of Attorney Robert M. Evans, Jr., David W. Harlan, Richard L. Brophy, Marc W. Vander Tuig—filed by MEMC Electronic Materials Inc.. (Attachments: # 1 Certification of Robert M. Evans, Jr., # 2 Certification of David W. Harlan, # 3 Certification of Richard L. Brophy, # 4 Certification of Marc W. Vander Tuig)(Rogowski, Patricia) (Entered: Jun. 9, 2008) (6 pgs).

Motion for Pro Hac Vice Appearance of Attorney Michael L. Brody, Richard P. Gilly, Gail J. Standish, Marcus T. Hall and Jason S. Charkow—filed by SOITEC Silicon On Insulator Technologies SA. (Attachments: # 1 Certification By Counsel to be Admitted Pro Hac Vice, # 2 Certification By Counsel to be Admitted Pro Hac Vice, # 3 Certification By Counsel to be Admitted Pro Hac Vice, # 4 Certification By Counsel to be Admitted Pro Hac Vice, # 5 Certification By Counsel to be Admitted Pro Hac Vice)(Kraft, Denise) (Entered: Jun. 10, 2008) (8 pgs).

Disclosure Statement pursuant to Rule 7.1 filed by SOITEC Silicon on Insulator Technologies SA, Commissariat a LEnergie Atomique. (Attachments: # 1 Certificate of Service)(Kraft, Denise) (Entered: Jun. 16, 2008) (3 pgs).

Motion to Dismiss Based upon or, in the Alternative, Motion for a More Definite Statement—filed by MEMC Electronic Materials Inc. (Rogowski, Patricia) (Entered: Jul. 9, 2008) (4 pgs).

Opening Brief in Support re 10 Motion to Dismiss Based upon or, in the Alternative, Motion for a More Definite Statement filed by MEMC Electronic Materials Inc..Answering Brief/Response due date per Local Rules is Jul. 28, 2008. (Rogowski, Patricia) (Entered: Jul. 9, 2008) (15 pgs).

Disclosure Statement pursuant to Rule 7.1 filed by MEMC Electronic Materials Inc. (Rogowski, Patricia) (Entered: Jul. 9, 2008) (3 pgs).

Answering Brief in Opposition re 10 Motion to Dismiss Based upon or, in the Alternative, Motion for a More Definite Statement filed by Commissariat a L'Energie Atomique. Reply Brief due date per Local Rules is Aug. 7, 2008. (Attachments: # 6 Exhibit A, # 7 Exhibit B, # Certificate of Service) (Kraft, Denise) (Modified on Jul. 29, 2008 (lid). (Entered: Jul. 28, 2008) (29 pgs).

Sealed Reply Brief re 10 Motion to Dismiss Based upon or, in the Alternative, Motion for a More Definite Statement filed by MEMC Electronic Materials Inc. (Rogowski, Patricia) (Entered: Aug. 7, 2008) Redacted Reply Brief re 14-re 10 Motion to Dismiss Based upon or, in the Alternative, Motion for a More Definite Statement filed by MEMC Electronic Materials Inc. (Attachments: # 1 Exhibit 2, # 2 Exhibit 3, # 3 Exhibit 4, # 4 Exhibit 5, # 5 Unreported Cases, # 6 Certificate of Service) (Rogowski, Patricia) Modified on Aug. 8, 2008 (lid). (Entered: Aug. 7, 2008) (98 pgs).

Memorandum Order denying 10 Motion to Dismiss Based upon or, in the Alternative, Motion for a More Definite Statement filed by MEMC Electronic Materials Inc., Order, Setting Hearings Telephonic Scheduling Conference set for Mar. 12, 2009 at 9:00 A.M. Signed by Judge Sue L. Robinson on Feb. 20, 2009. (nmf) (Entered: Feb. 20, 2009) (6 pgs).

Motion for Pro Hac Vice Appearance of Attorney B. Scott Eidson—filed by MEMC Electronic Materials Inc. (Attachments: # 1 Exhibit Certification by Counsel to be Admitted Pro Hac Vice)(Rogowski, Patricia) (Entered: Feb. 23, 2009) (4 pgs).

Notice of Service of Plaintiffs' Initial Disclosures Pursuant to Fed. R. Civ. P. 26(a)(1) by SOITEC Silicon On Insulator Technologies SA, Commissariat a L'Energie Atomique. (Attachments: # 1 Certificate of Service) (Kraft, Denise) (Entered: Feb. 27, 2009) (4 pgs).

Answer to 1 Complaint, with Jury Trial Demanded, Counterclaim against all plaintiffs by MEMC Electronic Materials Inc.. (Attachments: # 1 Exhibit A)(Rogowski, Patricia) (Entered: Mar. 6, 2009) (55 pgs).

Notice of Service of MEMC Electronic Materials, Inc.'s Initial Disclosures by MEMC Electronic Materials Inc. (Rogowski, Patricia) (Entered: Mar. 6, 2009) (3 pgs).

Proposed Order Proposed Scheduling Order re 16 Memorandum and Order, Set Hearings, by SOITEC Silicon On Insulator Technologies SA, Commissariat a 'LEnergie Atomique. (Kraft, Denise) (Entered: Mar. 10, 2009) (7 pgs).

Letter to The Honorable Sue L. Robinson from Denise Seastone Kraft, Esq. regarding [Proposed] Scheduling Order—re 21 Proposed Order, 16 Memorandum and Order, Set Hearings,. (Kraft, Denise) (Entered: Mar. 10, 2009) (1 pg).

Stipulation to Extend Time to Respond or Otherwise Plead to Defendant's Counterclaim to Apr. 7, 2009—filed by SOITEC Silicon on Insulator Technologies SA, Commissariat a L'Energie Atomique. (Attachments: # 1 Certificate of Service)(Kraft, Denise) (Entered: Mar. 11, 2009) (2 pgs).

Proposed Order Revised Scheduling Order re 21 Proposed Order, 16 Memorandum and Order Set Hearings, by SOITEC Silicon On Insulator Technologies SA, Commissariat a L'Energie Atomique. (Kraft, Denise) (Entered: Mar. 12, 2009) (7 pgs).

Letter to The Honorable Sue L. Robinson from Denise Seastone Kraft regarding Revised Scheduling Order Pursuant to Mar. 12, 2009 Telephonic Scheduling Conference—re 24 Proposed Order. (Kraft, Denise) (Entered: Mar. 12, 2009) (1 pg).

Scheduling Order: Case referred to the Magistrate Judge for the purpose of exploring ADR. Joiner of Parties due by Aug. 14, 2009. Amended Pleadings due by Aug. 14, 2009. Discovery due by Apr. 23, 2010. Discovery Conference set for Jun. 25, 2009 04:30 PM in Courtroom 6B before Judge Sue L. Robinson. Dispositive Motions due by Jun. 25, 2010. Answering Brief due Jul. 16, 2010. Reply Brief due Jul. 30, 2010. Oral Argument set for Aug. 27, 2010 09:30 AM in Courtroom 6B before Judge Sue L. Robinson. Claim Construction Opening Briefs due by Jun. 18, 2010. Response Briefs due Jul. 9, 2010. Final Pretrial Conference set for Oct. 14, 2010 04:30 PM in Courtroom 6B before Judge Sue L. Robinson. Jury Trial set for Oct. 25, 2010 09:30 AM in Courtroom 6B before Judge Sue L. Robinson. Signed by Judge Sue L. Robinson on Mar. 16, 2009. (nmf) (Entered: Mar. 16, 2009) (7 pgs).

Order Setting Teleconference: Telephone Conference set for Mar. 23, 2009 at 11:00 AM before Judge Mary Pat Thynge to discuss ADR. Signed by Judge Mary Pat Thynge on Mar. 16, 2009. (cak) (Entered: Mar. 16, 2009) (4 pgs).

Order Setting Teleconference: a teleconference has been scheduled for Monday, Jun. 1, 2009 at 10:00 a.m. with Magistrate Judge Thynge to discuss the status of the case and the parties negotiations. Counsel for MEMC shall initiate the teleconference call to 302-573-6173. It is Further Ordered that the Court is holding Sep. 10, Sep. 14 and Sep. 15, 2009 as possible mediation dates. Counsel are to advise Judge Thynge by Mar. 30, 2009 if any of these dates works for everyone to schedule the mediation. Signed by Judge Mary Pat Thynge on Mar. 23, 2009. (cak) (Entered: Mar. 23, 2009) (2 pgs).

Order Setting Mediation Conferences: Mediation Conference Tentatively set for Sep. 15, 2009 at 10:00 AM in Courtroom 2B before Judge Mary Pat Thynge. See order for details. Signed by Judge Mary Pat Thynge on Mar. 24, 2009. (cak) (Entered: Mar. 24, 2009) (6 pgs).

Motion to Dismiss Based upon Fed. R. Civ. P. 12(b)(1) and (6) and Article III of the United States Constitution—filed by SOITEC Silicon On Insulator Technologies SA, Commissariat a LEnergie Atomique. (Attachments: # 1 Text of Proposed Order, # 2 Certificate of Service)(Kraft, Denise) (Entered: Apr. 7, 2009) (5 pgs).

Opening Brief in Support re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution filed by SOITEC Silicon On Insulator Technologies SA, Commissariat a L'Energie Atomique Answering Brief/Response due date per Local Rules is Apr. 27, 2009. (Attachments: # 1 Certificate of Service)(Kraft, Denise) (Entered: Apr. 7, 2009) (13 pgs).

Answer to 19 Answer to Complaint, Counterclaim Partial Answer to Defendant's Counterclaims, Affirmative Defenses and Soitec Counterclaims, Counterclaim against MEMC Electronic Materials Inc. by SOITEC Silicon On Insulator Technologies SA, Commissariat a LEnergie Atomique. (Attachments: # 1 Certificate of Service)(Kraft, Denise) (Entered: Apr. 7, 2009) (18 pgs).

Notice of Service of First Request for Production of Documents and Things Directed to Commissariat A L'Energie Atomique; First Request for Production of Documents and Things Directed to SOITEC Silicon on Insulator Technologies, S.A. and Soitec USA, Inc.; and First Set of Interrogatories Directed to SOITEC Silicon on Insulator Technologies, S.A., Soitec USA, Inc. and Commissariat A L'Energie Atomique by MEMC Electronic Materials Inc. (Rogowski, Patricia) (Entered: Apr. 14, 2009) (3 pgs).

Stipulation to Extend Time Defendant to File Answering Brief in Opposition to Plaintiffs' Partial Motion to Dismiss Counterclaim Counts II, III, IV, V, and VIII to May 6, 2009—filed by MEMC Electronic Materials Inc. (Rogowski, Patricia) (Entered: Apr. 21, 2009) (3 pgs).

Answer to 32 Answer to Counterclaim,,, of S.O.I. TEC Silicon on Insulator Technologies, S.A. and SOITEC U.S.A., Inc. by MEMC Electronic Materials Inc. (Rogowski, Patricia) (Entered: Apr. 23, 2009) (4 pgs).

Stipulation to Extend Time Answering Brief in Opposition to Plaintiffs' Partial Motion to Dismiss Counterclaim Counts II, III, IV, V and VIII to May 15, 2009—filed by MEMC Electronic Materials Inc.. (Rogowski, Patricia) (Entered: May 6, 2009) (3 pgs).

Notice of Service of Soitec's First Set of Interrogatories (Nos. 1-17) and Soitec's First Set of Requests for Production of Documents and Things (Nos. 1-132) by SOITEC Silicon On Insulator Technologies SA, Commissariat a 'LEnergie Atomique. (Attachments: # 1 Certificate of Service)(Kraft, Denise) (Entered: May 6, 2009) (2 pgs).

Stipulation to Extend Time for Defendant to File an Answering Brief in Opposition to Plaintiffs' Partial Motion to Dismiss Counterclaim Counts II, III, IV, V, and VIII; and Stipulation to Extend Time for Plaintiffs to File Responses to MEMC's First Requests for Production of Documents and to MEMC's First Set of Interrogatories to May 29, 2009—filed by SOITEC Silicon On Insulator Technologies SA, Commissariat a L'Energie Atomique. (Attachments: # 1 Certificate of Service)(Kraft, Denise) (Entered: May 13, 2009).

Notice of Service of (1) Subpoena to Hayes Soloway, P.C., (2) Subpoena to Pearne & Gordon, LLP, (3) Subpoena to Brinks Hofer Gilson & Lione, and (4) Subpoena to Winston & Strawn by MEMC Electronic Materials Inc. (Rogowski, Patricia) (Entered: May 14, 2009) So Ordered—re 38 Stipulation to Extend Time. Set Briefing Schedule: re 30 Motion to Dismiss. (Answering Brief due May 29, 2009.) (Refer to Stipulation for Further Details.). Signed by Judge Sue L. Robinson on May 15, 2009. (lid) (Entered: May 15, 2009).
Stipulation To Extend Time for Defendant to File Its Answering Brief until Jun. 5, 2009 by MEMC Electronic Materials Inc.. (Rogowski, Patricia) (Entered: May 28, 2009) SO Ordered, re 40 Stipulation, Set Briefing Schedule: re 30 Motion to Dismiss Based upon Fed. R. Civ. P. 12(b)(1) and (6) and Article III of the United States Constitution. (Answering Brief due Jun. 5, 2009.). Signed by Judge Sue L. Robinson on May 29, 2009. (nmf) (Entered: May 29, 2009).
Notice of Service of (1) Soitec's Objections and Responses to MEMC's First Set of Interrogatories; (2) Soitecs Objections and Responses to MEMC's First Request For Production of Documents and Things; (3) CEAs Objections and Responses to MEMC's First Set of Interrogatories; and (4) CEAs Objections and Responses to MEMC's First Request For Production of Documents and Things by SOITEC Silicon On Insulator Technologies SA, Commissariat a L'Energie Atomique. (Attachments: # 1 Certificate of Service) (Kraft, Denise) (Entered: May 29, 2009).
Stipulation To extend date to Jun. 19, 2009 by which defendant may file an answering brief in opposition to plaintiffs' Partial Motion to Dismiss Counterclaim Counts II, III, IV, V, and VIII by MEMC Electronic Materials Inc.. (Rogowski, Patricia) (Entered: Jun. 5, 2009).
Notice of Service of MEMC's Answers to SOITEC's First Set of Interrogatories (Nos. 1-17) and MEMC's Responses to SOITEC's First Set of Requests for Production of Documents and Things (Nos. 1-132) by MEMC Electronic Materials Inc..(Rogowski, Patricia) (Entered: Jun. 5, 2009) So Ordered—re 42 Stipulation to Extend Time. Set Briefing Schedule: re 30 Motion to Dismiss. (Answering Brief due Jun. 19, 2009.). Signed by Judge Sue L. Robinson on Jun. 8, 2009. (lid) (Entered: Jun. 8, 2009).
Notice of Service of Soitec's Second Set of Requests For Production of Documents and Things (Nos. 133-135) re 41 Notice of Service,, by SOITEC Silicon On Insulator Technologies SA, Commissariat a LEnergie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Jun. 11, 2009).
Letter to Honorable Sue L. Robinson from Patricia Smink Rogowski regarding Transmitting Form of Protective Order. (Attachments: # 1 Form of Protective Order, # 2 Exhibit Exhibit A to Form of Protective Order)(Rogowski, Patricia) (Entered: Jun. 16, 2009).
Notice of Service of MEMC's Second Request for Production of Documents and Things Directed to S.O.I.TEC Silicon on Insulator Technologies, S.A. and Soitec USA, Inc. by MEMC Electronic Materials Inc. (Rogowski, Patricia) (Entered: Jun. 16, 2009) Set/Reset Hearings: Discovery Conference re-set per joint request of counsel for Sep. 16, 2009 08:30 AM in Courtroom 6B before Judge Sue L. Robinson. (nmf) (Entered: Jun. 18, 2009).
Stipulation to Extend Time Defendant's Answering Brief in Opposition to Plaintiffs' Partial Motion to Dismiss Counterclaim Counts II, III, IV, V, and VIII to Jul. 2, 2009—filed by MEMC Electronic Materials Inc.. (Rogowski, Patricia) (Entered: Jun. 19, 2009) So Ordered—re 47 Stipulation to Extend Time. Set Briefing Schedule: re 30 Motion to Dismiss (Answering Brief due Jul. 2, 2009.). Signed by Judge Sue L. Robinson on Jun. 23, 2009. (lid) (Entered: Jun. 23, 2009) So Ordered, re 45 Protective Order. Signed by Judge Sue L. Robinson on Jun. 30, 2009. (nmf) (Entered: Jun. 30, 2009).
Notice of by SOITEC Silicon On Insulator Technologies SA, Commissariat a L'Energie Atomique re 30 Motion to Dismiss Based upon Fed. R. Civ. P. 12(b)(1) and (6) and Article III of the United States Constitution Motion to Dismiss Based upon Fed. R. Civ. P. 12(b)(1) and (6) and Article III of the United States Constitution *Notice of Withdrawal of Plaintiffs' Partial Motion to Dismiss Counterclaim Counts II, III, IV, V, and VIII* (Attachments: # 1 Certificate of Service)(Kraft, Denise) (Entered: Jul. 2, 2009).
Notice of Service of MEMC's Responses to SOITEC's Second Set of Requests for Production of Documents and Things Directed to MEMC by MEMC Electronic Materials Inc..(Rogowski, Patricia) (Entered: Jul. 14, 2009).

Stipulation and [Proposed] Order to File an Amended Complaint by SOITEC Silicon On Insulator Technologies SA, Commissariat a LEnergie Atomique. (Attachments: # 1 Exhibit A, # 2 Certificate of Service)(Kraft, Denise) (Entered: Jul. 16, 2009).
Notice of Service of Soitec's Objections and Responses to MEMC's Second Request For Production of Documents and Things Directed To Soitec re 46 Notice of Service by SOITEC Silicon on Insulator Technologies SA, Commissariat a LEnergie Atomique. Related document: 46 Notice of Service filed by MEMC Electronic Materials Inc. (Attachments: # 1 Certificate of Service)(Kraft, Denise) (Entered: Jul. 16, 2009).
Notice of Withdrawal of Docket Entry 51 by SOITEC Silicon On Insulator Technologies SA, Commissariat a L'Energie Atomique re 51 Notice of Service, (Attachments: # 1 Certificate of Service)(Kraft, Denise) (Entered: Jul. 17, 2009).
Notice of Service of SOITEC's Objections and Responses to MEMC's Second Request for Production of Documents and Things Directed to SOITEC re 46 Notice of Service by SOITEC Silicon on Insulator Technologies SA, Commissariat a L'Energie Atomique. Related document: 46 Notice of Service filed by MEMC Electronic Materials Inc.. (Attachments: # 1 Certificate of Service)(Kraft, Denise) (Entered: Jul. 17, 2009).
Notice of Service of MEMC Electronic Materials, Inc.'s Second Set of Interrogatories Directed to S.O.I.TEC Silicon on Insulator Technologies, S.A., SOITEC USA, Inc. and Commissariat a L'Energie Atomique by MEMC Electronic Materials Inc..(Rogowski, Patricia) (Entered: Jul. 17, 2009).
Notice of Service of Soitec's Production of Documents Bates Numbered SCEA 00000001 to SCEA 00002442 by SOITEC Silicon on Insulator Technologies SA, Commissariat a L'Energie Atomique. (Attachments: # 1 Certificate of Service)(Kraft, Denise) (Entered: Jul. 17, 2009) So Ordered, re 50 Stipulation. Signed by Judge Sue L. Robinson on Jul. 20, 2009. (nmf) (Entered: Jul. 20, 2009).
Notice of Service of MEMC's Production of Documents Bates Numbered MEMC0300000 to MEMC0306530 by MEMC Electronic Materials Inc. (Rogowski, Patricia) (Entered: Jul. 20, 2009).
First Amended Complaint *for Patent Infringement* against MEMC Electronic Materials Inc.—filed by SOITEC Silicon on Insulator Technologies SA, Commissariat a L'Energie Atomique. (Attachments: # 1 Exhibit Exhibit 1, # 2 Exhibit Exhibit 2, # 3 Exhibit Exhibit 3, # 4 Exhibit Exhibit 4, # 5 Certificate of Service)(Kraft, Denise) (Entered: Jul. 21, 2009).
Notice of Service of Soitec S.A.'s Second Set of Interrogatories (Nos. 18-22) and CEA's First Set of Interrogatories (Nos. 1-11) by SOITEC Silicon On Insulator Technologies SA, Commissariat a L'Energie Atomique. (Attachments: # 1 Certificate of Service)(Kraft, Denise) (Entered: Jul. 23, 2009).
Notice of Service of S.O.I.TEC Silicon on Insulator Technologies, S.A. and Commissariat a Lenergie Atomique Supplemental Production of Documents Bates Numbered SLIT 00000001 to SLIT 00049728 re 43 Notice of Service, by SOITEC Silicon on Insulator Technologies SA, Commissariat a LEnergie Atomique. Related document: 43 Notice of Service, filed by MEMC Electronic Materials Inc.. (Attachments: # 1 Certificate of Service)(Kraft, Denise) (Entered: Jul. 27, 2009).
Answer to Amended Complaint Answer to 57 Amended Complaint, with Under Federal Rule of Civil Procedure 38, MEMC demands a trial by jury on all issues so triable., Counterclaim against all plaintiffs by MEMC Electronic Materials Inc.. (Attachments: # 1 Exhibit A, # 2 Certificate of Service)(Rogowski, Patricia) (Entered: Aug. 3, 2009).
Notice of Service of MEMC's Production of Documents Bates Numbered MEMC0300000-MEMC0337055 by MEMC Electronic Materials Inc. (Rogowski, Patricia) (Entered: Aug. 5, 2009).
Notice of Service of S.O.I.TEC Silicon on Insulator Technologies, S.A. and Commissariat a L Energie Atomique's Revised Supplemental Production of Documents Bates Numbered SLIT00000001-SLIT0004886; SLIT00004931 SLIT00004985; SLIT00005169 SLIT00005174; SLIT00005241 SLIT00006368; and SLIT00006886-SLIT00049728 re 59 Notice of Service, by SOITEC U.S.A., Inc., SOITEC Silicon On Insulator Technologies SA, Commissariat a LEnergie Atomique. Related document: 59 Notice of Service, filed by SOITEC Silicon On Insulator Technologies SA, Commissariat a LEnergie Atomique. (Attachments: # 1 Certificate of Service)(Kraft, Denise) (Entered: Aug. 6, 2009).

Stipulation to Extend Time to Answer or Otherwise Respond to MEMC's Amended Counterclaims to Aug. 31, 2009—filed by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of S.O.I.TEC Silicon on Insulator Technologies, S.A. and Commissariat a L'Energie Atomique's Supplemental Production of Documents Bates Numbered SOIT 00000001 to SOIT 00003528 and SLIT 00049729 to SLIT 00060612 by SOITEC Silicon On Insulator Technologies SA, SOITEC U.S.A., Inc., Commissariat a L'Energie Atomique. (Attachments: # 1 Certificate of Service)(Kraft, Denise) (Entered: Aug. 25, 2009).

Notice of Service of MEMC's Production of Documents Bates Numbered MEMC0337056 to MEMC0337503 and MEMC0337504- MEMC0338047 by MEMC Electronic Materials Inc..(Rogowski, Patricia) (Entered: Aug. 26, 2009).

Notice of Service of (1) SOITECs Supplemental Responses to MEMC Electronic Materials, Inc's First Set of Interrogatories; and (2) CEAs Supplemental Responses to MEMC Electronic Materials, Inc.s First Set of Interrogatories re 41 Notice of Service,, by SOITEC Silicon On Insulator Technologies SA, SOITEC U.S.A., Inc., Commissariat a L'Energie Atomique. Related document: 41 Notice of Service,, filed by SOITEC Silicon On Insulator Technologies SA, Commissariat a L'Energie Atomique. (Attachments: # 1 Certificate of Service)(Kraft, Denise) (Entered: Aug. 26, 2009).

Notice of Service of MEMC's Supplemental Answers to SOITEC's First Set of Interrogatories by MEMC Electronic Materials Inc.. (Rogowski, Patricia) (Entered: Aug. 27, 2009) So Ordered—re 63 Stipulation to Extend Time. Set/Reset Answer Deadlines: SOITEC Silicon on Insulator Technologies SA answer due Aug. 31, 2009; Commissariat a L'Energie Atomique answer due Aug. 31, 2009; SOITEC U.S.A., Inc. answer due Aug. 31, 2009. Signed by Judge Sue L. Robinson on Aug. 27, 2009. (lid) (Entered: Aug. 27, 2009).

Answer to 60 Answer to Amended Complaint, Counterclaim,,, Counterclaim *Reply to Defendant's Amended Counterclaims, Counterclaims And Affirmative Defenses* against MEMC Electronic Materials Inc. by SOITEC Silicon On Insulator Technologies SA, Commissariat a L'Energie Atomique, SOITEC U.S.A., Inc.. (Attachments: # 1 Certificate of Service)(Kraft, Denise) (Entered: Aug. 31, 2009).

Notice of Service of MEMC's Third Set of Interrogatories Directed to S.O.I.TEC Silicon on Insulator Technologies, S.A., SOITEC USA, Inc., and Commissariat A L'Energie Atomique by MEMC Electronic Materials Inc. (Rogowski, Patricia) (Entered: Sep. 1, 2009).

Answer to 68 Answer to Counterclaim,,, by MEMC Electronic Materials Inc..(Rogowski, Patricia) (Entered: Sep. 14, 2009). Minute Entry for proceedings held before Judge Sue L. Robinson—Discovery Conference held on Sep. 16, 2009. (Court Reporter V. Gunning.) (nmf) (Entered: Sep. 16, 2009).

Notice of Service of Soitec S.A.'s Third Set of Interrogatories (Nos. 23-27) re 58 Notice of Service, by SOITEC Silicon On Insulator Technologies SA, SOITEC U.S.A., Inc., Commissariat a LEnergie Atomique. Related document: 58 Notice of Service, filed by SOITEC Silicon on Insulator Technologies SA, Commissariat a LEnergie Atomique. (Attachments: # 1 Certificate of Service)(Kraft, Denise) (Entered: Sep. 22, 2009).

Agarwal et al, "Efficient Production of Silicon-On-Insulator Films by Co-Implantation of HE+ with H+", *Applied Physics Letters*, vol. 72, No. 9, 1998, pp. 1086-1088.

Agarwal, Aditya et al. "Efficient Production of Silicon-On-Insulator Films by Co-Implantation of He$^+$with H$^+$"—Proceedings 1997 IEEE International SOI Conference, Oct. 1997—pp. 44-45.

Ahn, K. Y., et al., "Growth, Shrinkage, And Stability of Interfacial Oxide Layers Between Directly Bonded Silicon Wafers", *Applied Physics A.*, vol. 50, 1990, pp. 85-94.

Alley et al., "Surface Roughness Modification of Interfacial Contacts in Polysilicon Microstructures", Proceedings of the 7$^{th}$ International Conference on Solid-State Sensors and Actuators, *Transducers '93*, PACIFICO, Yokohama Japan. Jun. 7-10, 1993, pp. 288-291.

Ascheron, C., "A Comparative Study of Swelling, Radiation, Strain and Radiation Damage of High-Energy Proton-bombarded GaAs, GaP, InP, SI and Ge Single Crystals, Nuclear Instruments and Methods in Physics Research", *Nuclear Instruments and Methods in Physics Research* B36, (1989), 163-172.

Ascheron, C., "A Study of Proton Bombardment Induced Swelling of GaP Single Crystals", *Phys. stat. sol.* (a) 92, (1985), pp. 169-176.

Ascheron, C., "Gettering a Copper in Proton-and Helium-Bombarded Buried Regions of Gallium Phosphide", *Phys. stat. sol.* (a), vol. 106, 1988, pp. 73-79.

Ascheron, C., "Investigations of Hydrogen Implanted GaP Single Crystals by Means of Particle Induced 7-Spectroscopy, Infrared Spectroscopy, and Turyherford Backscattering Channeling Technique" *Phys. stat. sol.* (a) 89, (1985), pp. 549-557.

Ascheron, C., "Proton Beam Modification of Selected AIIIBV Compounds", *Phys. stat. sol.* (a) 124, (1991), pp. 11.

Ascheron, C., "Swelling, Strain, and Radiation Damage of He+ Implanted GaP", *Phys. stat. sol.* (a) 96, 1986, pp. 555-562. (1986).

Asheron, C., "The Effect of Hydrogen Implantation Induced Stress on GaP Single Crystals", *Nuclear Instruments and Methods in Physics Research*, B28 (1987), pp. 350-359.

Aspar et al., "The Generic Nature of the Smart-Cut© Process for Thin-Film Transfer", *Journal of Electronic Materials*, vol. 30, No. 7, Mar. 2001, pp. 834-840.

Aspar, B. "Basic Mechanisms Involved in the Smart-Cut Process", 1997, pp. 223-240.

Aspar, B. et al, "Characterization of SOI substrates: Application to Recent SIMOX and UNIBOND Wafers," *Electrochemical Society Proceedings*, vol. 96-3, pp. 99-111.

Aspar, B. et al, "Transfer of Structured and Patterned Thin Silicon Films Using the Smart-Cut Process", 1996, pp. 1985-1986.

Aspar, B. et al., "Ultra Thin Buried Oxide Layers Formed By Low Dose SIMOX Processes", Proc. 6$^{th}$ International Conference on SOI Technology and Devices, *Electro. Soc.*, vol. 94, No. 11, 1994, pp. 62.

Aspar, B. et al., "Smart Cut—Process Using Metallic Bonding: Application to Transfer of Si, GaAs, InP Thin Films", Electronic Letters—Jun. 10, 1999, vol. 35, No. 12., pp. 1024-1025.

Ashurst et al., "Water Level Anti-Stiction Coatings For MEMS", Sensors and Actuators A104, Apr. 23, 2003, pp. 213-221.

Auberton-Herve, A. J. et al, "A New Sal Material: Smart-Cut", 1996, pp. 214-219.

Auberton-Herve, A.J. et al, "SOI Materials for ULSI Applications", *Semiconductor International*, Oct. 1995, 5 pps.

A. J. Auberton-Hervé, "Silicon-On-Insulator," *European Semiconductor*, Mar. 1997, pp. 17 and 18.

A. J. Auberton-Herve, "Why Can Smart Cut® Change The Future Of Microelectronics?," Published in International Journal of High Speed Electronics and Systems, vol. 10, No. 1 (2000) pp. 131-146.

Blanchard-Lagahe C. et al., "Hydrogen and Helium Implantation to Achieve Layer Transfer" vol. 19, pp. 346-358, Apr. 2003, *Semiconductor Wafer Bonding VII: Science, Technology, and Applications—Proceedings of the International Symposium*.

Blöchl P.E. et al., First-Principles Calculations of Diffusion Coefficients: Hydrogen in Silicon, *Physical Review Letters*, vol. 64, No. 12, 1990, pp. 1401-1404.

Borgati, Stephen P., "The Root-Mean-Square", Boston College, Nov. 16, 1998, Obtained from the Internet at: <http://www.analytictech.com/mb313/rootmean.htm>.

Bruel, M. et al., (vol. 99-1) Meeting Abstract No. 333, "Single Crystal Semiconductor Layer Delamination and Transfer Through Hydrogen Implantation", The 195$^{th}$ Meeting of the Electrochemical Society, May 2-6, 1999, Seattle, Washington.

Bruel, Michel, "Application of Hydrogen Ion Beams To Silicon on Insulator Material Technology", *Nuclear Instruments and Methods in Physics Research*, B108, 1996, pp. 313-319.

Bruel, M. et al., "Smart-Cut: A New Silicon on Insulator Material Technology Based on Hydrogen Implantation and Wafer Bonding", 1997, pp. 1636-164, col. 36, Part 1, No. 3B.

Bruel, M. "Smart-Cut Process: The Way to Unibond S.O.I. Wafers", 1996, pages unknown.

Bruel, M. et al, "Smart-Cut": A Promising New SOI material technology, *Proceedings 1994 IEEE, International Sal Conference*, Oct. 1995, pp. 178-179.

Bruel, M. et al, "Smart-Cut-a new SOI Material Technology based on hydrogen Implantation and wafer bonding," *CEA*, 1996, 24 pages.

Bruel, M., "Silicon on insulator Material Technology", *Electronic Letters*; 31 Jul. 6, 1995; No. 14; pp. 1201-1202.

Bruel, M., "Silicon-an-Insulator", *European Semiconductor*, Mar. 1997.

Camperi-Ginestet et al., "Alignable Epitaxial Liftoff of GaAs Materials With Selective Deposition Using Polyimide Diaphragms", *IEEE Transactions Photonics Technology Letters*, vol. 3, No. 12, 1991, pp. 1123-1126.

Canham et al. "Radiative Recombination Channels due to Hydrogen In Crystalline Silicon", *Materials Science and Engineering*, B4 (1989) pp. 41-45.

Carter et al., "Applications of Ion Beams to Materials", *Inst. Phys. Conf. Ser.*, No. 28, Chapter 1, 1976, pp. 30-36.

Carter, G. et al., The Collection of Ions Implanted In Semiconductors: II Range Distributions Derived From Collection and Sputter-Etch Curves, *Radiation Effects*, 1972, vol. 16, pp. 107-114.

Cassidy, Victor M., "Ion Implantation Process Toughens Metalworking Tools," *Modern Metals*, 1984, pp. 65-67.

Cerofolini et al., "Hydrogen-Related Complexes as the Stressing Species in High-Fluence, Hydrogen-Implanted, Single-Crystal Silicon" *Physical Review B*, vol. 46, No. 4, 1992, pp. 2061-2070.

Cerofini et al., "Ultradense Gas Bubbles in Hydrogen-or-Helium-Implanted (or Co-Implanted) Silicon", *Materials Science and Engineering*, B71, 2000, pp. 196-202.

Cerofolini et al., "Hydrogen and Helium Bubbles In Silicon", *Material Science and Engineering 2000*—Reports: A Review Journal, Published By Elsevier Science S.A. 2000, pp. 1-52.

Chu et al, "Radiation Damage of 50-250 keV Hydrogen Ions in Silicon", *Ion Implantation in Semiconductors*, eds. F. Chernob et al., Plenum New York 1976, pp. 483-492.

Chu, et al. "Ion Implantation In Semiconductors", Chernow, Borders and Brice, Pirnum Press, New York and London. Radiation Damage of 50-250 keV Hydrogen Ions in Silicon, 1976, pp. 483-491.

Chu, P.K. et al., "Plasma Immersion Ion Implantation-A Fledgling Technique for Semiconductor Processing", Materials Science and Engineering Reports, *A Review Journal*, vol. R17, Nos. 6-7, Nov. 30, 1996, pp. 207-280.

Cowern, N. et al., "Transport Diffusion of Ion-Implanted B In Si: Dose, Time, and Matrix Dependence of Atomic and Electrical Profiles", *J. Appl. Phys.*, vol. 68, No. 12, 1990, pp. 6191-6198.

Cristoloveanu, S. et al, "Electrical Properties of Unibond Material", *Electrochemical Society Proceedings*, vol. 96-3, pp. 142-147.

Csepregl, L. et al. "Regrowth Behavior of Ion-Implanted Amorphous Layers on <111> Silicon", *Applied Physics Letters*, vol. 2, 1976, pp. 92-93.

Cullis, A.G. et al. "Comparative study of annealed neon-, argon-, and krypton-ion implantation damage in silicon," *J. Appl. Phys.*, 49(10), Oct. 1978, pp. 5188-5198.

Demeester, et al., "Epitaxial Lift-Off And Its Applications", *Semicond. Sci. Technol.*, vol. 8, 1993, pp. 1124-1135.

Denteneer, P. et al., Hydrogen Diffusion and Passivation of Shallow Impurities in Crystalline Silicon, *Materials Science Forum*, Trans Tech Publications, Switzerland, vols. 38-41, 1989, pp. 979-984.

Denteneer, P. et al., "Structure and Properties of Hydrogen-Impurity Pairs in Elemental Semiconductors", *Physical Review Letters*, vol. 62, No. 16, 1989, pp. 1884-1888.

Di Cioccio, L. et al., "*Silicon Carbide On Insulator Formation By The Smart Cut® Process*".—Materials Science and Engineering B46 (1997)—(pp. 349-356).

DiCioccio, et al.,"Silicon carbide on Insulator formation using the Smart Cut process", *Electronics Letters*, vol. 32, No. 12, Jun. 6, 1996, pp. 1144-1145.

Diem et al., "SOI 'SIMOX': From Bulk To Surface Micromachining, A New Age For Silicon Sensors and Actuators", *Sensors and Actuators*, vol. A 46-47, 1995, pp. 8-16.

Dirks, A. G. et al., "Columnar Microstructure In Vapor DEuropesited Thin Films ", *Thin Solid Films*, vol. 47, 1977, pp. 219-233.

Duo, et al., "Comparison Between The different Implantation orders in H+ and He+ Co-implantation", *J. Phys. D. Appl. Phys.* vol. 34, 2001, pp. 477-482.

Duo, et al., "Evolution of Hydrogen and Helium Co-Implanted Single-Crystal Silicon During Annealing", 2001 American Institute Physics—Journal of Applied Physics, vol. 90, No. 8, Oct. 15, 2001, pp. 3780-3786.

Eaglesham, White, Feldman, Moriya And Jacobson, "Equilibrium Shape of Si," *Physical Review Letters*, vol. 70, No. 11, Mar. 15, 1993, pp. 1643-1646.

EerNisse, E., "Compaction of ion-implanted fused silica", *Journal of Applied Physics*, vol. 45, No. 1, Jan. 1974.

EerNisse, E.P., "Role of Integrated Lateral Stress In Surface Deformation of He-Implanted Surfaces" *Journal of Applied Physics*, vol. 48, No. 1, Jan. 1977, pp. 9-17.

Evans, J.H., "An Interbubble Fracture Mechanism Of Blister Formation On Helium-Irradiated Metals" *Journal of Nuclear Materials*, 68, 1977, pp. 129-140.

Feijoo, et al., "*Prestressing of Bonded Wafers*"—Proceedings of the First International Symposium on: Semiconductor Wafer Bonding: Science, Technology, and Applications—Electronics and Dielectric Science and Technology Divisions—Proceedings vol. 92-7—Copyright 1992 by The Electrochemical Society, Inc., (pp. 228-238).

Feng et al., "Generalized Formula For Curvature Radius and Layer Stresses Caused By Thermal Strain In Semiconductor Multilayer Structures", *J. Appl. Phys.*, vol. 54, No. 1, 1983, pp. 83-85.

Fujitsuka et al., "A New processing Technique To Prevent Stiction Using Silicon Selective Etching For SOT-MEMS", *Sensors and Actruators*, A97-98, Apr. 2002, pp. 716-719.

Gamier, D. M., "The Fabrication Of A Partial Soi Substrate", Proceedings of the $9^{th}$ International Symposium On Silicon On Isolator Technology and Devices, vol. 99, Chap. 54, 1990, 73-78.

Gerasimenko, N., "Infrared Absorption of Silicon Irradiated by Protons", *Phys. stat.sol.* (b) 90, (1978), pp. 689-695.

Ghandi, Sorab, "VLSI Fabrication Princiles-Silicon And Gallium Arsenide", *Rensselaer Polytechnic Institute*, 1983, John Wiley & Sons publishers, pp. 135.

Goesele et al., "Semiconductor Wafer Bonding", Science and Technology, ECS Series, *Annual Review of Material Science*, vol. 28, New Jersey, 1999, pp. 215-241.

Greenwald, A.C., "Pulsed-electron-beam annealing of ion-implantation damage", *J. Appl. Phys.* 50(2), Feb. 1978, pp. 783-786.

Grovenor, C.R.M., *Microelectronic Materials*, pp. 73-75 (1989).

Guilhalmenc, C. et al, "Characterization By Atomic Force Microscopy of the SOI Layer Topography in Low Dose SIMOX Materials", *Materials Science and Engineering*, B46, 1997, pp. 29-32.

Hamaguchi et al., "Device Layer Transfer Technique using Chemi-Mechanical Polishing", *JAPANese Journal of Applied Physics*, 23,Oct. 1984, No. 10, Part 2, Tokyo, Japan, pp. L815-L817.

Hamaguchi et al., "Novel LSI/SOI Wafer Fabrication Using Device Layer Transfer Technique", *Proc. IEDM*, 1985, pp. 688-691.

Henttinen et al., "Mechanically Induced Si Layer Transfer if Hydrogen-Implanted Si-Wafers", *American Institute of Physics*, vol. 76, No. 17, 2000, pp. 2370-2372.

Huang, et al., Calculation of critical layer thickness considering thermal strain in $Si_{1-x}Ge_x/Si$ strained-layer heterostructures, J. Appl. Phys. 83 (1), Jan. 1, 1998.

Hulett, D.M. et al., "Ion Nitriding and Ion Implantation: A Comparison," *Metal Progress*, 1985, pp. 18-21.

IBM Technical Disclosure Bulletin, *Isolation by Inert Ion Implantation*, 1986, vol. 29 No. 3, pp. 1416.

IBM Technical Disclosure Bulletin, *SOI Interposer Structure XP 000627972*, Jul. 1996, vol. 39 No. 7, pp. 1-5.

Jalaguier, E. et al., "*Transfer of Thin InP Films Onto Silicon Substrate By Proton Implantation Process*".—$11^{th}$ International Conference on Indium Phosphide and Related Materials May 16-20, 1999—Davos, Switzerland. (pp. 26-27).

Jalaguier, E. et al., "Transfer of 3in GaAs Film on Silicon Substrate By Proton Implantation Process". Feb. 1998, pp. 408-409.

Jaussaud, C. et al., Microstructure of Silicon Implanted With High Dose Oxygen Ions, *Appl. Phys. Lett.*, vol. 48, No. 11, 1985, pp. 1064-1066.

Johnson, "High Fluence Deuteron Bombardment of Silicon", *Radiation Effects*, 1977, vol. 32, pp. 159-167.

Jones, K. S. et al., "A Systematic Analysis of Defects In Ion Implanted Silicon", *Applied Physics A.*, vol. 45, 1988 pp. 1-34.

Jones et al., "Enhanced elimination of implantation damage upon exceeding the solid solubility", *J. App. Phys.*, vol. 62, No. 10, 1987, pp. 4114-4117.

Kamada et al, Observation of Blistering and Amorphization on Germanium Surface After 450 keV Ar+ION Bombardment, *Radiation Effects*, vol. 28, 1976, pp. 43-48.

Klem, J.F., "Characteristics of Lift-Off Fabricated AlGaAs/InGaAs Single-Strained-Quantum Well Structures On Glass and Silicon Substrates", *Inst. Phys. Conf.* Ser. No. 96: Chapter 6, (1989), pp. 387-392.

Komarov et al., Crystallographic Nature and Formation Mechanisms of Highly Irregular Structure in Implanted and Annealed S1, Layers*Radiation Effects*, vol. 42, 1979, pp. 169-178.

Kucheyev et al., "Ion Implantation Into GaN", *Materials Science and Engineering*, vol. 33, 2001, pp. 51-107.

Laporte A. et al., "Charged Defects At The Interface Between Directly Bonded Silicon Wafers"—Applied Physics, vol. 36 (Sep. 1997) pp. 5502-5506-Part 1, No. 9A.

Li, J., "Novel Semiconductor Substrate Formed by Hydrogen Ion Implantation into Silicon," Appl. Phys. Lett., vol. 55, No. 21, Nov. 20, 1989, pp. 2223-2224.

Ligeon, E., "Hydrogen Implantation in Silicon Between 1.5 and 60 KeV", *Radiation Effects 1976*, vol. 27, pp. 129-137.

Liu et al., "Investigation of Interface in Silicon-On-Insulator By Fractual Analysis", *Applied Surface Science*, vol. 187, Feb. 28, 2002, pp. 187-191.

Liu et al. "Ion Implantation In GaN At Liquid-Nitoigen Temperature: Structural Characteristics and Amorphization", *Physical Review B of The American Physical Society*, vol. 57, No. 4, 1998, pp. 2530-2535.

Lu, X., et al., "SOI Material Technology Using Plasma Immersion ION Implantation", Proceedings 1996 IEEE International SOI Conference, Oct. 1996, pp. 48-49.

Maleville, C. et al, "Physical Phenomena involved in the Smart-Cut Process", *Electrochemical Society Proceeding*, vol. 96-3, 1996—pp. 34-46.

Manuaba, A., "Comparative Study on Fe32Ni36Crl4P12B 6 Metallic Glass and its Polycrystalline Modification bombarded by 2000 keV Helium Ions with High Fluence" *Nuclear Instruments and Methods*, (1982) pp. 409-419.

Mastrangelo, C. et al., "Suppression of Stiction in MEMS", *Proceedings of the Materials Research Society Seminar*, vol. 605, 2000, pp. 1-12.

Matsuda et al., "Large Diameter Ion Beam Implantation System," *Nuclear Instruments and Methods*, vol. B21, 1987, pp. 314-316.

Matsuo et al., "Abnormal solid solution and activation behavior in GA-implanted Si(100)", *Appl. Phys. Lett.*, vol. 51, No. 24, 1987, pp. 2037-2039.

Mishima, Y. and T. Yagishita, T. "Investigation of the bubble formation mechanism in a-Si:H films by Fourier-transform infrared microspectroscopy" *J. Appl. Phys.*, vol. 64, No. 8, Oct. 15, 1988, pp. 3972-3974.

Miyagawa, S. et al, "Helium Reemission During Implantation of Silicon Carbide", *J. Appl. Phys.*, 54 (5), May 1983, pp. 2302-2306.

Miyagawa, S., "Surface structure of silicon carbide Irradiated with helium ions with mono energy and continuous energy distributions" *J. Appl. Phys.* 53(12), Dec. 1982, pp. 8697-8705.

Monemar, B. "Shallow Impurities in Semiconductors 1998", Proceedings of the Third International Conference in Sweden, Aug. 10-12, 1988, No. 95, pp. 493-499.

Moreau, Wayne M., "Semiconductor Lithography, Principles, Practices, and Materials," Plenum Press, 1988. Table of Contents only.

Moriceau, H. et al, A New Characterization Process Used to Qualify SOI Films 1991 pp. 173-178.

Moriceau, H. et al, "A New Characterization Process Used to Qualify SOI Films", 1991 pp. 173-178.

Moriceau, H. et al. "Cleaning and Polishing As Key Steps For Smart-Cut SOI Process", Proceedings 1996 IEEE SOI Conference, Oct. 1996.

Moriceau, H. et al, "The Smart-Cut Process as a Way to Achieve Specific Film Thickness in Sal Structures", 1997, pages unknown.

Moriceau et al., (vol. 99-1) Meeting Abstract No. 405, "A New Characterization Process Used To Qualify SOI Films", The 195th Meeting of the Electrochemical Society, May 2-6, 1999, Seattle, Washington.

Motohiro et al. "*Geometrical Factors of Argon Incorporation In SiO$_2$ Films Deposited By Ion Beam Sputtering*"—Thin Solid Films, Elsevier-Sequoia S.A. Lausanne, CH, vol. 120, No. 4—Oct. 1, 1984, pp. 313-327.

Munteanu, D. et al, "Detailed Characterization of Unibond Material", 1997, pp. 395-398.

Myers, D. R., "The effects of Ion-Implantation damage on the first order Raman spectra GaPa)" *J. Appl. Phys.* 54(9), Sep. 1977.

Nethling. J. et al, "Identification of Hydrogen Platelets in ProtonBombarded GaAs", 1985, pp. 941-945.

Nichols C. S et al., "Properties of Hydrogen in Crystalline Silicon Under Compression and Tension", *Physical Review Letters*, vol. 63, No. 10, 1989, pp. 1090-1093.

Nicoletti, S. et al., "Bi-Epitaxial YBCO Grain Boundry Josephson Junctions on SrTiO3 and Sapphire Substrates", *Physics C269*, 1996, pp. 255-267.

Ono et al., "Orientation Dependence of Flaking of Ion Irradiated Aluminum Single Crystals", *Japanese Journal of Applied Physics*, vol. 25, No., 10, 1986, pp. 1475-1480.

Paszti, E, "Flaking and Wave-Like Structure on Metallic Glasses Induced by MeV-Energy Helium Ions", *Nuclear Instruments and Methods*, vol. 209/210, (1983), pp. 273-280.

Picraux, S. Thomas et al., "Ion Implantation of Surfaces," *Scientific American*, vol. 252, No. 3, pp. 102-113 1985.

Pollentier, et al., "Fabrication of High-Radiance LEDs by Epitaxial Lift-Off", *SPIE*, vol. 1361, 1990, pp. 1056-1062.

Popov, V.P. et al., "Blistering On A Silicon Surface in the Process of Sequential Hydrogen/Helium ION Co-Iplantation"—Optoeleciron-ics Instrumentation and Data Processing, No. 3, Apr. 5, 2001—pp. 90-98—2001.

Primak, W., "Impurity Effect in the Ionization Dilation of Vitreous Silica" *J. Appl. Phys.* 39(13) 1968.

Ray et al. "*Effect of Reactive-Ion Bombardment on the Properties of Silicon Nitride and Oxynitride Films Deposited By Ion-Beam Sputtering*"—Journal of Applied Physics, vol. 75, No. 12, Jun. 15, 1994—pp. 8145-8152.

Renier, M. et al., "A New Low-Energy Ion Implanter for Bombardment of Cylindrical Surfaces," *Vacuum*, vol. 35, No. 12, pp. 577-578, 1985.

Roth, J., "Blistering and Bubble Formation" *Inst. Phys. Conf.* Ser. No. 28, 1976: Chapter 7, pp. 280-293.

Sah, Chih-Tang et al., "Deactivation of the Boron Acceptor in Silicon by Hydrogen," *Appl. Phys. Lett.* 43, (2), Jul. 1983, pp. 204-206.

Saint-Jacques R. G., "La Formation des Cloques", *Nuclear Instruments and Methods*, No. 209/210, North Holland Publishing Co., 1983, pp. 333-343.

Schnell et al., "Plasma Surface Texturization for Multicrystaline Silicon Solar Cells", *IEEE*, XXVIII, Photovoltaic Conference, 2000, pp. 367-370.

Shintani, A. et al., "Temperature dependence of stresses in chemical deposited vitreous films", *J. Appl. Phys.*, vol. 51, No. 8, 1980, pp. 4197.

Sioshansi, Piran, "Ion Beam Modification of Materials for Industry," *Thin Solid Film*, vol. 118, 1984, pp. 61-71.

Snyman, H. C., "Transmission Electron Microscopy of Extended Crystal Defects in Proton Bombarded and Annealed GaAs", *Radiation Effects*, 1983, vol. 69, pp. 199-230.

Snyman, H. C. et al, "Void Formation in Annealed Proton-Bombarded GaAs", 1981, pp. 243-245.

Stein, Myers and Follstaedt, "Infrared Spectroscopy of chemically bonded hydrogen at voids and defects in silicon", *J. Appl. Phys.* 73(b6), Mar. 15, 1993, pp. 2755-2764.

Stephen, D., "Investigation of Lattice Strain in Proton-Irradiated GaP by a Modified Auleytner Technique" *Phys. stat. sol.* (a) 87, 1985, pp. 589-596.

Sunkara et al., "Bulk synthesis of silicon nanowires using a low-temperature vapor-liquid-solid solution", *Applied Physics Letters*, vol. 79, No. 10, Sep. 3, 2001, pp. 1546-1548.

Suzuki et al., "High-Speed and Low Power n+—p+ Double-Gate SOI CMOS", *IEICE Trans. Electron.*, vol. E78-C, No. 4, 1995, pp. 360-367.

Sze, S.M., VLSI Technology, 2.sup.nd Ed., 1988, pp. 9-10.

Tan, T. Y. et al., "On Oxygen Precipitation Retardation/Recovery Phenomena, Nucleation Incubation Phenomena and The Exigent-Accomodation-Volume Factor of Precipitation", Proceedings of the 5th International Symposium On Silicon Materials Science and Technology, *Semiconductor Silicon 198 Electrochem. Soc.*, New Jersey, 1986, pp. 864-873.

Terada, K. et al., "A New Dram Cell With A Transistor On A Lateral Epitaxial Silicon Layer (Tole Cell)", *IEEE Transactions on Electron Device*, vol. 37, No. 9, 1990, pp. 2052-2057.

Theodore, N. David et al., TFSOI With Improved Oxidation Resistance (To Reduce Isolation Induced Stresses and Leakage), Motorola Bulletin XP 000691920, *Technical Developments*, Nov. 1996, pp. 158-59.

Timoshenko, S. et al., "Analysis of Bi-Metal Thermostats", *J. Opt. Soc. Am.*, vol. 11, 1925, pp. 233-256.

Tong et al., "Low Temperature SI Layer Splitting", Proceedings 1997 IEEE International SOI Conference, Oct. 1997, pp. 126-127.

Tonini, Monelli, Cornl, Ottaviani, Frabboni, Canteri, Queirolo, "Hydrogen Interaction with phosphorus ion implantated silicon", *Ion Implantation Technology-94*, (1995) pp. 801-804.

Tzeng, J.C., "A Novel Self-Aligned Oxgyen (Salox) Implanted SOI Mosfet Device Structure" *Nuclear Instruments and Methods in Physics Research* B2, 1987, pp. 112-115.

U.S. Dept. of Energy, "The Fusion Connection: Contributions to Industry, Defense, and Basic Science Resulting From Scientific Advances Made in the Magnetic Fusion Energy Program", *Plasma Coating*, pp. 6-7, 1985.

Van de Walle, C. "Structural Identification of Hydrogen and Muonium Centers in Silicon First Principles Calculations of Hyperfine Parameters", *Physical Review Letters*, vol. 60, No. 26, 1988, pp. 2761-2764.

Van de Walle, C. "Theoretical Aspects of Hydrogen in Crystalline Semiconductors", *Physica B*, Holland, vol. 170, No. 15, 1991, pp. 21-32.

Van de Walle, C. "Theory of Hydrogen Diffusion and Reactions in Crystalline Silicon", *Physical Review Letters*, vol. 64, No. 6, 1980, pp. 669-672.

Van de Walle, C. "Theory of Hydrogen Diffusion and Reactions in Crystalline Silicon", *Physical Review B*, vol. 39, No. 15, 1989, pp. 10 791-10 808, plus diagrams.

Van Swijgenhoven et al. "Helium Bubble and Blister Formation for Nickel and An AMorphous Fe-Ni-Mo-B Alloy During 5 key He-+- Irradiation at Temperatures Between 200 K and 600", *Nuclear Instruments and Methods*, 209/210, 1983, pp. 461-468.

Veldkamp, W.B. et al., "Binary Optics," *Scientific American*, 1992, pp. 50-55.

Venezia et al., "The Role of Implantation Damage in the Production of Silicon-On-Insulator Films By Co-Implantation Of $He^+$ and $H^+$", Electrochemical Society Proceedings vol. 98-1, 1998—pp. 1384-1395.

Weldon et al., "Mechanism Of Silicon Exfoliation Induced by Hydrogen/Hekium Co-implantation", *Applied Physics Letters*, vol. 73, No. 25, pp. 3721-3723, Dec. 21, 1998.

Wemple, S.H., "Optical and channeling studies of ion-bombarded GaP", *J. Appl. Phys.*, vol. 45, No. 4, Apr. 1974, pp. 1578-1588.

Whitton, J. L. et al., "The Collection of Ions Implanted In Semiconductors: 1 Saturations Effects", *Radiation Effects*, Scotland, vol. 16, 1972, pp. 101-105.

Williams J. et al., "Annealing behaviour of high-dose rare-gas implantations into silicon", from Application of Ion Beams to Materials, 1975, Chap. 1, *Inst. Phys. Conf.* Ser. No. 28, 1976, pp. 30-36.

Wittmaack et al., "High Fluence Retention of Noble Gases Implanted in Silicon" *Radiation Effects*, vol. 39, 1978, pp. 81-95.

Wolf, Stanley Ph.D., Silicon Processing for the VLSI Era (vol. 2), Lattice Press, 1990, pp. 66-79.

Wong et al., "Integration of GaN Thin Films With Dissimilar Substrate Materials by Pd-In Metal Bonding and Laser Lift-Off", Journal of Electronic Materials, vol. 28, No. 12, 1999, pp. 1409-1413.

Yamaguchi H. et al., "Intelligent Power IC With Partial Soi Structure", *Jpn. J. Appl. Phys.*, vol. 34, 1995, pp. 864-868.

Yee et al., "Polysilicon Surface-Modification Technique to Reduce Sticking of Microstructures", *Sensors and Actuators* A 52, 1996, pp. 145-150.

Yun et al., "Fractional Implantation Area Effects on Patterned Ion-Cut Silicon Layer Transfer", Dept. of Electrical Eng, and Computer Sciences, University of California, Berkley, CA, 94720, USA, 1999 IEEE International SOI Conference, Oct. 1999, pp. 129-130.

Yun et al., "Thermal and Mechanical Separations of Silicon Layers From Hydrogen Pattern-Implanted Wafers", *Journal of Electronic Materials*, vol. 36, No. 8, Apr. 24, 2001, pp. 960-964.

Yun, H. et al., "Transfer of Patterned Ion-Cut Silicon Layers", *Applied Physics Letters*, vol. 73, No. 19, 1998, pp. 2772-2774.

International Search Report for International Application No. PCT/FR1998/002904, dated Apr. 16, 1999, 2 pages.

International Search Report for International Application No. PCT/FR2002/001266, dated Feb. 7, 2003, 4 pages.

International Search Report for International Application No. PCT/FR2002/001268, dated Feb. 6, 2003, 4 pages.

International Search Report for International Application No. PCT/FR2002/003422, dated Jan. 22, 2003, 3 pages.

International Search Report for International Application No. PCT/FR2003/003256, dated Mar. 19, 2004, 6 pages.

International Search Report for International Application No. PCT/FR2003/003867, dated May 28, 2004, 3 pages.

International Search Report for International Application No. PCT/FR2003/003622, dated Jun. 3, 2004, 3 pages.

International Search Report for International Application No. PCT/FR2004/001858, dated Dec. 28, 2004, 3 pages.

International Search Report for International Application No. PCT/FR2004/002779, dated Apr. 5, 2005, 3 pages.

International Search Report for International Application No. PCT/FR2004/002781, dated Apr. 5, 2005, 3 pages.

International Search Report for International Application No. PCT/FR2004/001565, dated Jul. 6, 2005, 3 pages.

International Search Report for International Application No. PCT/FR2006/001945, dated Jan. 8, 2007, 3 pages.

International Search Report for International Application No. PCT/FR2006/002184, dated Jan. 24, 2007, 2 pages.

International Search Report for International Application No. PCT/FR2007/000534, dated Nov. 22, 2007, 3 pages.

International Search Report for International Application No. PCT/FR2007/002100, dated Feb. 4, 2009, 3 pages.

International Search Report for International Application No. PCT/FR2008/001427, dated Jul. 1, 2009, 3 pages.

Office Action from U.S. Appl. No. 12/063,808, dated Apr. 6, 2010, 9 pages.

Office Action from U.S. Appl. No. 12/063,808, dated Sep. 22, 2010, 9 pages.

Office Action from U.S. Appl. No. 10/534,199, dated Feb. 19, 2009, 8 pages.

Office Action from U.S. Appl. No. 10/534,199, dated Aug. 5, 2009, 10 pages.

Office Action from U.S. Appl. No. 10/534,199, dated Jan. 20, 2010, 8 pages.

Office Action from U.S. Appl. No. 10/534,199, dated Aug. 4, 2010, 8 pages.

Office Action from U.S. Appl. No. 10/577,175, dated Jun. 22, 2009, 13 pages.

Office Action from U.S. Appl. No. 10/577,175, dated Apr. 13, 2010, 14 pages.

Office Action from U.S. Appl. No. 11/480,250, dated May 22, 2008, 10 pages.

Office Action from U.S. Appl. No. 11/480,250, dated Dec. 3, 2008, 16 pages.

Office Action from U.S. Appl. No. 11/480,250, dated Jan. 26, 2010, 14 pages.

Office Action from U.S. Appl. No. 11/480,250, dated Aug. 3, 2010, 15 pages.

Office Action from U.S. Appl. No. 12/088,047, dated Sep. 25, 2009, 9 pages.

Office Action from U.S. Appl. No. 12/088,047, dated Mar. 10, 2010, 9 pages.

Office Action from U.S. Appl. No. 10/565,621, dated Jan. 7, 2010, 8 pages.

Office Action from U.S. Appl. No. 10/565,621, dated Nov. 23, 2010, 11 pages.

Office Action from U.S. Appl. No. 12/628,772, dated Oct. 7, 2010, 12 pages.
Notice of Allowance from U.S. Appl. No. 12/336,229, dated Sep. 29, 2010, 7 pages.
Notice of Allowance from U.S. Appl. No. 12/336,229, dated Jan. 10, 2011, 4 pages.
Office Action from U.S. Appl. No. 12/682,522, dated Mar. 29, 2011, 10 pages.
Notice of Allowance from U.S. Appl. No. 10/468,223, dated Dec. 28, 2009, 4 pages.
Office Action from U.S. Appl. No. 10/474,984, dated Mar. 11, 2010, 13 pages.
Notice of Allowance from U.S. Appl. No. 10/474,984, dated Oct. 28, 2010, 6 pages.
Office Action from U.S. Appl. No. 10/540,303, dated Dec. 18, 2007, 6 pages.
Notice of Allowance from U.S. Appl. No. 10/540,303, dated Oct. 7, 2008, 9 pages.
Office Action from U.S. Appl. No. 11/327,906, dated Oct. 1, 2007, 5 pages.
Office Action from U.S. Appl. No. 11/327,906, dated Feb. 11, 2008, 5 pages.
Notice of Allowance from U.S. Appl. No. 11/327,906, dated Sep. 15, 2008, 6 pages.
Office Action from U.S. Appl. No. 10/975,826, dated May 5, 2006, 14 pages.
Office Action from U.S. Appl. No. 10/975,826, dated Nov. 28, 2006, 20 pages.
Office Action from U.S. Appl. No. 10/975,826, dated Jul. 17, 2007, 21 pages.
Office Action from U.S. Appl. No. 10/975,826, dated Apr. 1, 2008, 27 pages.
Office Action from U.S. Appl. No. 10/975,826, dated Dec. 10, 2008, 28 pages.
Office Action from U.S. Appl. No. 10/975,826, dated Sep. 2, 2009, 24 pages.
Notice of Allowance from U.S. Appl. No. 10/975,826, dated Apr. 28, 2010, 8 pages.
Office Action from U.S. Appl. No. 10/492,343, dated Oct. 17, 2005, 6 pages.
Office Action from U.S. Appl. No. 10/492,343, dated Jun. 6, 2006, 13 pages.
Office Action from U.S. Appl. No. 10/492,343, dated Nov. 14, 2006, 13 pages.
Office Action from U.S. Appl. No. 10/492,343, dated May 29, 2007, 15 pages.
Office Action from U.S. Appl. No. 10/492,343, dated Feb. 7, 2008, 18 pages.
Office Action from U.S. Appl. No. 10/492,343, dated Aug. 18, 2008, 12 pages.
Office Action from U.S. Appl. No. 10/492,343, dated Dec. 22, 2008, 9 pages.
Notice of Allowance from U.S. Appl. No. 10/492,343, dated Jun. 26, 2009, 6 pages.
Office Action from U.S. Appl. No. 11/747,733, dated Mar. 16, 2009, 9 pages.
Office Action from U.S. Appl. No. 11/747,733, dated Mar. 23, 2010, 5 pages.
Notice of Allowance from U.S. Appl. No. 11/747,733, dated Sep. 29, 2010, 8 pages.
Notice of Allowance from U.S. Appl. No. 12/293,193, dated Oct. 8, 2009, 10 pages.
Expert Report of Marcus Weldon, Ph.D. dated Nov. 1, 2000.
Expert Report of Jean-Pierre Colinge dated Nov. 1, 2000.
Expert Report of Chris Van de Walle, Ph.D. dated Nov. 1, 2000.
Memorandum in Support of Defendant Silicon Genesis Corporation's Motion for Summary Judgment of Invalidity for Lack of Enablement dated Mar. 19, 2001.
Memorandum of Points and Authorities In Support of Soitec's Motion for Summary Judgment on Sigen's Enablement Invalidity Claim (Redacted) dated Mar. 27, 2001.
Soitec's Memorandum of Points and Authorities In Opposition to Silicon Genesis Corporation's Motion for Summary Judgment of Invalidity for Lack of Enablement dated Apr. 11, 2001.
Memorandum in Support of Defendant Silicon Genesis Corporation's Opposition to Soitec's Motion for Summary Judgment on SiGen's Defense of Enablement dated Apr. 20, 2001.
Reply Memorandum in Support of Defendant Silicon Genesis Corporation's Motion for Summary Judgment of Invalidity for Lack of Enablement dated Apr. 30, 2001.
Expert Report of Marcus Weldon, Ph.D. dated Aug. 24, 2001.
Report of Jean-Pierre Colinge in Response to SiGen Enablement and Indefiniteness Expert Reports of Aug. 24, 2001.
Expert Report of Chris Van de Walle, Ph.D. dated Aug. 24, 2001.
Memorandum and Order re: Summary Judgment [denied] dated Feb. 5, 2002.
Plaintiff's Memorandum in Support of Their Motion for Judgment As a Matter of Law and a New Trial dated May 10, 2002.
Silicon Genesis Corporation's Opposition to Plaintiff's Motion for Judgment as a Matter of Law and a New Trial dated Jun. 17, 2002.
Memorandum of Law in Support of Plaintiff's Motion for Judgment on SiGen's Indefiniteness Defense dated Jun. 20, 2002.
Plaintiff's Reply Memorandum in Support of Their Motion for Judgment as a Matter of Law and a New Trial dated Jul. 18, 2002.
Defendant Silicon Genesis Corporation's Opposition to Soitec's Motion for Judgment Re Indefiniteness and Cross-Motion for Judgment of Indefiniteness dated Jul. 19, 2002.
Plaintiff's Reply in Support of their Motion for Judgment on SiGen's Indefiniteness Defense dated Jul. 25, 2002.
Memorandum and Order re: Post-Trial Motions dated Aug. 23, 2002.
Judgment dated Oct. 21, 2002.
Brief of Plaintiffs-Appellants Soitec, S.A. and Commissariat a L'Energie Atomique dated Jan. 28, 2003.
Brief for Defendant-Cross Appellant Silicon Genesis Corporation dated Mar. 22, 2003.
Reply Brief of Plaintiffs-Appellants Soitec, S.A. and Commissariat a L'Energie Atomique dated May 5, 2003.
Reply Brief for Defendant-Cross Appellant Silicon Genesis Corporation dated May 19, 2003.
Plaintiff/Appellants Supplemental Authority Letter [dated Nov. 17, 2003].
Defendant—Cross Appellant's Response To Appellants' Submission Of *CFMT, Inc.* v. *Yieldup Intl*, [dated Nov. 24, 2003].
Decision from the United States Court of Appeals for the Federal Circuit dated Nov. 26, 2003.
Combined Petition for Panel Rehearing and for Rehearing En Banc by Plaintiffs—Appellant's Soitec, S.A. and Commissariat A L'Energie Atomique, dated Dec. 10, 2003.
Order [dated Jan. 7, 2004 denying Appellants' petition for panel rehearing and Appellant's petition for rehearing en banc].
Judgment Mandate [dated Jan. 14, 2004].
Motion to Bifurcate the Issues of Willfulness and Damages for Purposes of Discovery and Trial and proposed Form of Order—filed by MEMC Electronic Materials Inc.. (Rogowski, Patricia) (Entered: Oct. 20, 2009). Correcting Entry: Docket clerk deleted D.I. 78 (opening brief) due to document being filed improperly. Counsel is advised to re-file document using the Opening Brief event code rather than the combined opening and answering brief event code. (lid) (Entered: Oct. 21, 2009).
Opening Brief in Support re 77 Motion to Bifurcate the Issues of Willfulness and Damages for Purposes of Discovery and Trial and proposed Form of Order filed by MEMC Electronic Materials Inc.. Answering Brief/Response due date per Local Rules is Nov. 9, 2009. (Attachments: # 1 Exhibit A, # 2 Exhibit B, # 3 Exhibit C)(Rogowski, Patricia) (Entered: Oct. 21, 2009).
Cross Motion to Bifurcate all Collateral Issues—filed by SOITEC Silicon On Insulator Technologies SA, SOITEC U.S.A., Inc., Commissariat a LEnergie Atomique. (Attachments: # 1 Text of Proposed Order, # 2 Certificate of Service)(Kraft, Denise) (Entered: Nov. 9, 2009).
Answering Brief in Opposition re 85 Cross Motion to Bifurcate all Collateral Issues, 77 Motion to Bifurcate the Issues of Willfulness and Damages for Purposes of Discovery and Trial and proposed Form of Order filed by SOITEC Silicon On Insulator Technologies SA, Commissariat a LEnergie Atomique.Reply Brief due date per Local Rules is Nov. 20, 2009. (Attachments: # 1 Exhibit, # 2 Exhibit, # 3 Exhibit, # 4 Exhibit, # 5 Exhibit, # 6 Exhibit, # 7 Exhibit, # 8 Exhibit, # 9 Exhibit, # 10 Exhibit, # 11 Exhibit, # 12 Declaration, # 13 Certificate of Service)(Kraft, Denise) (Entered: Nov. 9, 2009).
Reply Brief re 77 Motion to Bifurcate the Issues of Willfulness and Damages for Purposes of Discovery and Trial and proposed Form of Order filed by MEMC Electronic Materials Inc.. (Attachments: # 1 Exhibit 1, # 2 Exhibit 2, # 3 Exhibit 3)(Rogowski, Patricia) (Entered: Nov. 17, 2009).
Answering Brief in Opposition re 85 Cross Motion to Bifurcate all Collateral Issues filed by MEMC Electronic Materials Inc..Reply Brief due date per Local Rules is Dec. 3, 2009. (Rogowski, Patricia) (Entered: Nov. 19, 2009).
Reply Brief re 85 Cross Motion to Bifurcate all Collateral Issues filed by Commissariat a LEnergie Atomique, SOITEC Silicon On Insulator Technologies SA, Soitec U.S.A., Inc.. (Attachments: # 1 Exhibit Declaration of Marcus T. Hall in Support of Plaintiffs' Reply Re: Cross-Motion to Bifurcate all Collateral Issues)(Kraft, Denise) (Entered: Dec. 3, 2009).
Notice of Service of S.O.I.TEC Silicon On Insulator Technologies, S.A. and Commissariat a L'Energie Atomique's Production of Three Boxes of Wafer Samples by Commissariat a LEnergie Atomique, SOITEC Silicon on Insulator Technologies SA, SOITEC U.S.A., Inc.. (Attachments: # 1 Certificate of Service)(Kraft, Denise) (Entered: Dec. 8, 2009). Set Hearings: Discovery Conference set for Dec. 21, 2009 04:00 PM in Courtroom 6B before Judge Sue L. Robinson. (nmf) (Entered: Dec. 9, 2009).
Motion for Leave to File Stipulated Motion for Leave to File a Sur-Reply Brief in Support of MEMC's Motion to Bifurcate—filed by MEMC Electronic Materials Inc.. (Attachments: # 1 Exhibit 1)(Rogowski, Patricia) (Entered: Dec. 14, 2009).
Sur-Reply Brief re 77 Motion to Bifurcate the Issues of Willfulness and Damages for Purposes of Discovery and Trial and proposed Form of Order MEMC's Sur-Reply Brief in Support of Its Motion to Bifurcate the Issues of Willfulness and Damages for Purposes of Discovery and Trial filed by MEMC Electronic Materials Inc.. (Rogowski, Patricia) (Entered: Dec. 16, 2009).
Motion for Discovery Motion for the Admission of the Expert Testimony of John T. Goolkasian Relating to the Certificate of Correction for U.S. Patent No. 7,067,396—filed by MEMC Electronic Materials Inc.. (Rogowski, Patricia) (Entered: May 7, 2010).
Opening Brief in Support re 141 Motion for Discovery Motion for the Admission of the Expert Testimony of John T. Goolkasian Relating to the Certificate of Correction for U.S. Patent No. 7,067,396 filed by MEMC Electronic Materials Inc..Answering Brief/Response due date per Local Rules is May 24, 2010. (Attachments: # 1 Exhibit 1, # 2 Exhibit 2, # 3 Exhibit 3, # 4 Exhibit 4, # 5 Exhibit 5, # 6 Exhibit 6, # 7 Exhibit 7, # 8 Exhibit 8, # 9 Exhibit 9, # 10 Exhibit 10, # 11 Exhibit 11, # 12 Exhibit 12, # 13 Exhibit 13, # 14 Exhibit 14, # 15 Exhibit 15)(Rogowski, Patricia) (Entered: May 7, 2010).
Answering Brief in Opposition re 141 Motion for Discovery Motion for the Admission of the Expert Testimony of John T. Goolkasian Relating to the Certificate of Correction for U.S. Patent No. 7,067,396 Plaintiff's Answering Brief in Opposition to Defendant's Motion For the Admission of Expert Testimony of John T. Goolkasian filed by SOITEC Silicon On Insulator Technologies SA.Reply Brief due date per Local Rules is Jun. 4, 2010. (Attachments: # 1 Certificate of Service)(Kraft, Denise) (Entered: May 24, 2010).
Declaration re 145 Answering Brief in Opposition,, Declaration of Marcus T. Hall in Support of Plantiff's Answering Brief in Opposition to Defendant's Motion For the Admission of Expert Testimony of John T. Goolkasian by SOITEC Silicon On Insulator Technologies SA, (Attachments # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12 Exhibit L, # 13 Exhibit M, # 14 Exhibit N, # 15 Certificate of Service)(Kraft, Denise) (Entered: May 24, 2010).
Reply Brief in Support of 141 Motion for Discovery Motion for the Admission of the Expert Testimony of John T. Goolkasian Relating to the Certificate of Correction for U.S. Patent No. 7,067,396 filed by MEMC Electronic Materials Inc.. (Attachments: # 1 Exhibit 1, # 2 Exhibit 2, # 3 Exhibit 3, # 4 Exhibit 4, # 5 Exhibit 5, # 6 Exhibit 6)(Rogowski, Patricia) Modified on Jun. 4, 2010 (lid). (Entered: Jun. 4, 2010).
Statement re 148 Stipulation Joint Claim Construction Statement by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Claim Construction Chart by Commissariat a LEnergie Atomique, SOITEC Silicon On Insulator Technologies SA, SOITEC U.S.A., Inc.. (Attachments: # 1 Certificate of Service)(Kraft, Denise) (Entered: Jun. 14, 2010).
Sur-Reply Brief re 141 Motion for Discovery Motion for the Admission of the Expert Testimony of John T. Goolkasian Relating to the Certificate of Correction for U.S. Patent No. 7,067,396 Surreply by Plaintiffs to Motion by Defendant For The Admission of Expert Testimony of John T. Goolkasian filed by SOITEC Silicon on Insulator Technologies SA. (Attachments: # 1 Certificate of Service)(Kraft, Denise) (Entered: Jun. 15, 2010).
Declaration re 157 Sur-Reply Brief, Declaration of Marcus T. Hall in Support of Surreply by Plaintiffs to Motion by Defendant For The Admission of Expert Testimony of John T. Goolkasian by SOITEC Silicon on Insulator Technologies SA. (Attachments: # 1 Exhibit A, # 2 Exhibit B, # 3 Exhibit C, # 4 Exhibit D, # 5 Certificate of Service)(Kraft, Denise) (Entered: Jun. 15, 2010).
Claim Construction Opening Brief filed by MEMC Electronic Materials Inc.. (Attachments: # 1 Appendix DA0001-DA0006, # 2 Appendix DA0007-DA0032, # 3 Appendix DA0033-DA0072, # 4 Appendix DA0073-DA0112, # 5 Appendix DA0113-DA0152, # 6 Appendix DA0153-DA0192, # 7 Appendix DA0193-DA0232, # 8 Appendix DA0233-DA0272, # 9 Appendix DA0273-DA0312, # 10 Appendix DA0313-DA0352, # 11 Appendix DA0353-DA0392, # 12 Appendix DA0393-DA0432, # 13 Appendix DA0433-DA0472, # 14 Appendix DA0473-DA0512, # 15 Appendix DA0513-DA0521, # 16 Appendix DA0522-DA0545, # 17 Appendix Sealed—DA0546-DA0551, # 18 Appendix DA0552-DA0563, # 19 Appendix Sealed—DA0564-DA0566, # 20 Appendix DA0567-DA0573, # 21 Appendix Sealed—DA0574-DA0599, # 22 Appendix DA0600-DA0604, # 23 Appendix DA0605-DA0609, # 24 Appendix DA0610-DA0625, # 25 Appendix DA0626-0634, # 26 Appendix DA0635, # 27 Appendix DA0636-DA0652, # 28 Appendix Sealed—DA0653-DA0657, # 29 Appendix DA0658-DA0667, # 30 Appendix DA0668-DA0670, # 31 Appendix DA0671-DA0678, # 32 Appendix DA0679-DA0687, # 33 Appendix DA0688-DA0696, # 34 Appendix Sealed—DA0697-DA0705, # 35 Appendix Sealed—DA0706-DA0711, # 36 Appendix Sealed—DA0712-DA0714, # 37 Appendix DA0715-DA0717, # 38 Appendix DA0718-DA0719, # 39 Appendix DA0720-DA0722, # 40 Appendix DA0723-DA0732, # 41 Appendix DA0733-DA0740, # 42 Appendix DA0741-DA0749, # 43 Appendix DA0750-DA0769, # 44 Appendix DA0770-DA0781)(Rogowski, Patricia) (Entered: Jun. 25, 2010).
Claim Construction Opening Brief Plaintiffs S.O.I.TEC Silicon on Insulator Technologies, S.A. and Commissariat a L'Energie Atomique's Opening Claim Construction Brief filed by Commissariat a LEnergie Atomique, SOITEC Silicon On Insulator Technologies SA. (Attachments: # 1 Certificate of Service)(Kraft, Denise) (Entered: Jun. 25, 2010).
Declaration re 168 Claim Construction Opening Brief, Declaration of Marcus T. Hall in Support of Plantiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Attachments: # 1 Certificate of Service)(Kraft, Denise) (Entered: Jun. 25, 2010).
Appendix re 167 Claim Construction Opening Brief,,,,,, by MEMC Electronic Materials Inc.. (Attachments: # 1 Appendix DA-0001-DA-0006, # 2 Appendix DA-0007-DA-0032, # 3 Appendix DA-0033-DA-0072, # 4 Appendix DA-0073-DA-0112, # 5 Appendix DA-0113-DA-0152, # 6 Appendix DA-0153-DA-0192, # 7 Appendix DA-0193-DA-0232, # 8 Appendix DA-0233-DA-0272, # 9 Appendix DA-0273-DA-0312, # 10 Appendix DA-0313-DA-0352, # 11 Appendix DA-0353-DA-0392, # 12 Appendix DA-0393-DA-0432, # 13

Appendix DA-0433-DA-0472, # 14 Appendix DA-0473-DA-0512, # 15 Appendix DA-0513-DA-0521)(Rogowski, Patricia) (Entered: Jun. 28, 2010).
Redacted Version of 175 Appendix by MEMC Electronic Materials Inc.. (Attachments: # 1 Appendix DA0522-DA0545, # 2 Appendix DA0546-DA0551, # 3 Appendix DA0552-DA0563, # 4 Appendix DA0564-DA0566, # 5 Appendix DA0567-DA0573, # 6 Appendix DA0574-DA0599, # 7 Appendix DA0600-DA0604, # 8 Appendix DA0605-DA0609, # 9 Appendix DA0610-DA0625, # 10 Appendix DA0626-DA0634, # 11 Appendix DA0635, # 12 Appendix DA0636-DA0652, # 13 Appendix DA0653-DA0657, # 14 Appendix DA0658-DA0667, # 15 Appendix DA0668-DA0670, # 16 Appendix DA0671-DA0678, # 17 Appendix DA0679-DA0687, # 18 Appendix DA0688-DA0696, # 19 Appendix DA0697-DA0705, # 20 Appendix DA0706-DA-0711, # 21 Appendix DA0712-DA0714, # 22 Appendix DA0715-DA0717, # 23 Appendix DA0718-DA0719, # 24 Appendix DA0720-DA0722, # 25 Appendix DA0723-DA0732, # 26 Appendix DA0733-DA0740, # 27 Appendix DA0741-DA0749, # 28 Appendix DA0750-DA0769, # 29 Appendix DA0770-DA0781, # 30 Certificate of Service)(Rogowski, Patricia) (Entered: Jun. 28, 2010).
Notice of filing the following document(s) in paper format: Joint Appendix of Exhibits to Opening and Answering Claim Construction Briefs (1) vol. I-JA0001 to JA0533. Appendix vol. I. re 173 Notice of Filing Paper Documents(Oversized Document, Item on File in the clerks Office). (lid) (Entered: Jun. 28, 2010).
Notice of filing the following document(s) in paper format: Joint Appendix of Exhibits to Opening and Answering Claim Construction Briefs (2) vol. II-JA0534 to JA0930. Appendix vol. II. re 173 Notice of Filing Paper Documents(Oversized Document, Item on File in the Clerks Office). (lid) (Entered: Jun. 28, 2010).
Notice of filing the following document(s) in paper format: Joint Appendix of Exhibits to Opening and Answering Claim Construction Briefs (3) vol. III-JA0931 to JA1502. Appendix vol. III. re 173 Notice of Filing Paper Documents(Oversized Document, Item on File in the Clerks Office) (lid) (Entered: Jun. 28, 2010) (2 parts).
Notice of filing the following document(s) in paper format: Joint Appendix of Exhibits to Opening and Answering Claim Construction Briefs (4) vol. IV-JA1503 to JA1510. Appendix vol. IV. re 173 Notice of Filing Paper Documents, (Oversized Document, Item on File in the Clerks Office) (lid) (Entered: Jun. 28, 2010).
Notice of filing the following document(s) in paper format: Joint Appendix of Exhibits to Opening and Answering Claim Construction Briefs (5) vol. V-JA1511 to JA2089 (2 parts).
vol. VI-JA2090 to JA2557. Original document(s) to be filed with the Clerk's Office. Notice filed by Denise Seastone Kraft on behalf of Commissariat a LEnergie Atomique, SOITEC Silicon on Insulator Technologies SA (Attachments: # 1 Certificate of Service)(Kraft, Denise) (Entered: Jun. 25, 2010).
Motion in Limine SOITEC/CEA Parties' Motion to Exclude The Expert Report of Dr. Pascal Bellon and Any Related Testimony—filed by Commissariat a LEnergie Atomique, SOITEC Silicon on Insulator Technologies SA. (Attachments: # 1 Text of Proposed Order, # 2 Certificate of Service)(Kraft, Denise) (Entered: Jul. 2, 2010).
Motion for Partial Summary Judgment of Invalidity of the Asserted Aspar Patent Claims—filed by MEMC Electronic Materials Inc.. (Attachments: # 1 Text of Proposed Order, # 2 Certificate of Service)(Rogowski, Patricia) (Entered: Jul. 2, 2010).
Opening Brief in Support re 186 Motion in Limine SOITEC/CEA Parties' Motion to Exclude The Expert Report of Dr. Pascal Bellon and Any Related Testimony filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Opening Brief in Support re 187 Motion for Partial Summary Judgment of Invalidity of the Asserted Aspar Patent Claims filed by MEMC Electronic Materials Inc..Answering Brief/Response due date per Local Rules is Jul. 19, 2010. (Rogowski, Patricia) (Entered: Jul. 2, 2010).
Appendix re 186 Motion in Limine SOITEC/CEA Parties' Motion to Exclude The Expert Report of Dr. Pascal Bellon and Any Related Testimony Plaintiffs' Omnibus Appendix to Daubert Motion and Motions For Partial Summary Judgment Filed on Jul. 2, 2010 by Commissariat a LEnergie Atomique, SOITEC Silicon on Insulator Technologies SA. (Attachments: # 1 Appendix vol. II of XIX, # 2 Appendix vol. III of XIX, # 3 Appendix vol. IV of XIX, # 4 Appendix vol. V of XIX, # 5 Appendix vol. VII of XIX, # 6 Appendix vol. IX of XIX, # 7 Appendix vol. XI of XIX, # 8 Appendix vol. XII of XIX, # 9 Appendix vol. XIII of XIX, # 10 Appendix vol. XIV of XIX, # 11 Appendix vol. XV of XIX, # 12 Appendix vol. XVI of XIX, # 13 Appendix vol. XVIII of XIX, # 14 Certificate of Service)(Kraft, Denise) (Entered: Jul. 2, 2010).
Motion for Summary Judgment of Non-Infringement—filed by MEMC Electronic Materials Inc.. (Attachments: # 1 Text of Proposed Order, # 2 Certificate of Service)(Rogowski, Patricia) (Entered: Jul. 2, 2010).
Motion for Partial Summary Judgment SOITEC/CEA Parties Motion For Partial Summary Judgment That The Patents in Suit Satisfy The Written Description Requirement—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 202 Motion for Partial Summary Judgment SOITEC/CEA Parties Motion For Partial Summary Judgment That The Patents in Suit Satisfy The Written Description Requirement filed by Commissariat a LEnergie Atomique, SOITEC Silicon on Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment Plaintiffs' Motion for Partial Summary Judgment That the Certificate of Correction For the '396 Patent is Valid—filed by Commissariat a LEnergie Atomique, SOITEC Silicon On Insulator Technologies SA. (Attachments: # 1 Certificate of Service)(Kraft, Denise) (Entered: Jul. 2, 2010).
Opening Brief in Support re 204 Motion for Partial Summary Judgment Plaintiffs' Motion For Partial Summary Judgment That The Certificate of Correction For the '396 Patent is Valid filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC/CEA Parties' Motion For Partial Summary Judgment That The Aspar Patents Are Not Invalid For Inequitable Conduct—filed by Commissariat a LEnergie Atomique, SOITEC Silicon On Insulator Technologies SA, SOITEC U.S.A., Inc.. (Attachments: # 1 Text of Proposed Order, # 2 Certificate of Service)(Kraft, Denise) (Entered: Jul. 2, 2010).
Opening Brief in Support re 206 Motion for Partial Summary Judgment SOITEC/CEA Parties' Motion For Partial Summary Judgment That The Aspar Patents Are Not Invalid For Inequitable Conduct filed by Commissariat a LEnergie Atomique, SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment Plaintiffs' Motion For Partial Summary Judgment That The Bruel Patent Does Not Anticipate the Aspar Patents—filed by Commissariat a LEnergie Atomique, SOITEC Silicon On Insulator Technologies SA. (Attachments: # 1 Text of Proposed Order, # 2 Certificate of Service)(Kraft, Denise) (Entered: Jul. 2, 2010).
Opening Brief in Support re 208 Motion for Partial Summary Judgment Plaintiffs' Motion or Partial Summary Judgment That The Bruel Patent Does Not Anticipate The Aspar Patents filed by Commissariat a LEnergie Atomique, SOITEC Silicon On Insulator Technologies SA.Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC's Motion For Partial Summary Judgment of Invalidity of United States Patent No. 5,834,812 For Lack of Enablement—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).

Opening Brief in Support re 210 Motion for Partial Summary Judgment SOITEC's Motion for Partial Summary Judgment of Invalidity of United States Patent No. 5,834,812 For Lack of Enablement filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Motion for Partial Summary Judgment SOITEC's Motion for Partial Summary Judgment For Invalidity of Asserted Claims of United States Patent No. 5,834,812 in View of Prior Art—filed by SOITEC Silicon on Insulator Technologies SA, SOITEC U.S.A., Inc.. (Attachments: # 1 Text of Proposed Order, # 2 Certificate of Service)(Kraft, Denise) (Entered: Jul. 2, 2010).
Motion for Partial Summary Judgment That the Best Mode Requirement is Satisfied for the Claims of the '009 and '396 Patents—filed by Commissariat a LEnergie Atomique, SOITEC Silicon On Insulator Technologies SA. (Attachments: # 1 Text of Proposed Order, # 2 Certificate of Service)(Reed, John) (Entered: Jul. 2, 2010).
Opening Brief in Support re 212 Motion for Partial Summary Judgment SOITEC's Motion For Partial Summary Judgment For Invalidity of Asserted Claims of United States Patent No. 5,834,812 in View of Prior Art filed by SOITEC Silicon On Insulator Technologies SA, SOITEC U.S.A., Inc..Answering Brief/Response due date per Local Rules is Jul. 19, 2010. (Attachments: # 1 Certificate of Service)(Kraft, Denise) (Entered: Jul. 2, 2010).
Opening Brief in Support re 213 Motion for Partial Summary Judgment That the Best Mode Requirement is Satisfied for the Claims of the '009 and '396 Patents filed by SOITEC Silicon On Insulator Technologies SA.Answering Brief/Response due date per Local Rules is Jul. 19, 2010. (Attachments: # 1 Certificate of Service)(Reed, John) (Entered: Jul. 2, 2010).
Redacted Version of 200 Opening Brief in Support, by MEMC Electronic Materials Inc.. (Attachments: # 1 Certificate of Service)(Rogowski, Patricia) (Entered: Jul. 7, 2010).
Redacted Version of 201 Appendix by MEMC Electronic Materials Inc.. (Attachments: # 1 Appendix MA0001-MA0004, # 2 Appendix MA0005-MA0010, # 3 Appendix MA0011-MA0016, # 4 Appendix MA0017-MA0020, # 5 Appendix MA0021-MA0029, # 6 Appendix MA0030-MA0045, # 7 Appendix MA0046-MA0052, # 8 Appendix MA0053-MA0078, # 9 Appendix MA0079-MA0092, # 10 Appendix MA0093-MA0129, # 11 Appendix MA0130-MA0148, # 12 Appendix MA0149-MA0160, # 13 Appendix MA0161-MA0163, # 14 Appendix MA0164-MA0167, # 15 Appendix MA0168-MA0172, # 16 Appendix MA0173-MA0183, # 17 Appendix MA0184-MA0196, # 18 Appendix MA0197-MA0207, # 19 Appendix MA0208-MA0241, # 20 Appendix MA0242-MA0245, # 21 Appendix MA0246-MA0249, # 22 Appendix MA0250-MA0252, # 23 Appendix MA0253-MA0265, # 24 Appendix MA0266-MA0281, # 25 Appendix MA0282-MA0312, # 26 Appendix MA0313-MA0359, # 27 Appendix MA0360-MA0365, # 28 Appendix MA0366, # 29 Appendix MA0367-MA0400, # 30 Appendix MA0401-MA0474, # 31 Appendix MA0475-MA0483, # 32 Certificate)(Rogowski, Patricia) (Entered: Jul. 7, 2010).
Redacted Version of 190 Appendix by MEMC Electronic Materials Inc.. (Attachments: # 1 Appendix MA0484-MA0489, # 2 Appendix MA0490-MA0515, # 3 Appendix MA0516-MA0534, # 4 Appendix MA0535-MA0541, # 5 Appendix MA0542-MA0550, # 6 Appendix MA0551-MA0561, # 7 Appendix MA0562-MA0564, # 8 Appendix MA0565-MA0569, # 9 Appendix MA0570-MA0574, # 10 Appendix MA0575-MA0576, # 11 Appendix MA0577-MA0601, # 12 Appendix MA0602-MA0603, # 13 Appendix MA0604-MA0605, # 14 Appendix MA0606-MA0609, # 15 Appendix MA0610-MA0612, # 16 Appendix MA0613-MA0625, # 17 Appendix MA0626-MA0628, # 18 Appendix MA0629-MA0630, # 19 Appendix MA0631-MA0653, # 20 Appendix MA0654-MA0685, # 21 Appendix MA0686-MA0701, # 22 Appendix MA0702-MA0732, # 23 Appendix MA0733-MA0742, # 24 Appendix MA0743-MA0750, # 25 Appendix MA0751-MA0766, # 26 Appendix MA0767-MA0772, # 27 Appendix MA0773-MA0780, # 28 Appendix MA0781-MA0807, # 29 Appendix MA0808-MA0824, # 30 Appendix MA0825-MA0831.1, # 31 Appendix MA0832-MA0838, # 32 Appendix MA08390-MA0844, # 33 Appendix MA0845-MA0858, # 34 Appendix MA0859-MA0868, # 35 Appendix MA0869-MA0877, # 36 Appendix MA0878-MA0884, # 37 Appendix MA0885-MA0887, # 38 Appendix MA0888-MA0891, # 39 Appendix MA0892-MA0909, # 40 Appendix MA0910-MA0931, # 41 Certificate of Service)(Rogowski, Patricia) (Entered: Jul. 7, 2010).
Redacted Version of 198 Opening Brief in Support,, SOITEC/CEA Parties' Opening Brief In Support Of Motion For Summary Judgment: Non-Infringement by Commissariat a LEnergie Atomique, SOITEC Silicon On Insulator Technologies SA, SOITEC U.S.A., Inc., (Kraft, Denise) (Entered: Jul. 8, 2010).
Redacted Version of 197 Sealed Motion for Summary Judgment SOITEC/CEA Parties' Motion For Summary Judgment: Non-Infringement (Filed Under Seal)Sealed Motion for Summary Judgment SOITEC/CEA Parties' Motion For Summary Judgment: Non-Infringement (Filed Under Seal) SOITEC/CEA Parties' Motion For Summary Judgment: Non-Infringement by Commissariat a LEnergie Atomique, SOITEC Silicon On Insulator Technologies SA, SOITEC U.S.A., Inc., (Kraft, Denise) (Entered: Jul. 8, 2010).
Redacted Version of 192 Appendix, Plaintiffs' Omnibus Appendix to Daubert Motion And Motions For Partial Summary Judgment Filed on Jul. 2, 2010-vol. VI of XIX by Commissariat a LEnergie Atomique, SOITEC Silicon On Insulator Technologies SA, SOITEC U.S.A., Inc., (Kraft, Denise) (Entered: Jul. 9, 2010).
Redacted Version of 193 Appendix, Plaintiffs' Omnibus Appendix to Daubert Motion And Motions For Partial Summary Judgment Filed on Jul. 2, 2010-vol. VIII of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 194 Appendix, Plaintiffs' Omnibus Appendix to Daubert Motion And Motions For Partial Summary Judgment Filed on Jul. 2, 2010-vol. X of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 195 Appendix, Plaintiffs' Omnibus Appendix to Daubert Motion And Motions For Partial Summary Judgment Filed on Jul. 2, 2010-vol. XVII of XIX by Commissariat a LEnergie Atomique, SOITEC Silicon On Insulator Technologies SA, SOITEC U.S.A., Inc.. (Kraft, Denise) (Entered: Jul. 9, 2010).
Redacted Version of 196 Appendix, Plantiffs' Omnibus Appendix to Daubert Motion And Motions For Partial Summary Judgment Filed on Jul. 2, 2010-vol. XIX of XIX by Commissariat a LEnergie Atomique, SOITEC Silicon On Insulator Technologies SA, SOITEC U.S.A., Inc.. (Kraft, Denise) (Entered: Jul. 9, 2010).
Claim Construction Answering Brief re 168 Claim Construction Opening Brief, filed by MEMC Electronic Materials Inc.. (Attachments: # 1 Certificate of Service)(Rogowski, Patricia) (Entered: Jul. 9, 2010).
Appendix re 228 Claim Construction Answering Brief by MEMC Electronic Materials Inc.. (Attachments: # 1 Appendix DA0782_DA0783, # 2 Appendix DA0784-DA0785, # 3 Appendix DA0786, # 4 Appendix DA0787-DA0810, # 5 Appendix DA0811-DA0834, # 6 Appendix DA0835-DA0845, # 7 Appendix DA0846-DA0855, # 8 Certificate of Service)(Rogowski, Patricia) (Entered: Jul. 9, 2010).
Claim Construction Answering Brief re 168 Claim Construction Opening Brief, 228 Claim Construction Answering Brief Plaintiffs S.O.I.Tec on Insulator Technologies, S.A. And Commissariat A Energie Atomique's Answering Claim Construction Brief filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Jul. 9, 2010).
Appendix re 230 Claim Construction Answering Brief, Appendix to Plaintiffs S.O.I.TEC On Insulator Technologies, S.A. And Commissariat A Energie Atomique's Answering Claim Construction Brief by Commissariat a LEnergie Atomique, SOITEC Silicon On Insulator Technologies SA. (Attachments: # 1 Appendix PA-0001-PA-0050, # 2 Appendix PA-0051-PA-0083, # 3 Certificate of Service)(Kraft, Denise) (Entered: Jul. 9, 2010).
Redacted Version of 183 Appendix, Joint Appendix of Exhibits to Opening and Answering Claim Construction Briefs vol. IV of VI by Commissariat a LEnergie Atomique, SOITEC Silicon On Insulator Technologies SA. (Kraft, Denise) (Entered: Jul. 12, 2010).
Redacted Version of 170 Exhibit to a Document, Exhibit A to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Kraft, Denise) (Entered: Jul. 12, 2010).
Redacted Version of 171 Exhibit to a Document, Exhibit B to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon On Insulator Technologies SA. (Kraft, Denise) (Entered: Jul. 12, 2010).
Redacted Version of 172 Exhibit to a Document, Exhibit C to Declaration of Marcus T. Hall in Support of Plaintiffs S.O.I.TEC Silicon on Insulator Technologies, S.A. and Commissariat a L'Energie Atomique's Opening Claim Construction Brief by Commissariat a LEnergie Atomique, SOITEC Silicon on Insulator Technologies SA. (Kraft, Denise) (Entered: Jul. 12, 2010).
Answering Brief in Opposition re 186 Motion in Limine SOITEC/CEA Parties' Motion to Exclude The Expert Report of Dr. Pascal Belton and Any Related Testimony filed by MEMC Electronic Materials Inc..Reply Brief due date per Local Rules is Jul. 29, 2010. (Rogowski, Patricia) (Entered: Jul. 19, 2010).
Answering Brief in Opposition re 208 Motion for Partial Summary Judgment Plaintiffs' Motion For Partial Summary Judgment That The Bruel Patent Does Not Anticipate The Aspar Patents filed by MEMC Electronic Materials Inc..Reply Brief due date per Local Rules is Jul. 29, 2010. (Rogowski, Patricia) (Entered: Jul. 19, 2010).
Answering Brief in Opposition re 202 Motion for Partial Summary Judgment SOITEC/CEA Parties Motion For Partial Summary Judgment That The Patents in Suit Satisfy The Written Description Requirement filed by MEMC Electronic Materials Inc..Reply Brief due date per Local Rules Jul. 29, 2010. (Rogowski, Patricia) (Entered: Jul. 19, 2010).
Answering Brief in Opposition re 204 Motion for Partial Summary Judgment Plaintiffs' Motion For Partial Summary Judgment That The Certificate of Correction For the '396 Patent is Valid filed by MEMC Electronic Materials Inc..Reply Brief due date per Local Rules is Jul. 29, 2010. (Rogowski, Patricia) (Entered: Jul. 19, 2010).
Answering Brief in Opposition re 210 Motion for Partial Summary Judgment SOITEC's Motion For Partial Summary Judgment of Invalidity of United States Patent No. 5,834,812 For Lack of Enablement filed by MEMC Electronic Materials Inc..Reply Brief due date per Local Rules is Jul. 29, 2010. (Rogowski, Patricia) (Entered: Jul. 19, 2010).
Answering Brief in Opposition re 212 Motion for Partial Summary Judgment SOITEC's Motion For Partial Summary Judgment For Invalidity of Asserted Claims of United States Patent No. 5,834,812 in View of Prior Art filed by MEMC Electronic Materials Inc..Reply Brief due date per Local Rules is Jul. 29, 2010. (Rogowski, Patricia) (Entered: Jul. 19, 2010).
Appendix re 247 Answering Brief in Opposition,, Appendix To Plaintiffs' Answering Brief In Opposition To Defendant's Motion For Partial Summary Judgment Of Invalidity Of The Asserted Aspar Claims (PA-1103-PA-1156) by Commissariat a LEnergie Atomique, SOITEC Silicon On Insulator Technologies SA. (Attachments: # 1 Exhibit PA-1103-PA-1109-Filed Under Seal, # 2 Exhibit PA-1110-PA-1118-Filed Under Seal, # 3 Exhibit PA-1119-PA-1130-Filed Under Seal, # 4 Exhibit PA-1131-PA-1143-Filed Under Seal, # 5 Exhibit PA-1144-PA-1156, # 6 Certificate of Service)(Kraft, Denise) (Entered: Jul. 19, 2010).
Appendix re 250 Answering Brief in Opposition, Apendix to Plaintiffs' Answering Brief in Opposition to Defendant's Motion For Summary Judgment of Non-Infringement by Commissariat a LEnergie Atomique, SOITEC Silicon On Insulator Technologies SA. (Attachments: # 1 Exhibit PA-1190-PA-1191, # 2 Certificate of Service)(Kraft, Denise) (Entered: Jul. 19, 2010).
Redacted Version of 241 Answering Brief in Opposition, to Plaintiffs' Motion for Partial Summary Judgment that the Best Mode Requirement is Satisfied for the Claims of the '009 and '396 Patents by MEMC Electronic Materials Inc.. (Rogowski, Patricia) (Entered: Jul. 26, 2010).
Redacted Version of 249 Answering Brief in Opposition, to Plaintiffs' Motion for Summary Judgment on the Infringement of U.S. Patent No. 5,834,812 by MEMC Electronic Materials Inc.. (Rogowski, Patricia) (Entered: Jul. 26, 2010).

Redacted Version of 253 Answering Brief in Opposition, to Plaintiffs' Motion for Partial Summary Judgment that the Aspar Patents Are Not Invalid for Inequitable Conduct by MEMC Electronic Materials Inc.. (Rogowski, Patricia) (Entered: Jul. 26, 2010).
Redacted Version of 240 Appendix by MEMC Electronic Materials Inc.. (Attachments: # 1 Appendix MA0932-MA0985, # 2 Appendix MA0986-MA1039.22, # 3 Appendix MA1040-MA1144, # 4 Appendix MA1145-MA1200, # 5 Appendix MA1201-MA1265, # 6 Appendix MA1265.1-MA1338, # 7 Appendix MA1339-MA1547, # 8 Appendix MA1548-MA1627, # 9 Appendix MA1628-MA1693, # 10 Appendix MA1694-MA1953, # 11 Appendix MA1954-MA2127, # 12 Appendix MA2128-MA2206, # 13 Appendix MA2207-MA2253, # 14 Appendix MA2254-MA2273, # 15 Appendix MA2274-MA2333, # 16 Appendix MA2334-MA2337, # 17 Appendix MA2338-MA2342, # 18 Appendix MA2343-MA2346, # 19 Appendix MA2347-MA2351, # 20 Certificate of Service)(Rogowski, Patricia) (Entered: Jul. 26, 2010) (2 parts).
Redacted Version of 261 Answering Brief in Opposition, to Plaintiffs' Motion for Partial Summary Judgment that the Best Mode Requirement is Satisfied for the Claims of the '009 and '396 Patents (Corrected Version of D.I. 241) by MEMC Electronic Materials Inc.. (Rogowski, Patricia) (Entered: Jul. 26, 2010).
Redacted Version of 250 Answering Brief in Opposition, to Soitec's Brief in Opposition to Defendant's Motion For Summary Judgment of Non-Infringement by Commissariat a LEnergie Atomique, SOITEC Silicon On Insulator Technologies SA. (Attachments: # 1 Certificate of Service)(Kraft, Denise) (Entered: Jul. 26, 2010).
Redacted Version of 247 Answering Brief in Opposition,, to Plaintiffs' Answering Brief In Opposition To Defendant's Motin For Partial Summary Judgment Of In validity Of The Asserted Aspar Claims by Commissariat a LEnergie Atomique, SOITEC Silicon On Insulator Technologies SA. (Attachments: # 1 Certificate of Service)(Kraft, Denise) (Entered: Jul. 26, 2010).
Redacted Version 254 Appendix,, to Appendix To Plaintiffs' Answering Brief In Opposition To Defendant's Motion For Partial Summary Judgment Of Invalidity Of The Asserted Aspar Claims (PA-1103-PA-1143 by Commissariat a LEnergie Atomique, SOITEC On Insulator Technologies SA. (Kraft, Denise) (Entered: Jul. 26, 2010).
Redacted Version of 251 Appendix,, to Appendix to Plaintiffs' Answering Brief in Opposition to Defendant's Motion For Summary Judgment of Non-Infringement by Commissariat a LEnergie Atomique, SOITEC Silicon On Insulator Technologies SA. (Kraft, Denise) (Entered: Jul. 26, 2010).
Reply Brief re 204 Motion for Partial Summary Judgment Plaintiffs' Motion For Partial Summary Judgment That The Certificate of Correction For The '396 Patent is Valid Reply Brief in Support of Plaintiffs' Motion For Partial Summary Judgment That The Certificate of Correction For the '396 Patent is Valid filed by Commissariat a LEnergie Atomique, SOITEC Silicon On Insulator Technologies SA. (Attachments: # 1 Certificate of Service)(Kraft, Denise) (Entered: Jul. 30, 2010).
Declaration re 268 Reply Brief, Declaration of Marcus T. Hall in Support of Reply Brief in Support of Plaintiffs' Motion For Partial Summary Judgment That The Certificate of Correction For the '396 Patent is Valid by Commissariat a LEnergie Atomique, SOITEC Silicon On Insulator Technologies SA. (Attachments: # 1 Exhibit A, # 2 Certificate of Service)(Kraft, Denise) (Entered: Jul. 30, 2010).
Appendix re 268 Reply Brief, Omnibus Appendix to Plaintiffs' Reply Briefs in Support of Plaintiffs' Daubert Motion and Motions For Partial Summary Judgment (PA-1192-PA-1261) by Commissariat a LEnergie Atomique, SOITEC Silicon On Insulator Technologies SA. (Attachments: # 1 Exhibit PA-1199-PA-1204, # 2 Exhibit PA-1205-PA-1206, # 3 Exhibit PA-1206.1, # 4 Exhibit PA-1231-PA-1237, # 5 Exhibit PA-1238-PA-1245, # 6 Exhibit PA-1246-PA-1257, # 7 Exhibit PA-1258-PA-1261, # 8 Certificate of Service)(Kraft, Denise) (Entered: Jul. 30, 2010).
Reply Brief re 210 Motion for Partial Summary Judgment SOITEC's Motion For Partial Summary Judgment of Invalidity of United States Patent No. 5,834,812 For Lack of Enablement Reply Brief in Support of SOITEC's Motion For Partial Summary Judgment of Invalidity of United States Patent No. 5,834,812 For Lack of Enablement filed by SOITEC Silicon On Insulator Technologies SA, SOITEC U.S.A., Inc.. (Attachments: # 1 Certificate of Service)(Kraft, Denise) (Entered: Jul. 30, 2010).
Reply Brief re 212 Motion for Partial Summary Judgment SOITEC's Motion For Partial Summary Judgment For Invalidity of Asserted Claims of United States Patent No. 5,834,812 in View of Prior Art Reply Brief in Support of SOITEC's Motion For Partial Summary Judgment For Invalidity of Asserted Claims of United States Patent No. 5,834,812 in View of Prior Art filed by SOITEC Silicon On Insulator Technologies SA, SOITEC U.S.A., Inc.. (Attachments: # 1 Exhibit A, # 2 Exhibit B, # 3 Certificate of Service)(Kraft, Denise) (Entered: Jul. 30, 2010).
Reply Brief re 202 Motion for Partial Summary Judgment SOITEC/CEA Parties Motion For Partial Summary Judgment That The Patents in Suit Satisfy The Written Description Requirement Reply Brief in Support of SOITEC/CEA Parties' Motion For Partial Summary Judgment That The Patents in Suit Satisfy The Written Description Requirement filed by Commissariat a LEnergie Atomique, SOITEC Silicon On Insulator Technologies SA. (Attachments: # 1 Certificate of Service)(Kraft, Denise) (Entered: Jul. 30, 2010).
Redacted Version of 269 Appendix, To Reply Brief in Support of MEMC's Motion for Partial Summary Judgment of Invalidity of the Asserted Aspar Patent Claims by MEMC Electronic Materials Inc.. (Attachments: # 1 Appendix Table of Contents, # 2 Appendix MA2453_MA2479, # 3 Certificate of Service)(Rogowski, Patricia) (Entered: Aug. 3, 2010).
Redacted Version of 273 Appendix Reply Brief in Support of MEMC's Motion for Summary Judgment of Non-Infringement by MEMC Electronic Materials Inc.. (Attachments: # 1 Appendix Table of Contents, # 2 Appendix MA2352-MA2361, # 3 Appendix MA2362-MA2371, # 4 Appendix MA2372-MA2381, # 5 Appendix MA2382-MA2391, # 6 Appendix MA2392-MA2399, # 7 Appendix MA2400-MA2404, # 8 Appendix MA2405-MA2422, # 9 Appendix MA2423-MA2425, # 10 Appendix MA2426-MA2427, # 11 Appendix MA2428-MA2430, # 12 Appendix MA2431-MA2440, # 13 Appendix MA2441-MA2448, # 14 Appendix MA2449-MA2452, # 15 Appendix MA2452.1-MA2452.9, # 16 Certificate of Service)(Rogowski, Patricia) (Entered: Aug. 3, 2010).
Redacted Version of 267 Reply Brief in Support of MEMC's Motion for Partial Summary Judgment of Invalidity of the Asserted Aspar Patent Claims by MEMC Electronic Materials Inc.. (Rogowski, Patricia) (Entered: Aug. 3, 2010).
Redacted Version of 271 Reply Brief in Support of MEMC's Motion for Summary Judgment of Non-Infringement by MEMC Electronic Materials Inc.. (Rogowski, Patricia) (Entered: Aug. 3, 2010).
Redacted Version of 274 Appendix Omnibus Appendix to Plaintiffs' Reply Briefs in Support of Plaintiffs' Daubert Motion and Motions For Partial Summary Judgment (PA-1192-PA-1198 and PA-1207-PA-1230 Filed Under Seal) by Commissariat a LEnergie Atomique, SOITEC Silicon On Insulator Technologies SA. (Kraft, Denise) (Entered: Aug. 6, 2010).
Redacted Version of 277 Reply Brief, in Support of SOITEC/CEA Parties' Motion to Exclude The Expert Report of Dr. Pascal Bellon and Any Related Testimony by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 278 Reply Brief in Support of SOITEC/CEA Parties' Motion For Summary Judgment: Non-Infringement (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 279 Reply Brief in Support of Plaintiffs' Motion for Partial Summary Judgment That the Best Mode Requirement is Satisfied for the Claims of the '009 and '396 Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Redacted Version of 281 Reply Brief, in Support of Plaintiffs' Motion For Partial Summary Judgment That The Bruel Patent Does Not Anticipate The Aspar Patents (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).

Redacted Version of 282 Reply Brief,, in Support of SOITEC/CEA Parties' Motion For Partial Summary Judgment That The Aspar Patents Are Not Invalid For Inequitable Conduct (Filed Under Seal) by Commissariat a LEnergie Atomique, SOITEC Silicon On Insulator Technologies SA. (Attachments: # 1 Certificate of Service)(Kraft, Denise) (Entered: Aug. 6, 2010).
Notice of Service of CD of documents MEMC0782194-MEMC0782500 and FH-1 0001-FH-8 0067 by MEMC Electronic Materials Inc..(Rogowski, Patricia) (Entered: Sep. 16, 2010).
Redacted Version of 301 Sealed Motion for Reconsideration Request to Modify Protective Order by Commissariat a LEnergie Atomique, SOITEC Silicon On Insulator Technologies SA. (Attachments: # 1 Certificate of Service)(Kraft, Denise) (Entered: Sep. 24, 2010).
Redacted Version of 302 Declaration, of Michael L. Brody in Support of Motion to Reconsider Request to Modify Protective Order by Commissariat a LEnergie Atomique, SOITEC Silicon On Insulator Technologies SA. (Attachments: # 1 Certificate of Service)(Kraft, Denise) (Entered: Sep. 24, 2010).
Redacted Version of 303 Exhibit to a Document Exhibit A to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 304 Exhibit to a Document Exhibit B to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 305 Exhibit to a Document Exhibit C to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Redacted Version of 306 Exhibit to a Document Exhibit D to Michael L. Brody in Support of Motion to Reconsider Request to Modify Protective Order by Commissariat a LEnergie Atomique, SOITEC Silicon On Insulator Technologies SA. (Kraft, Denise) (Entered: Sep. 24, 2010).
Proposed Pretrial Order [Proposed] Joint Pretrial Order (Filed Under Seal) by Commissariat a LEnergie Atomique, SOITEC Silicon On Insulator Technologies SA, Soitec U.S.A., Inc.. (Attachments: # 1 Exhibit 1 (Sealed), # 2 Exhibit 2A (Sealed), # 3 Exhibit 2B (Sealed), # 4 Exhibit 3A (Sealed), # 5 Exhibit 3B (Sealed), # 6 Exhibit 4A (Sealed), # 7 Exhibit 4B (Sealed), # 8 Exhibit 4C (Sealed), # 9 Exhibit 5A (Sealed), # 10 Exhibit 5B (Sealed), # 11 Exhibit 6A (Sealed), # 12 Exhibit 6B (Sealed), # 13 Exhibit 7A (Sealed), # 14 Exhibit 7B (Sealed), # 15 Certificate of Service)(Kraft, Denise) (Entered: Oct. 7, 2010).
Proposed Voir Dire by MEMC Electronic Materials Inc.. (Attachments: # 1 Certificate of Service)(Rogowski, Patricia) (Entered: Oct. 8, 2010).
Verdict Sheet by MEMC Electronic Materials Inc.. (Attachments: # 1 Certificate of Service)(Rogowski, Patricia) (Entered: Oct. 8, 2010).
Proposed Voir Dire by Commissariat a LEnergie Atomique, SOITEC Silicon On Insulator Technologies SA, SOITEC U.S.A., Inc.. (Attachments: # 1 Certificate of Service)(Kraft, Denise) (Entered: Oct. 8, 2010).
Verdict Sheet by Commissariat a LEnergie Atomique, SOITEC Silicon On Insulator Technologies SA, SOITEC U.S.A., Inc.. (Attachments: # 1 Certificate of Service)(Kraft, Denise) (Entered: Oct. 8, 2010).
Proposed Jury Instructions by Commissariat a LEnergie Atomique, SOITEC Silicon On Onsulator Technologies SA, Soitec U.S.A., Inc.. (Kraft, Denise) (Entered: Oct. 8, 2010).
Proposed Jury Instructions by Commissariat a LEnergie Atomique, SOITEC Silicon On Insulator Technologies SA, Soitec U.S.A., Inc.. (Kraft, Denise) (Entered: Oct. 8, 2010).
Redacted Version of 315 Proposed Pretrial Order,, Redacted Version of [Proposed] Joint Pretrial Order by Commissariat a LEnergie Atomique, SOITEC Silicon On Insulator Technologies SA, SOITEC U.S.A., Inc.. (Attachments: # 1 Exhibit 1, # 2 Exhibit 2A, # 3 Exhibit 2B, # 4 Exhibit 3A, # 5 Exhibit 3B, # 6 Exhibit 4A, # 7 Exhibit 4B, # 8 Exhibit 4C, # 9 Exhibit 5A, # 10 Exhibit 5B, # 11 Exhibit 6A, # 12

Exhibit 6B, # 13 Exhibit 7A, # 14 Exhibit 7B, # 15 Certificate of Service)(Kraft, Denise) (Entered: Oct. 13, 2010).

Memorandum Opinion. Signed by Judge Sue L. Robinson on Oct. 13, 2010. (nmf) (Entered: Oct. 13, 2010).

Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting in part and denying in part 213 Motion for Partial Summary Judgment. Signed by Judge Sue L. Robinson on Oct. 13, 2010. (nmf) (Entered: Oct. 13, 2010).

Memorandum Order re: claim construction. Signed by Judge Sue L. Robinson on Oct. 13, 2010. (nmf) (Entered: Oct. 13, 2010) Oral Order by Judge Sue L. Robinson on Oct. 14, 2010 that the responses to the issues raised in the exhibits to the joint pre-trial order are to be stricken from the record. (These filings, formerly D.I. Nos. 318 and 323 have been deleted from the docket.) (nmf) (Entered: Oct. 14, 2010).

Amended Order denying 141 Motion for Discovery; denying 186 Motion in Limine; granting in part and denying in part 187 Motion for Partial Summary Judgment; granting 197 Motion for Summary Judgment ; granting 199 Motion for Summary Judgment ; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; *granting* 213 Motion for Partial Summary Judgment. Signed by Judge Sue L. Robinson on Oct. 14, 2010. (nmf) (Entered: Oct. 14, 2010) Minute Entry for proceedings held before Judge Sue L. Robinson—Final Pretrial Conference held on Oct. 14, 2010. (Court Reporter V. Gunning.) (nmf) (Entered: Oct. 15, 2010) So Ordered, re 315 Proposed Pretrial Order. Signed by Judge Sue L. Robinson on Oct. 14, 2010. (nmf) (Entered: Oct. 15, 2010).

Motion for Reargument re 327 Memorandum and Order—Reargument of Claim Construction of One Claim Term of U.S. Patent 6,809,009—filed by MEMC Electronic Materials Inc.. (Rogowski, Patricia) (Entered: Oct. 18, 2010).

Second Amended Order re: 325 denying 141 Motion for Discovery; denying 186 Motion in Limine; granting in part and denying in part 187 Motion for Partial Summary Judgment; granting 197 Motion for Summary Judgment ; granting 199 Motion for Summary Judgment **with respect to the '484 patent and with respect to its current process, and denied in other respects; granting 202 Motion for Partial Summary Judgment; denying 204 Motion for Partial Summary Judgment; denying 206 Motion for Partial Summary Judgment; granting in part and denying in part 208 Motion for Partial Summary Judgment; denying 210 Motion for Partial Summary Judgment; denying 212 Motion for Partial Summary Judgment; granting 213 Motion for Partial Summary Judgment. Signed by Judge Sue L. Robinson on Oct. 19, 2010. (nmb) (Entered: Oct. 19, 2010).

Memorandum Order granting 329 Motion for Reargument re 327 Memorandum and Order—Reargument of Claim Construction of One Claim Term of U.S. Patent 6,809,009. Signed by Judge Sue L. Robinson on Oct. 19, 2010. (nmf) (Entered: Oct. 19, 2010).

Stipulation MEMC's Declaratory Judgment counterclaim asserting invalidity of United States Reissued Patent No. 39,484 in Civil Action No. 1:08-292-SLR is dismissed without prejudice by Commissariat a LEnergie Atomique, SOITEC Silicon On Insulator Technologies SA, SOITEC U.S.A., Inc.. (Kraft, Denise) (nmf, ). (Entered: Oct. 21, 2010).

Stipulation of Fact re 331 Memorandum and Order, 327 Memorandum and Order, 325 Memorandum Opinion by Commissariat a LEnergie Atomique, SOITEC Silicon On Insulator Technologies SA, SOITEC U.S.A., Inc.. (Kraft, Denise) (Entered: Oct. 21, 2010).

Letter to The Honorable Sue L. Robinson from Denise Seastone Kraft regarding Mutually agreed upon narrowing of the issues for trial—re 333 Stipulation, 332 Stipulation,. (Kraft, Denise) (Entered: Oct. 21, 2010) Correcting Entry: The pdf of D.I. 332 has been replaced with the correct pdf of the stipulation per request of filer. (nmf) (Entered: Oct. 22, 2010) So Ordered, re 333 Stipulation filed by SOITEC Silicon On Insulator Technologies SA, SOITEC U.S.A., Inc. Commissariat a LEnergie Atomique, 332 Stipulation, filed by SOITEC Silicon On Insulator Technologies SA, SOITEC U.S.A., Inc., Commissariat a LEnergie Atomique. Signed by Judge Sue L. Robinson on Oct. 22, 2010. (nmf) (Entered: Oct. 22, 2010).

Voir Dire Questions. Read in Open Court Oct. 25, 2010.(nfm) (Entered: Oct. 25, 2010).

Preliminary Jury Instructions. Read in Open Court Oct. 25, 2010. (nmf) (Entered: Oct. 25, 2010) Minute Entry for proceedings held before Judge Sue L. Robinson: Jury Trial Day 1 held on Oct. 25, 2010. (Court Reporter Valerie Gunning, Brian Gaffigan.) (dlk) (Entered: Oct. 26, 2010).

Plaintiff'S Bench Memorandum. Filed in Court Oct. 26, 2010. (nmf) (Entered: Oct. 26, 2010) Minute Entry for proceedings held before Judge Sue L. Robinson—Jury Trial (Day 2) held on Oct. 26, 2010. (Court Reporter Valerie Gunning, Kevin Maurer.) (dlk) (Entered: Oct. 26, 2010) Minute Entry for proceedings held before Judge Sue L. Robinson—Jury Trial—Day 3, held on Oct. 27, 2010. (Court Reporter Valerie Gunning/Kevin Maurer.) (nms) (Entered: Oct. 27, 2010).

Statement—Bench Memorandum Supporting MEMC'S Proffer of Admissions by SOITEC in Prior Lawsuit Involving the '564 Patent submitted at trial by MEMC Electronic Materials Inc.. (Attachments: # 1 Exhibit A)(Rogowski, Patricia) (Entered: Oct. 28, 2010) Minute Entry for proceedings held before Judge Sue L. Robinson—Jury Trial—Day 4 held on Oct. 28, 2010. (Court Reporter Valerie Gunning/Kevin Maurer.) (nms) (Entered: Nov. 1, 2010).

Final Jury Instructions read in open Court by Judge Robinson. (lid) (Entered: Nov. 1, 2010) Minute Entry for proceedings held before Judge Sue L. Robinson—Jury Trial held on Nov. 1, 2010. (Day 5) (Court Reporter V. Gunning.) (lid) (Entered: Nov. 2, 2010) Minute Entry for proceedings held before Judge Sue L. Robinson—Jury Trial completed on Nov. 2, 2010. (Day 6) (Court Reporter V. Gunning.) (lid) (Entered: Nov. 2, 2010).

Redacted Version of 342 Jury Verdict. (lid) (Entered: Nov. 2, 2010).

Statement Bench Memorandum in Support of Plaintiffs' Motion For Judgment as a Matter of Law of No Unenforceability of the '009 Patent Due To Inequitable Conduct submitted at trial by Commissariat a LEnergie Atomique, SOITEC Silicon On Insulator Technologies SA, Sitec U.S.A., Inc.. (Attachments: # 1 Certificate of Service)(Kraft, Denise) (Entered: Nov. 2, 2010).

Answering Brief in Opposition re 301 Sealed Motion for Reconsideration Request to Modify Protective Order (MEMC'S Opposition to Plaintiffs' Motion for Reargument Re: Modification of the Protective Order) filed by Memc Electronic Materials Inc..Reply Brief due date per Local Rules is Nov. 22, 2010. (Attachments: # 1 Exhibit 1 through 5, # 2 Certificate of Service)(Rogowski, Patricia) (Entered: Nov. 12, 2010).

Judgment in favor of defendant MEMC Electronic Materials, Inc. and against plaintiffs S.O.I.TEC Silicon On Insulator Technologies, S.A. and Commisseriat A LEnergie Atomique et aux Energies Alternatives as to the 812 patent. It is Further Ordered that judgment be and is hereby entered in favor of plaintiffs S.O.I.TEC Silicon On Insulator Technologies, S.A. and Commisseriat A LEnergie Atomique et aux Energies Alternatives and against defendant MEMC Electronic Materials, Inc. as to the 009 patent. Signed by Judge Sue L. Robinson on Nov. 15, 2010. (nmf) (Entered: Nov. 15, 2010).

Stipulation Setting Post-Trial Briefing Schedule re 348 Judgment,, by Commissariat a LEnergie Atomique, MEMC Electronic Materials Inc., SOITEC Silicon On Insulator Technologies SA. (Rogowski, Patricia) (Entered: Nov. 15, 2010).

Motion for Reargument re 348 Judgment (MEMCS Motion for Reargument of the Courts Order Re: The Unenforceability of the 009 Patent)—filed by MEMC Electronic Materials Inc.. (Attachments: # 1 Exhibit 1)(Rogowski, Patricia) (Entered: Nov. 16, 2010) So Ordered—re 349 Stipulation. Set Post Trial Briefing Schedule: (Opening Brief due Dec. 8, 2010., Answering Brief due Dec. 29, 2010., Reply Brief due Jan. 12, 2010.). Signed by Judge Sue L. Robinson on Nov. 17, 2010. (lid) (Entered: Nov. 17, 2010).

Motion for Leave to File Reply in Support of Plaintiff's Motion for Reargument—filed by Commissariat a LEnergie Atomique, SOITEC Silicon On Insulator Technologies SA. (Attachments: # 1 Text of Proposed Order, # 2 Certificate of Service)(Kraft, Denise) (Entered: Nov. 23, 2010).

Opening Brief in Support re 301 Sealed Motion for Reconsideration Request to Modify Protective Order, 351 Motion for Leave to File Reply in Support of Plantiff's Motion for Reargument filed by Commissariat a LEnergie Atomique, SOITEC Silicon On Insulator Technologies SA.Answering Brief/Response due date per Local Rules is Dec. 10, 2010. (Attachments: # 1 Appendix A, # 2 Certificate of Service)(Kraft, Denise) (Entered: Nov. 23, 2010).

Stipulation to Extend Time Respond to MEMC's Motion for Reargument of the Court's Order Re: Unenforceability of the '009 Patent to Dec. 3, 2010—filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Nov. 24, 2010) So Ordered—re 353 Stipulation to Extend Time. Set Briefing Schedule: re 350 Motion for Reargument re 348 Judgment,. (Answering Brief due Dec. 3, 2010.). Signed by Judge Sue L. Robinson on Nov. 30, 2010. (lid) (Entered: Nov. 30, 2010).

Stipulation to Extend Time to file Motions and Opening Post-Trial Briefs to Dec. 13, 2010—filed by Commissariat a LEnergie Atomique, SOITEC Silicon On Insulator Technologies SA, SOITEC U.S.A., Inc.. (Kraft, Denise) (Entered: Dec. 3, 2010).

Reply Brief re 350 Motion for Reargument re 348 Judgment (MEMCS Motion for Reargument of the Courts Order Re: The Unenforceability of the 009 Patent) Plaintiffs' Opposition to MEMC's Motion For Reargument of the Court's Order Re: The Unenforceability of the '009 Patent filed by Commissariat a LEnergie Atomique, SOITEC Silicon On Insulator Technologies SA, Soitec U.S.A., Inc.. (Attachments: # 1 Exhibit A, # 2 Certificate of Service)(Kraft, Denise) (Entered: Dec. 3, 2010) So Ordered—re 354 Stipulation to Extend Time. Set Briefing Schedule: (Post Trial Opening Brief due Dec. 13, 2010.). Signed by Judge Sue L. Robinson on Dec. 6, 2010. (lid) (Entered: Dec. 6, 2010).

Exhibit re 355 Reply Brief, Exhibit B to Plaintiffs' Opposition to MEMC's Motion For Reargument of the Court's Order Re: The Unenforceability of the '009 Patent by Commissariat a LEnergie Atomique, SOITEC Silicon On Insulator Technologies SA, SOITEC U.S.A., Inc.. (Kraft, Denise) (Entered: Dec. 6, 2010).

Answering Brief in Opposition re 351 Motion for Leave to File Reply in Support of Plantiff's Motion for Reargument filed by MEMC Electronic Materials Inc..Reply Brief due date per Local Rules is Dec. 20, 2010. (Rogowski, Patricia) (Entered: Dec. 10, 2010).

Stipulation to Extend Time Stipulation and Order for Plaintiffs to file Motions and Opening Post-Trial Briefs to Dec. 14, 2010—filed by Commissariat a LEnergie Atomique, SOITEC Silicon On Insulator Technologies SA, SOITEC U.S.A., Inc.. (Kraft, Denise) (Entered: Dec. 13, 2010).

Motion for Judgment as a Matter of Law—MEMC'S Renewed Motion for Judgment As a Matter of Law or in the Alternative for a New Trial—filed by MEMC Electronic Materials Inc.. (Rogowski, Patricia) (Entered: Dec. 13, 2010).

Opening Brief in Support re 359 Motion for Judgment as a Matter of Law—MEMC'S Renewed Motion for Judgment as a Matter of Law or in the Alternative for a New Trial filed by MEMC Electronic Materials Inc..Answering Brief/Response due date per Local Rules is Dec. 30, 2010. (Attachments: # 1 Exhibit 1, # 2 Certificate of Service)(Rogowski, Patricia) (Entered: Dec. 13, 2010).

Motion for Judgment as a Matter of Law Plaintiffs' Renewed Motion For Judgment As A Matter of Law Or In The Alternative For A New Trial—filed by Commissariat a LEnergie Atomique, SOITEC Silicon On Insulator Technologies SA. (Attachments: # 1 Text of Proposed Order, # 2 Certificate of Service)(Kraft, Denise) (Entered: Dec. 14, 2010).

Opening Brief in Support re 361 Motion for Judgment as a Matter of Law Plaintiffs' Renewed Motion For Judgment As A Matter Of Law Or In The Alternative For A New Trial filed by Commissariat a LEnergie Atomique, SOITEC Silicon On Insulator Technologies SA.Answering Brief/Response due date per Local Rules is Jan. 3, 2011. (Attachments: # 1 Certificate of Service)(Kraft, Denise) (Entered: Dec. 14, 2010).

Motion For Injunctive Relief Plaintiffs' Motion for Injunctive Relief And To Lift Stay on Damages Discovery—filed by Commissariat a LEnergie Atomique, Soitec Silicon on Insulator Technologies SA. (Attachments: # 1 Text of Proposed Order, # 2 Certificate of Service)(Kraft, Denise) (Entered: Dec. 14, 2010).

Stipulation to Extend Time due date for Answering and Reply Post-Trial Briefs to Jan. 7, 2011 for Answering Brief and Jan. 21, 2011 for Reply Brief—filed by MEMC Electronic Materials Inc.. (Rogowski, Patricia) (Entered: Dec. 15, 2010) So Ordered—re 365 Stipulation to Extend Time. Set Briefing Schedule: (Answering Post trial Brief due Jan. 7, 2011., Reply post trial Brief due Jan. 21, 2011.). Signed by Judge Sue L. Robinson on Dec. 16, 2010. (lid) (Entered: Dec. 17, 2010).

Stipulation to Extend Time Post-Trial Answering Briefs to Jan. 12, 2011—filed by MEMC Electronic Materials Inc.. (Rogowski, Patricia) (Entered: Jan. 6, 2011).

Notice of Appearance by Aleine Michelle Porterfield on behalf of Commissariat a LEnergie Atomique, SOITEC Silicon On Insulator Technologies SA, SOITEC U.S.A., Inc. (Attachments: # 1 Certificate of Service)(Porterfield, Aleine) (Entered: Jan. 7, 2011).

Joint Stipulation to Extend Time Post-trial Answering Briefs and Post-trial Reply Briefs to Jan. 14, 2011 and Jan. 28, 2011—filed by MEMC Electronic Materials Inc.. (Rogowski, Patricia) (Entered: Jan. 12, 2011).

Answering Brief in Opposition re 359 Motion for Judgment as a Matter of Law—MEMC'S Renewed Motion for Judgment as a Matter of Law or in the Alternative for a New Trial filed by Commissariat a LEnergie Atomique, SOITEC Silicon On Insulator Technologies SA, SOITEC U.S.A., Inc..Reply Brief due date per Local Rules is Jan. 24, 2011. (Attachments: # 1 Certificate of Service)(Kraft, Denise) (Entered: Jan. 14, 2011).

Answering Brief in Opposition re 361 Motion for Judgment as a Matter of Law Plaintiffs' Renewed Motion For Judgment As A Matter of Law Or In The Alternative For A New Trial (MEMCS Answering Brief in Opposition to Plaintiffs Renewed Motion for Judgment As a Matter of Law or in the Alternative for a New Trial) filed by MEMC Electronic Materials Inc..Reply Brief due date per Local Rules is Jan. 24, 2011. (Attachments: # 1 Certificate of Service)(Rogowski, Patricia) (Entered: Jan. 14, 2011).

Declaration re 378 Answering Brief in Opposition, (Declaration of Robert M. Evans, Jr. in Support of MEMCS Opposition to Plaintiffs Renewed Motion for Judgment As a Matter of Law or in the Alternative for a New Trial) by MEMC Electronic Materials Inc.. (Attachments: # 1 Exhibit 1, # 2 Exhibit 2, # 3 Certificate of Service)(Rogowski, Patricia) (Entered: Jan. 14, 2011).

Redacted Version of 376 Answering Brief in Opposition, to Plaintiffs' Motion for Injunctive Relief and to Lift Stay on Damages Discovery by MEMC Electronic Materials Inc.. (Attachments: # 1 Certificate of Service)(Rogowski, Patricia) (Entered: Jan. 20, 2011).

Redacted Version of 377 Appendix to MEMC's Answering Brief in Opposition to Plaintiffs' Motion for Injunctive Relief and to Lift Stay on Damages Discovery by MEMC Electronic Materials Inc.. (Attachments: # 1 Exhibit 1-7, # 2 Exhibit 8, # 3 Exhibit 9, # 4 Exhibit 10, # 5 Exhibit 11, # 6 Exhibit 12-13, # 7 Exhibit 14, # 8 Exhibit 15, # 9 Exhibit 16, # 10 Exhibit 17, # 11 Exhibit 18, # 12 Exhibit 19, # 13 Certificate of Service)(Rogowski, Patricia) (Entered: Jan. 20, 2011).

Joint Stipulation to Extend Time of Post-Trial Reply Briefs to Tuesday, Feb. 1, 2011—filed by Commissariat a LEnergie Atomique, SOITEC Silicon On Insulator Technologies SA, Soitec U.S.A., Inc.. (Kraft, Denise) (Entered: Jan. 28, 2011).

Joint Stipulation to Extend Time of Post-Trial Reply Briefs to Friday, Feb. 4, 2011—filed by Commissariat a LEnergie Atomique, SOITEC Silicon On Insulator Technologies SA, SOITEC U.S.A., Inc.. (Kraft, Denise) (Entered: Jan. 31, 2011).

Redacted Version of 364 Opening Brief in Support,,,, Redacted Version of Opening Brief in Support of Plaintiffs' Motion For Injunctive Relief And To Lift Stay on Damages Discovery by Commissariat a LEnergie Atomique, SOITEC Silicon On Insulator Technologies SA, SOITEC U.S.A., Inc.. (Attachments: # 1 Exhibit A, # 2 Exhibit B, # 3 Exhibit C, # 4 Exhibit D, # 5 Exhibit E, # 6 Exhibit F, # 7 Exhibit G, # 8 Exhibit H, # 9 Exhibit I, # 10 Exhibit J, # 11 Exhibit K, # 12

Exhibit L, # 13 Exhibit M, # 14 Exhibit N, # 15 Exhibit O, # 16 Exhibit P, # 17 Exhibit Q, # 18 Exhibit R, # 19 Exhibit S)(Kraft, Denise) (Entered: Feb. 2, 2011).

Reply Brief re 359 Motion for Judgment as a Matter of Law—MEMC'S Renewed Motion for Judgment As a Matter of Law or in the Alternative for a New Trial filed by MEMC Electronic Materials Inc.. (Attachments: # 1 Certificate of Service)(Rogowski, Patricia) (Entered: Feb. 4, 2011).

Reply Brief re 361 Motion for Judgment as a Matter of Law Plaintiffs' Renewed Motion For Judgment As A Matter of Law Or In The Alternative For A New Trial filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 4, 2011).

Declaration re 387 Reply Brief, Declaration of Michael L. Brody in Support of Reply Brief In Support of Plaintiffs' Renewed Motion For Judgment as a Matter of Law or In The Alternative For a New Trial by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 4, 2011).

Motion to Strike 386 Reply Brief, Motion By Plaintiffs' To Strike Reply Brief In Support of MEMC's Renewed Motion For Judgment as a Matter of Law or, In The Alternative, a New Trial (D.I. 386)—filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 8, 2011).

Opening Brief in Support re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By Plaintiffs' To Strike Reply Brief In Support of MEMC's Renewed Motion For Judgment as a Matter of Law or, In The Alternative, a New Trial (D.I.386) filed by Commissariat a LEnergie Atomique, SOITEC Silicon On Insulator Technologies SA, SOITEC U.S.A., Inc..Answering Brief/Response due date per Local Rules is Feb. 25, 2011. (Attachments: # 1 Certificate of Service)(Kraft, Denise) (Entered: Jan. 8, 2011).

Declaration re 391 Opening Brief in Support,, Declaration of Marcus T. Hall in Support of Plaintiffs' Opening Brief in Support of Motion to Strike Reply Brief In Support of MEMC's Renewed Motion For Judgment as a Matter of Law or, In The Alternative, a New Trial (D.I. 386) by Commissariat a LEnergie Atomique, SOITEC Silicon On Insulator Technologies SA, SOITEC U.S.A., Inc.. (Attachments: # 1 Exhibit A, # 2 Certificate of Service)(Kraft, Denise) (Entered: Feb. 8, 2011).

Redacted Version of 389 Reply Brief, Redacted Version of Reply Brief in Support of Plaintiffs' Motion For Injunctive Relief And To Lift Stay on Damages Discovery by Commissariat a LEnergie Atomique, SOITEC Silicon On Insulator Technologies SA, SOITEC U.S.A., Inc.. (Kraft, Denise) (Entered: Feb. 9, 2011).

Answering Brief in Opposition re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By Plaintifs' To Strike Reply Brief In Support of MEMC's Renewed Motion For Judgment as a Matter of Law or, In The Alternative, a New Trial (D.I. 386) filed by MEMC Electronic Materials Inc..Reply Brief due date per Local Rules is Feb. 28, 2011. (Attachments: # 1 Exhibit 1-3, # 2 Certificate of Service)(Rogowski, Patricia) (Entered: Feb. 18, 2011).

Reply Brief re 390 Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) Motion to Strike 386 Reply Brief, Motion By Plaintiffs' To Strike Reply Brief In Support of MEMC's Renewed Motion For Judgment as a Matter of Law or, In The Alternative, a New Trial (D.I. 386) filed by Commissariat a LEnergie Atomique, SOITEC Silicon On Insulator Technologies SA, SOITEC U.S.A., Inc.. (Attachments: # 1 Certificate of Service)(Kraft, Denise) (Entered: Feb. 28, 2011).

* cited by examiner

INTEGRATED CIRCUIT ON HIGH PERFORMANCE CHIP

RELATED APPLICATIONS

This application claims priority from French Patent Application No. 0307617 filed Jun. 24, 2003, which is incorporated by reference herein.

BACKGROUND

The present invention relates to the field of integrated circuits, and in particular to that of passive components integrated on die.

In the field of integrated circuits, there is an increasing requirement: to reduce the size taken up by the components, to reduce the fabrication costs, and to introduce new functions.

To achieve these objectives, it is necessary to integrate collectively onto the same analog or digital integrated circuit die an increasing number of components that were previously fabricated separately. There are essentially three categories of such components: circuits called "active" (transistors), components called "passive" (resistors, capacitors, inductors), and, finally, micro-electro-mechanical systems (MEMS) (acoustic filters, radio-frequency switches, variable capacitors).

Passive components and/or MEMS can be integrated independently of transistors, but their monolithic integration with transistors is the most beneficial in terms of compactness and cost. However, this monolithic integration causes a certain number of technological difficulties.

First, the nature of the layers and the treatments necessitated by the fabrication of the passive components are not always readily compatible with fabrication on the active circuits. For example, there exist situations in which the production of a second material after that of a first material in a stack on a silicon wafer necessitates the use of a temperature higher than that above which said first material is degraded unacceptably. This is the case in particular for integrating decoupling capacitors into integrated circuits. These capacitors must store a high electrical charge—the electrical charge is proportional to the capacitance and to the supply voltage, so increasing the capacitance improves the required performance (it will be remembered that the capacitance is proportional to the dielectric constant and to the electrode area and inversely proportional to the thickness of the dielectric of the capacitor).

Capacitors are conventionally produced on the same wafer as transistors. To reduce production costs, it is naturally desirable to use small capacitors. Obtaining the required capacitances using dielectric materials with a dielectric constant that is very high compared to the usual materials ($SiO_2$, $Si_3N_4$, $Ta_2O_5$, $ZrO_2$ or $Al_2O_3$) may then be envisaged.

There exist ferroelectric materials, belonging to the class of perovskites, which have very high dielectric constants (relative constant of several hundred units). Perovskites constitute almost all of the materials investigated for high-capacitance capacitor applications in the required range of dielectric constants (see for example the paper by T. Ayguavives et al. entitled "Physical Properties of (Ba,Sr)$TiO_3$ Thin Films used for Integrated Capacitors in Microwave Applications", IEEE 2001). The perovskite crystalline phase is usually obtained at temperatures from 600° C. to 700° C. However, these temperatures are incompatible with the aluminum- or copper-based interconnection metal of the transistors. Although certain prior art low-temperature processes use a perovskite (see for example the paper by D. Liu et al. entitled "Integrated Thin Film Capacitor Arrays", International Conference on High Density Packaging and MCMs, 1999), they in fact relate to a phase in which the perovskite is not pure or is of mediocre structural or microstructural quality, which means that the dielectric constant is very much lower than that of the same material when annealed at a higher temperature.

The standard methods mentioned hereinabove therefore do not really exploit the advantages of perovskites, because the maximum authorized temperature decreases progressively as and when the process steps are carried out, and the main difficulty results from the fact that the placement of a "hot" process material (the dielectric) occurs after that of a "cold" process material (the interconnection metal).

There is nevertheless known in the art a method for heating the dielectric to a temperature higher than the interconnection metals can withstand. It consists in isolating the dielectric from the interconnection metal by means of a thermal protection layer and then annealing the dielectric using a pulsed laser with sufficiently brief pulses for the temperature of the metal to remain lower than the temperature of the dielectric and to remain acceptable, provided that thermal diffusion is relatively low (see for example the paper by P. P. Donohue et al. entitled "Pulse-Extended Excimer Laser Annealing of Lead Zirconate Titanate Thin Films", proceedings of the 12th International Symposium on Integrated Ferroelectrics, Aachen, Germany, March 2000, published in Integrated Ferroelectrics, vol. 31, pages 285 to 296, 2000). This method is difficult to control, however, because the protective layer remains on the wafer. The protective layer therefore cannot be very thick (it is usually less than 2 µm thick), and it may affect the electrical performance of the devices. The temperature difference between the interconnection metal and the dielectric is therefore limited; in other words, the temperature to which the dielectric may be subjected is limited. Moreover, the stack is subjected to a high thermal gradient during this operation, which can generate a surface temperature that is too high or cause non-homogeneous crystallization of the dielectric or deterioration of materials, such as microcracks, as a result of thermal expansion.

One prior art solution to this temperature problem consists in producing the passive devices incorporating the capacitors on a silicon wafer other than the substrate containing the active components and then connecting the two dies together by wires or by microballs (see for example the paper by R. Heistand et al. entitled "Advances in Passive Integration for C/RC Arrays & Networks with Novel Thin & Thick Film Materials", 36th Nordic IMAPS conference, Helsinki, 1999). These methods have certain drawbacks, however: wires cannot be used to make short connections between capacitor and transistors, and microball connections may be produced on top of a circuit only once; if the capacitors are made of this material, it is no longer possible to add other functions such as switches or surface wave filters, for example.

To avoid these problems, the production temperature is usually limited to about 450° C., which enables integration of the components in the usual metallizations, or above them, in integrated circuits based on aluminum or copper (see for example the paper by S. Jenei et al. entitled "High-Q Inductors and Capacitors on Si Substrate", IEEE 2001, or the paper by Bryan C. Hendrix et al. entitled "Low-Temperature Process for High-Density Thin-Film Integrated Capacitors", International Conference on High-Density Interconnect and Systems Packaging, 2000). Because of this temperature limit, these standard methods are greatly limited in terms of the type of material and the dielectric constants that can be achieved. The required capacitance values are therefore obtained by producing capacitors occupying a large area, which limits the integration possibilities and adds to the cost of the die because of the increased area that is occupied on the silicon wafer.

There is nevertheless known in the art a method for increasing the area of the electrodes without increasing the lateral dimensions of the die (see the paper by F. Roozeboom et al. entitled "High-Value MOS Capacitor Arrays in Ultradeep Trenches in Silicon", published in Microelectronic Engineering, vol. 53, pages 581 to 584, Elsevier Science 2000). This method consists in exploiting the depth of the substrate to integrate metal oxide semiconductor (MOS) decoupling capacitors by excavating an array of deep narrow trenches in the substrate: a dielectric layer and then an electrode layer are disposed around these trenches—the other electrode of the array of capacitors covers the surface of the substrate. However, apart from the difficulty of producing uniform dielectric layers in the trenches, the use of capacitor arrays in trenches makes planar integration of passive components with active components difficult.

More generally, a second difficulty arising from the monolithic integration of passive components or MEMS with transistors is that it is not possible to exploit the vertical dimension to improve the characteristics or the compactness of the passive components.

A third difficulty to which the monolithic integration of passive components or MEMS with transistors gives rise is that the type of substrate used for the active circuits disturbs the characteristics of the passive components.

For example, the substrates used for CMOS or BICMOS circuits have conductivities of the order of 10 $\Omega$.cm at most. The currents induced in these substrates by the inductors or conductive lines cause high losses and thereby reduce the quality factors of these structures (high inductance, high resonant frequency, low stray capacitance).

A first prior art solution consists in eliminating a portion of the substrate under the areas that are to receive the inductors and conductive lines (see for example U.S. Pat. No. 5,539,241). A second prior art solution consists in making the substrate insulative under the areas that are to receive the inductors and conductive lines (see for example the paper by H.-S. Kim et al. entitled "A Porous-Si-based Novel Isolation Technology for Mixed-Signal Integrated Circuits", Symposium on VLSI Technology, 2000). A third solution is disclosed in U.S. Pat. No. 6,310,387—the underlying conductive layers are structured by producing a large number of small conductive areas in a checkerboard pattern that are separated from each other by an insulator and are not grounded. These areas serve as shielding because, in operation, low eddy currents are produced therein that prevent the magnetic field penetrating as far as the substrate; these areas are small enough to prevent these eddy currents inducing in the inductors a magnetic flux opposite to the required flux.

However, these various techniques are complex to use, may compromise the robustness of the integrated circuit and make the placement of active components difficult.

Finally, a difficulty raised specifically by the monolithic integration of MEMS with transistors is that it is necessary to add a cover to protect the mechanical components, without interfering with their operation. One prior art solution consists in bonding a silicon wafer of the same diameter as the wafer on which the circuits have been produced (see for example the paper by H. Tilmans et al. entitled "Zero-Level Packaging for MEMS or MST Devices: the IRS Method", mstnews 1/00). This technology is relatively costly because it is necessary to add to the cost of the supplementary substrate the cost of bonding, the cost of thinning and the cost of local etching to obtain access to the output electrical contacts on the surface of the circuit, and all of this is needed only to provide protection by means of a cover.

BRIEF SUMMARY

To solve most of the difficulties described hereinabove, a first aspect of the invention proposes a method of fabricating a die containing an integrated circuit comprising active components and passive components, said method being distinguished in that it comprises the following steps: a first substrate is produced containing at least one active component of said active components and a second substrate is produced containing "critical" components of said passive components, and the two substrates are bonded by layer transfer. The active components may be transistors, for example.

Passive components are said to be "critical" if their production directly on the substrate containing the active circuits and the metallic interconnections would give rise to a problem; for the reasons explained hereinabove, this may refer to MEMS, for example, and/or high-quality inductors and/or capacitors whose dielectric material is a perovskite.

Certain critical passive components, such as MEMS and/or capacitors, are preferably produced in said second substrate before said bonding of the two substrates.

According to the invention, a second material may in particular be produced on a silicon substrate at a temperature higher than the maximum temperature to which the silicon substrate may be heated because of a first material already present on the wafer. The invention enables this by producing the second material separately from the silicon wafer on which it is to end up and then integrating the second material onto that wafer by layer transfer techniques. In the particular case of decoupling capacitors, the invention enables the dielectric material of the capacitor to be heated to temperatures enabling crystallization in the perovskite phase without any restriction being imposed by the underlying interconnection metal and without having recourse to a thermal protection barrier between the two materials.

The method of the invention also produces conveniently a structure for protecting the MEMS. This is because the MEMS being produced on the surface of the second substrate that is to be transferred onto the first substrate is this first substrate itself (in which an appropriate cavity has been formed beforehand) that serves as a protective structure for the MEMS after bonding the two substrates. This has the advantage that it economizes on the production of a cover as in the prior art.

According to particular features of the invention, dielectric insulation trenches intended to reduce electromagnetic interference between the various components of the future die are further produced during the production of the second substrate.

According to other particular features, non-critical passive components, such as capacitor arrays in trenches are further produced during the production of the second substrate.

Certain other critical passive components are preferably produced in the vicinity of the face of the second substrate opposite the bonding face after said bonding of the two substrates. In the case of inductors, this has the advantage of considerably reducing the effects of the induced currents (energy losses, interference suffered by the active components, etc.), even if the second substrate is conductive, since this places the inductors far from the first substrate.

To reduce further the losses caused by induced currents and to improve the quality factors of the inductors, according to particular features, the inductors will be produced on top of inductive insulation trenches previously formed in the second substrate. A second aspect of the invention also relates to different dies containing integrated circuits.

Thus, first, the invention relates to a die fabricated by any of the methods briefly described above. Second, the invention relates to a die containing an integrated circuit comprising active components and passive components and consisting of a single stack of layers, said die being distinguished in that it includes an interface between two of said layers such that the portion of the die situated on one side of said interface contains at least one active component of said active components and the other portion of the die contains "critical" components of said passive components. According to particular features, said critical passive components comprise capacitors whose dielectric material is a perovskite and/or MEMS enclosed in cavities situated inside said die.

According to particular features, the die further comprises dielectric insulation trenches. According to other particular features, said integrated circuit further comprises non-critical passive components such as capacitor arrays in trenches.

According to other particular features, said active components are disposed in the vicinity of a first face of the die and said integrated circuit further comprises inductors situated in the vicinity of the face of the die opposite said first face. According to even more particular features, said inductors are situated above inductive insulation trenches.

According to other particular features, said active components are disposed in the vicinity of a first face of the die which further comprises interconnection lines that emerge in the vicinity of the face of the die opposite said first face. The advantages of these dies are essentially the same as those of the corresponding fabrication processes.

Other aspects and advantages of the invention will become apparent on reading the following detailed description of particular embodiments given below by way of non-limiting example.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
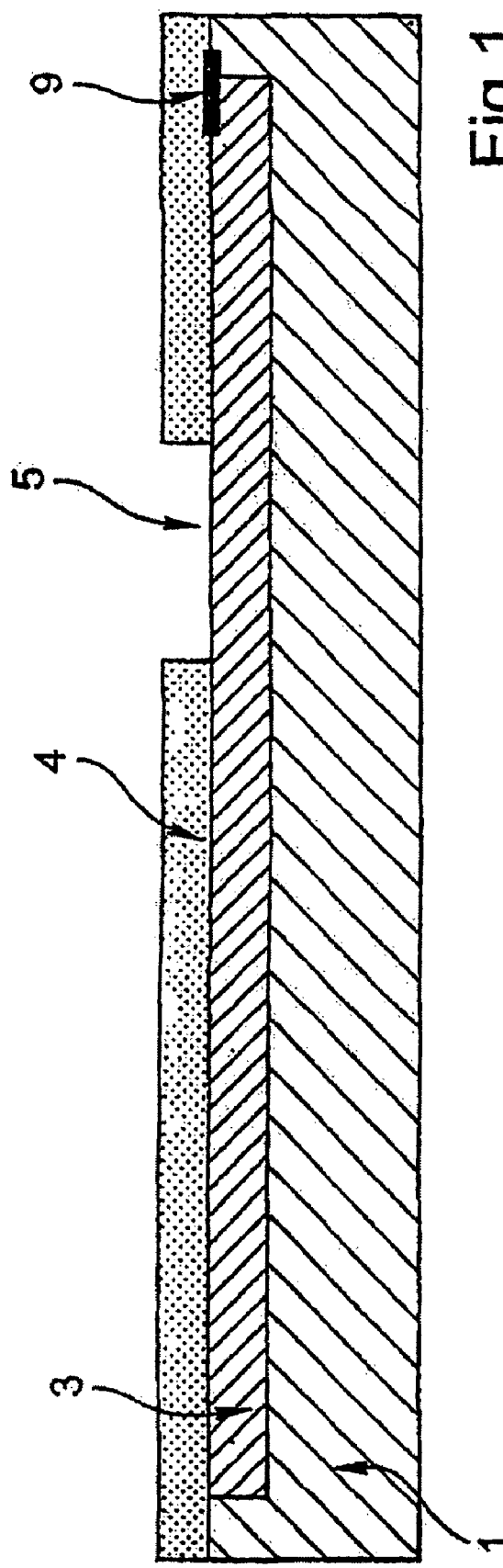
FIG. 1 shows a first substrate treated by one embodiment of the invention.

FIG. 1 shows a "first" substrate 1 consisting of a wafer of silicon or any other type III-V semiconductor material. The method of the invention begins with the preparation of two substrates 1 and 2 in either order or simultaneously. This first substrate 1 contains active components 3 that have been integrated by any technique known in the art (for example the CMOS or BICMOS technique) and metal interconnections (not shown).

In this embodiment, a thick layer 4 of insulation, for example $SiO_2$, is deposited and, where appropriate, etched locally (forming cavities 5) in vertical alignment with any Microelectromechanical Systems (MEMS) components on the second substrate. Finally, metallization areas 9 are produced that are subsequently connected to other portions of the die (see below).

Figure 2:
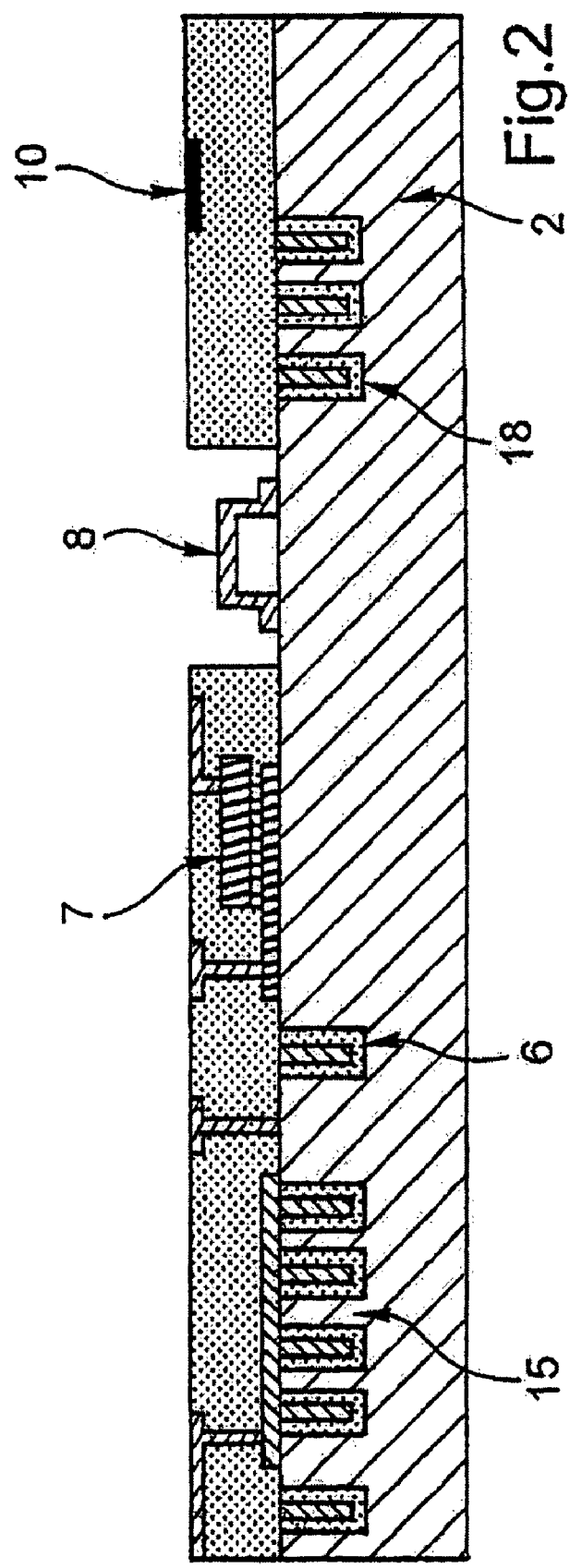
FIG. 2 shows a second substrate treated by that embodiment of the invention.

FIG. 2 represents a wafer forming a "second" substrate 2. In this embodiment, the second substrate 2 has been formed with: dielectric insulating trenches 6, capacitors 7 with a very high dielectric constant, MEMS 8, capacitor arrays 15 in trenches, and inductive insulation trenches 18.

The fabrication of capacitors 7 whose dielectric material is a perovskite will be described in detail. Two embodiments will be described by way of example. In a first embodiment of capacitors 7 whose dielectric material is a perovskite, a second substrate 2 is made of an insulative material, high-resistivity silicon or a semi-insulator such as glass. The following steps are then carried out: a) a layer of silicon oxide $SiO_2$ is deposited; b) a first electrode is deposited. The first electrode may consist of a plurality of layers of metallic materials, for example, a layer of Ti, $RuO_2$ or $IrO_2$, covered with a layer of platinum; c) using any prior art method (for example the Sol Gel, cathode sputtering or MOCVD method), the dielectric material is deposited, consisting of a thin layer of a perovskite such as $SrTiO_3$, $Pb(Zr_xTi_{1-x})O_3$ (known as "PZT") or $(Ba_xSr_{1-x})TiO_3$ (known as "BST"); d) the dielectric material is annealed at a high temperature (for example 700° C.) to obtain the perovskite phase; e) a second electrode is deposited, which may consist of a plurality of layers of metallic materials, for example a layer of platinum covered with a layer of Ti; and f) a layer of insulation, for example $SiO_2$, is preferably deposited to encourage subsequent bonding (see below).

Another method of fabricating capacitors 7, whose dielectric material is a perovskite, uses as the second substrate 2 a thick layer of perovskite produced beforehand. In this case, the above steps a) to d) are omitted.

The method of the invention therefore produces, at the required high temperature, capacitors having a dielectric of very high dielectric constant without risk of damaging the active components or the metallic interconnections of the future integrated circuit.

The MEMS components 8 may operate electromechanically or electroacoustically, such as electromechanical switches or acoustic resonators. The MEMS components 8 are produced in a manner that is known in the art by a succession of deposition and etching operations.

The fabrication of capacitor arrays in trenches 15 is described in detail next. The capacitors have electrodes of large area (and therefore also of high capacitance), which are implanted as described in the paper by F. Roozeboom cited above. To be more precise: a) trenches are etched in accordance with predefined patterns and to a depth slightly greater than the future thickness of the substrate after thinning (see below); b) a high-quality dielectric is grown on the faces of each trench. This dielectric must be as thin as possible for the capacitance values of the capacitors 15 to be as high as possible. For example, if the voltage to be applied to the terminals of the capacitors is a few volts, a thickness of dielectric from 10 nm to 50 nm is preferably grown. If the substrate 2 is of silicon, silicon oxide obtained by a thermal effect is advantageously used for this purpose, possibly in combination with nitriding or deposition of silicon nitride. Dielectrics of higher permittivity may also be used, for example $Al_2O_3$, $HgO_2$ or $Ta_2O_5$ deposited in a manner known in the art; c) the trenches are filled with a highly conductive material to produce one of the plates of the capacitor. Undoped polycrystalline silicon or polycrystalline silicon that is doped in situ may be used for this purpose, for example; and d) localized etching of said highly conductive material is carried out by masking to delimit areas on the surface of the substrate 2 and isolate the plates of the capacitor from the remainder of the semiconductor circuit.

A high-conductivity material (such as silicon) is preferably selected for the substrate 2 because the substrate will constitute one of the plates of the capacitors in trenches. The flanks of the trenches on the substrate side must be strongly doped to render the substrate sufficiently conductive. Finally, an ohmic contact will be produced on the substrate in order to be able to connect one electrode of the capacitors to an electrical circuit.

Alternatively, in the case of integrated circuits that do not include any capacitor arrays in trenches, it is instead preferable to select a low-conductivity material (such as glass) for the second substrate 2 to limit the losses caused by induced currents generated by the inductors (see below).

By making it possible to excavate deep trenches in the second substrate 2, the invention grows electrodes of large area for these capacitors and thereby, for a given substrate lateral area, considerably increases the capacitance value compared to a standard monolithic integration method.

The inductive insulation trenches 18 are produced in accordance with the teaching of U.S. Pat. No. 6,310,387 summarized above. As already explained, these trenches 18 contribute to the production of inductors of high quality.

Finally, metallization produces contacts on the plates of the capacitors 7 of very high capacitance value, and on the MEMS 8 and connects them to each other. Metallization areas 10 are also produced that are subsequently connected to other portions of the die by vias formed through the second substrate 2 (see below). Mechanical-chemical polishing is preferably applied to the upper layer of the resulting wafer to impart to it a roughness encouraging layer transfer by molecular adhesion.

Figure 3:
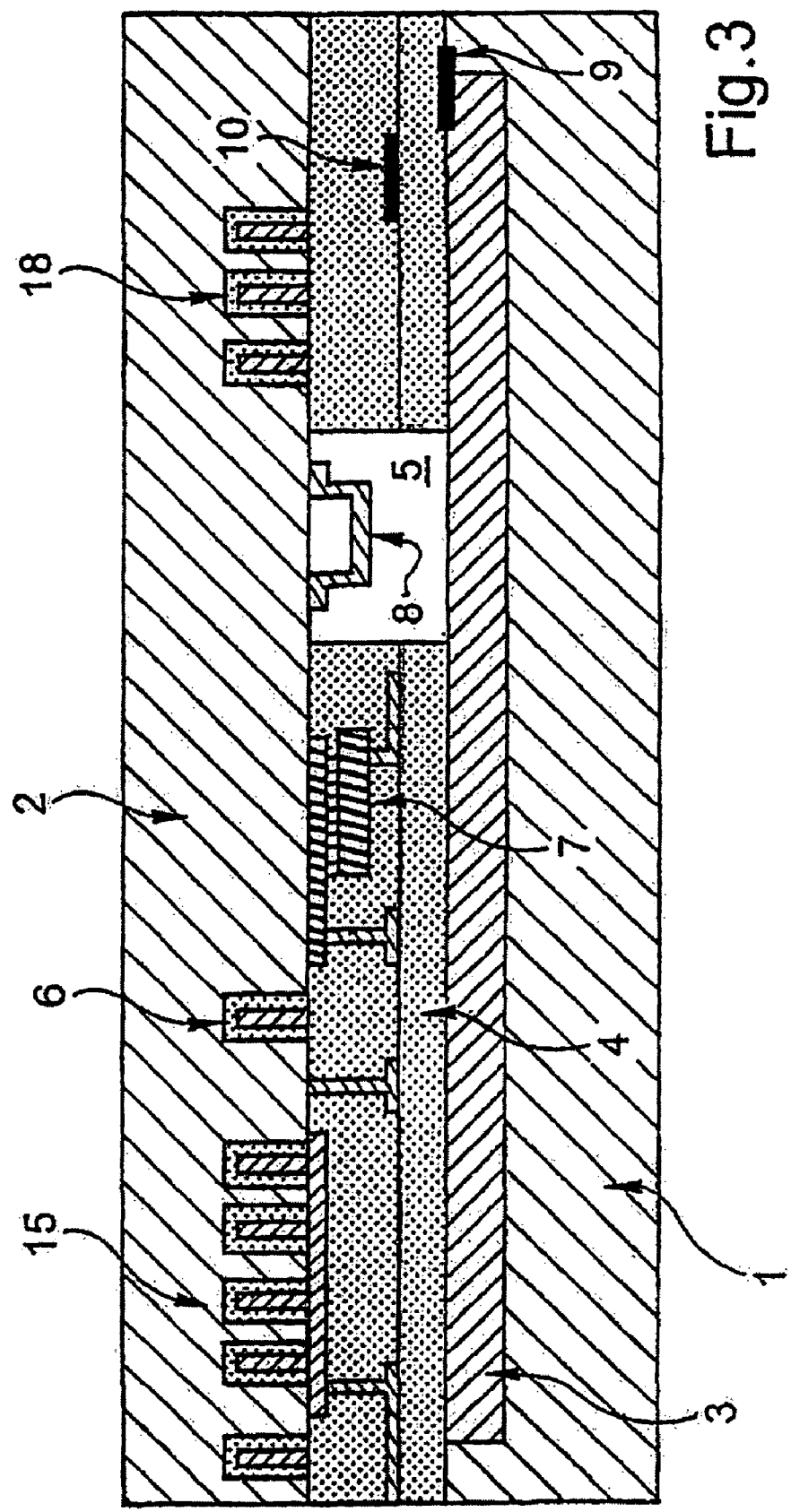
FIG. 3 shows the assembly obtained after transfer in accordance with the invention of said second substrate 2 onto said first substrate 1.

FIG. 3 shows the combination obtained after bonding the second substrate 2 onto the first substrate 1 by the method of the invention. The bond between the first substrate 1 and the second substrate 2 is preferably obtained by molecular adhesion or polymer gluing. It is preferable to avoid using a glue layer in order not to increase the total number of layers. However, this bond could also be produced by eutectic or anodic bonding, for example. It may be inconvenient to use soldering and brazing here, however, because of the attendant problems, well known to the person skilled in the art, of wettability, degassing and thermal insulation.

Thus, in the die produced by the method of the invention, the interface at which the two substrates have been bonded delimits two portions of the die. One portion contains at least one active component of the integrated circuit and the other portion contains the critical components of the integrated circuit.

It will be noted in particular that, in this embodiment, the alignment between the MEMS 8 and the cavities 5 is respected. Thus, the fabrication method of the invention protects electromechanical components such as these MEMS 8.

At this stage, to complete the fabrication of the die of the invention, it is necessary to construct the array of interconnections for connecting the electrodes of the capacitors and the underlying array of interconnections of the second substrate 2. It will be noted that here, in the context of the invention, access to buried layers is facilitated, in contrast to prior art monolithic fabrication methods, in which each successive layer may be deposited and immediately etched.

Figure 4:
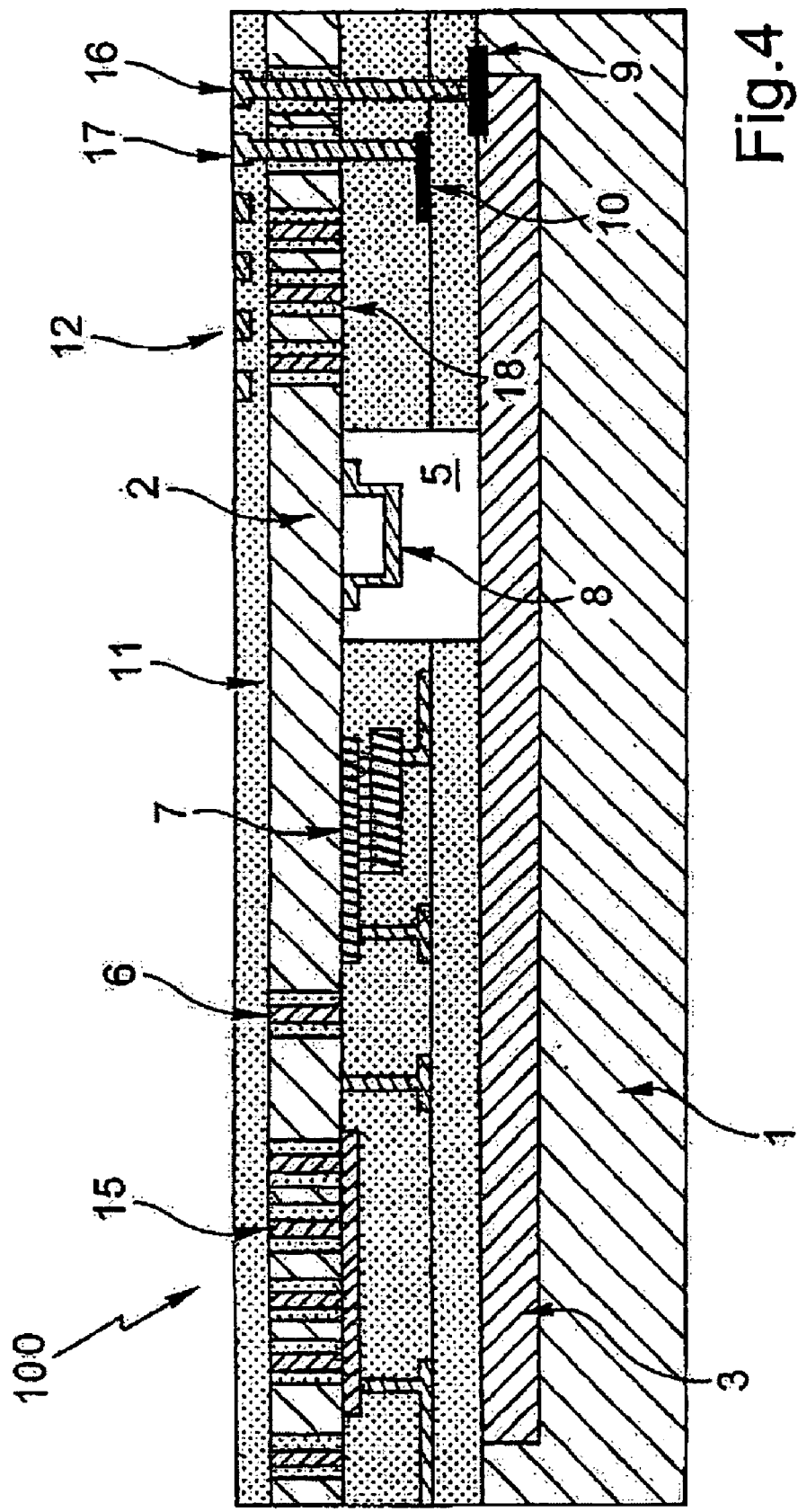
FIG. 4 shows the die obtained by this embodiment of the invention.
Figure 5:
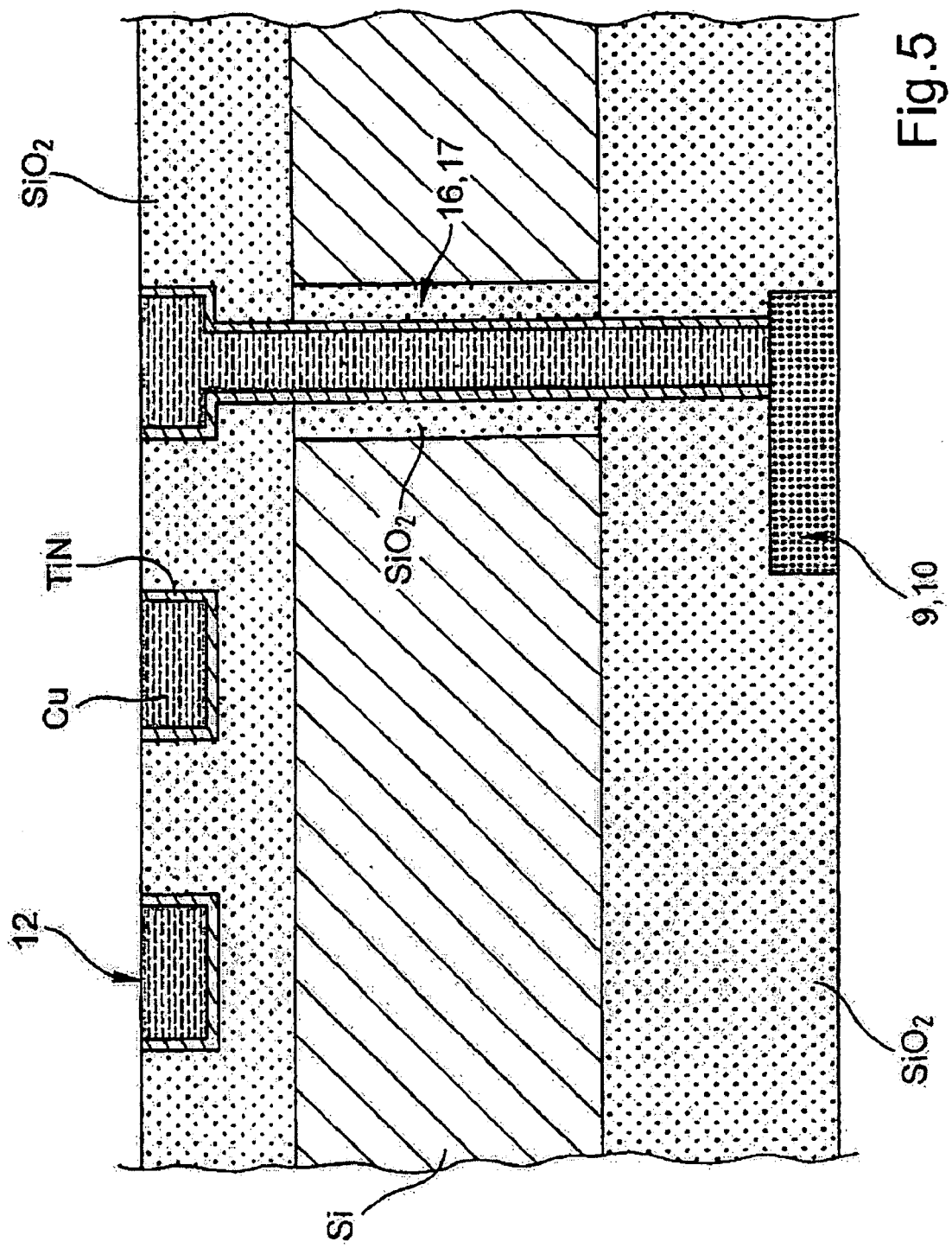
FIG. 5 is a view to a larger scale of a portion of FIG. 4.

These final steps yield the die 100 shown in FIG. 4: a) The second substrate 2 is thinned and polished, for example by mechanical-chemical polishing. As explained in patent EP0807970, it is also possible to effect ionic implantation in a plane of the substrate 2 to create microcavities that weaken the substrate and allow subsequent fracture in this plane. Thinning is continued until it penetrates into the trench structures 6, 15 and 18; a first substrate is produced containing at least one active component of said active components and a second substrate is produced containing "critical" components of said passive components, and the two substrates are bonded by layer transfer; b) the second substrate 2, and then the dielectric layers in vertical alignment therewith are etched locally to uncover the future contacts on the metallization areas 9 and on the metallization areas 10; c) an insulator 11, for example $SiO_2$, is deposited at low temperature to cover the free surface of the second substrate 2; d) vias 16 (respectively 17) are produced to connect the metallization areas 9 (respectively 10) to the free surface of the insulator 11. In this embodiment the technique disclosed in the paper by M. Tomisaka et al. entitled "Electroplating Cu Fillings for Through-Vias for Three-Dimensional Chip Stacking" (Electronic Components and Technology Conference, 2002) is used. FIG. 5 shows this interconnection between the components of the first substrate 1 and the components of the second substrate 2 by means of vias. The insulator 11 is etched first: to produce recessed patterns and holes known as "vias" in the insulator at predetermined locations intended to delimit future conductive lines, and to eliminate the insulator at the bottom of the vias. This etching is followed by conductive metallization of the surface and the inside of the holes formed in the insulator. For this purpose, thin layers of TaN or TiN are deposited, and this continuous base layer is used for electrolytic deposition of thick copper; and e) this copper and said continuous base layer are planarized using techniques known in the art (for example mechanical-chemical polishing) until the copper and the continuous base layer are completely eliminated from the higher areas of the insulator, so as to leave metal only in the recessed patterns produced in the step d) in the trenches of the insulator and in the vertical holes. In this way, vias (16, 17) and inductors 12 on the surface with a so-called "Damascene" structure are obtained (see FIG. 5). The depth of the recesses and the thickness of the metal are selected to minimize the resistance of this layer.

In a different embodiment, the metallization may be effected, in a manner known in the art, by a tungsten via associated with aluminum lines or areas.

The invention greatly reduces induced current losses, because producing these inductors 12 on the face of the second substrate 2 opposite the bonding face moves these inductors 12 away from the first substrate 1 (which may be a good conductor), and away from the trenches 18 situated under the inductors 12 to eliminate induced currents.

The present invention is not limited to the embodiments described hereinabove. The person skilled in the art will be able to develop diverse variants of the invention without departing from the scope of the appended claims. For example, there are described above embodiments in which the etching of the various layers is effected after transferring the second substrate onto the first. However, it is entirely possible to effect certain etching steps on the first substrate 1 and/or on the second substrate 2 before the transfer step. Also, other elements could naturally be added to the elements constituting the embodiments described above, such as barrier layers or non-stick layers.

Any embodiment of the fabrication method of the invention comprises, as explained above and as shown in the figures, the bonding of the substrates (1) and (2) by layer transfer, i.e., by adhesion of a face of the first substrate (1) to a face of the second substrate (2) over the major portion of their area (known as "full wafer" adhesion).

It will be noted that the die obtained in this way is particularly robust, as it consists of a single stack of layers (compared to prior art devices consisting of portions joined together by soldering or brazing joints or beads). This robustness in particular enables the safe production of cavities (hollow patterns, vias, etc.) in the die during the final fabrication stages, i.e., after bonding the two substrates. As explained above, inductors or interconnections (for example) may therefore be included in the integrated circuit in a manner that is particularly convenient. It will also be noted that, for the same reasons, the die obtained in this way is particularly compact compared to said prior art devices.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A method of fabricating a die containing an integrated circuit comprising active components and passive components, at least a part of the passive components comprising critical passive components, the method comprising:
   producing a first substrate including at least one active component including heating the first substrate at a temperature lower than a first temperature above which the first substrate is unacceptably degraded;
   producing a second substrate including the critical passive components including heating the second substrate at a temperature higher than the first temperature;
   bonding the first and second substrates, wherein the bonding comprises performing a layer transfer; and
   after bonding of the first and second substrates, producing at least one interconnection line between the components of the first and second substrates, the interconnection line passing through the second substrate.

2. A method according to claim 1, wherein the at least one active component comprises transistors.

3. A method according to claim 1, wherein the critical passive components comprise at least one capacitor and at least one microelectromechanical system (MEMS).

4. A method according to claim 1 wherein the critical passive components comprise at least one capacitor or at least one microelectromechanical system (MEMS).

5. A method according to claim 3, wherein a dielectric material of the at least one capacitor comprises a perovskite.

6. A method according to claim 1, wherein producing the second substrate comprises producing an electrically conductive material.

7. A method according to claim 1, wherein producing the second substrate comprises producing a dielectric material.

8. A method according to claim 7, wherein producing the second substrate comprises producing perovskite.

9. A method according to claim 1 further comprising producing dielectric insulation trenches in the second substrate during the production of the second substrate.

10. A method according to claim 1 further comprising producing at least one non-critical passive component during the production of the second substrate.

11. A method according to claim 10, wherein producing the non-critical passive component comprises producing a capacitor in trenches.

12. A method according to claim 9 further comprising producing at least one inductor in the vicinity of a face of the second substrate opposite a bonding face after the bonding of the two substrates.

13. A method according to claim 12 further comprising producing the at least one inductor on the dielectric insulation trenches.

14. A die fabricated by a method according to claim 1.

15. A die made of a single stack of layers, containing an integrated circuit comprising active components produced at a temperature lower than a first temperature above which the active components are unacceptably degraded and comprising passive components,
   wherein at least a part of the passive components comprising critical passive components produced at a temperature higher than the first temperature above which the active components are unacceptably degraded,
   wherein the die comprises an interface between two of the layers such that a first portion of the die situated on one side of the interface includes the active component and a second portion of the die situated on the other side of the interface includes the critical passive components produced at the temperature higher than the first temperature,
   wherein the die comprises at least one interconnection line between the components of the first and second portions, the interconnection line passing through the second portion of the die.

16. A die according to claim 15 wherein the critical passive components comprise at least one capacitor and at least one MEMS enclosed in a cavity situated inside the die.

17. A die according to claim 16, wherein the at least one capacitor comprises a dielectric material comprising perovskite.

18. A die according to claim 15, wherein the die further comprises dielectric insulation trenches.

19. A die according to claim 15, wherein the integrated circuit further comprises at least one non-critical passive component.

20. A die according to claim 19 wherein the non-critical passive component comprises a capacitor in trenches.

21. A die according to claim 15, wherein the active components are disposed in the vicinity of a first face of the die and wherein the integrated circuit further comprises at least one inductor situated in a vicinity of the face of the die opposite the first face.

22. A die according to claim 21, wherein the at least one inductor is situated on inductive insulation trenches.

23. A die according to any one of claim 15, wherein the active components are disposed in a vicinity of a first face of the die and the die further comprises at least one interconnection line that emerges in the vicinity of the face of the die opposite the first face.

24. A die according to any one of claim 19 wherein the active components are disposed in a vicinity of a first face of the die and the die further comprises at least one interconnection line that emerges in the vicinity of the face of the die opposite the first face.

25. A method according to claim 13, wherein the at least one inductor and at least one of the interconnection lines are produced during a same process step.

26. The method according to claim 1, wherein the first temperature is about 450° C.

27. The method according to claim 1, wherein producing the first substrate comprises producing a substrate including all of the active components of the integrated circuit, and wherein producing the second substrate comprises producing a substrate including only passive components.

28. The method according to claim 1, wherein producing the first substrate further comprises producing the at least one active component comprising an interconnect metal that unacceptably degraded at a temperature above the first temperature.

* * * * *